United States Patent
Matsuura et al.

(10) Patent No.: US 11,924,571 B2
(45) Date of Patent: Mar. 5, 2024

(54) SOLID-STATE IMAGING ELEMENT

(71) Applicant: Sony Semiconductor Solutions Corporation, Kanagawa (JP)

(72) Inventors: Kouji Matsuura, Kanagawa (JP); Yosuke Ueno, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 168 days.

(21) Appl. No.: 17/764,843

(22) PCT Filed: Jul. 31, 2020

(86) PCT No.: PCT/JP2020/029502
§ 371 (c)(1),
(2) Date: Mar. 29, 2022

(87) PCT Pub. No.: WO2021/084826
PCT Pub. Date: May 6, 2021

(65) Prior Publication Data
US 2022/0321825 A1    Oct. 6, 2022

(30) Foreign Application Priority Data

Oct. 30, 2019  (JP) ................. 2019-197755

(51) Int. Cl.
*H04N 25/772* (2023.01)
*H04N 25/75* (2023.01)
*H04N 25/778* (2023.01)

(52) U.S. Cl.
CPC ........... *H04N 25/772* (2023.01); *H04N 25/75* (2023.01); *H04N 25/778* (2023.01)

(58) Field of Classification Search
None
See application file for complete search history.

(56) References Cited

U.S. PATENT DOCUMENTS

| | | |
|---|---|---|
| 2017/0085817 A1 | 3/2017 | Yeh et al. |
| 2018/0103222 A1* | 4/2018 | Yan ...................... H04N 25/75 |

(Continued)

FOREIGN PATENT DOCUMENTS

| | | |
|---|---|---|
| JP | 2012019411 A | 1/2012 |
| JP | 2013026734 A | 2/2013 |

(Continued)

OTHER PUBLICATIONS

International Search Report (PCT/ISA/210), International Application No. PCT/JP2020/029502, dated Oct. 20, 2020.

*Primary Examiner* — Cynthia Segura
(74) *Attorney, Agent, or Firm* — Michael Best & Friedrich LLP

(57) ABSTRACT

Solid-state imaging elements that prevent deterioration of image quality, and reduce power consumption and AD-conversion time are disclosed. In one example, a solid-state imaging element includes a first comparator that uses a first voltage corresponding to an input voltage received from a first pixel, in reference to a first voltage difference between the input voltage and a first reference voltage, and that outputs a comparison result between the input voltage and the first reference voltage in reference to a second voltage difference, and a second comparator that outputs a comparison result of comparison between the input voltage and the second reference voltage in reference to a fourth voltage difference.

20 Claims, 30 Drawing Sheets

(56) References Cited

U.S. PATENT DOCUMENTS

| | | | | |
|---|---|---|---|---|
| 2019/0035834 A1* | 1/2019 | Kim | ........................ | H04N 25/75 |
| 2021/0185256 A1* | 6/2021 | Yamashita | ............ | H04N 25/772 |
| 2023/0345151 A1* | 10/2023 | Nakagawa | .......... | H03M 1/1295 |

FOREIGN PATENT DOCUMENTS

| | | | |
|---|---|---|---|
| JP | 2013179577 A | 9/2013 |
| JP | 2017152839 A | 8/2017 |
| JP | 2017200140 A | 11/2017 |

* cited by examiner

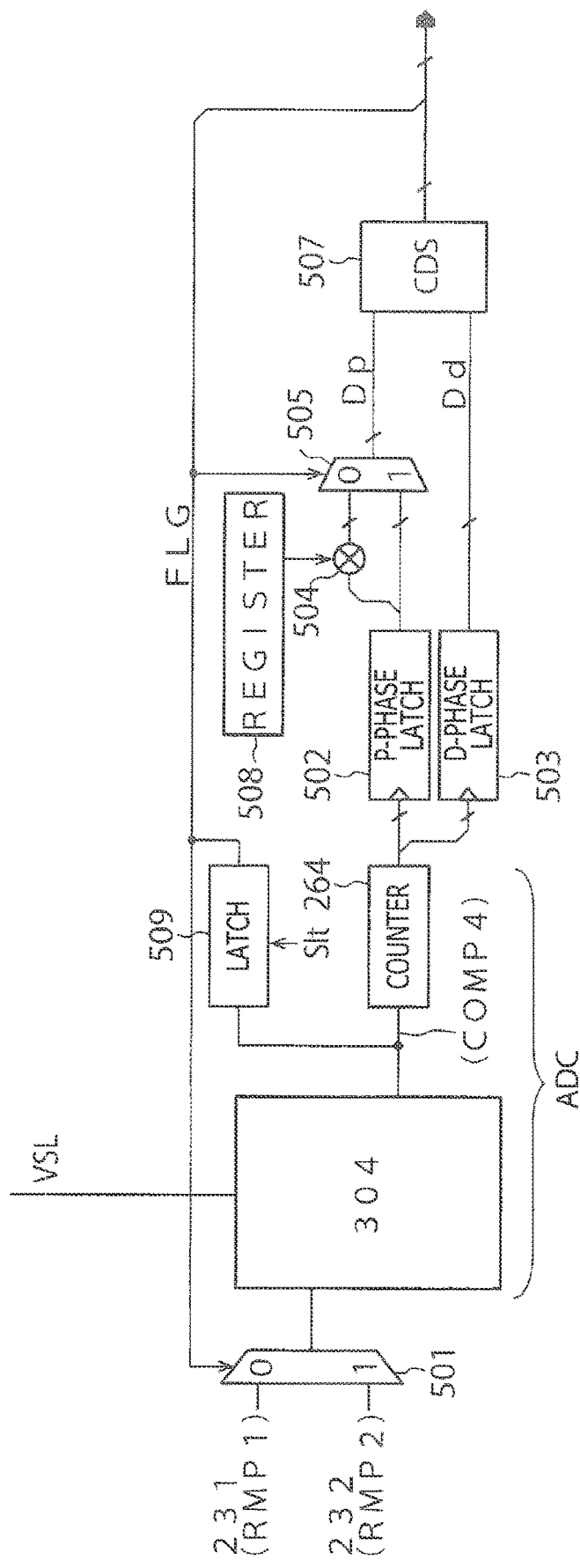
F I G . 2 3

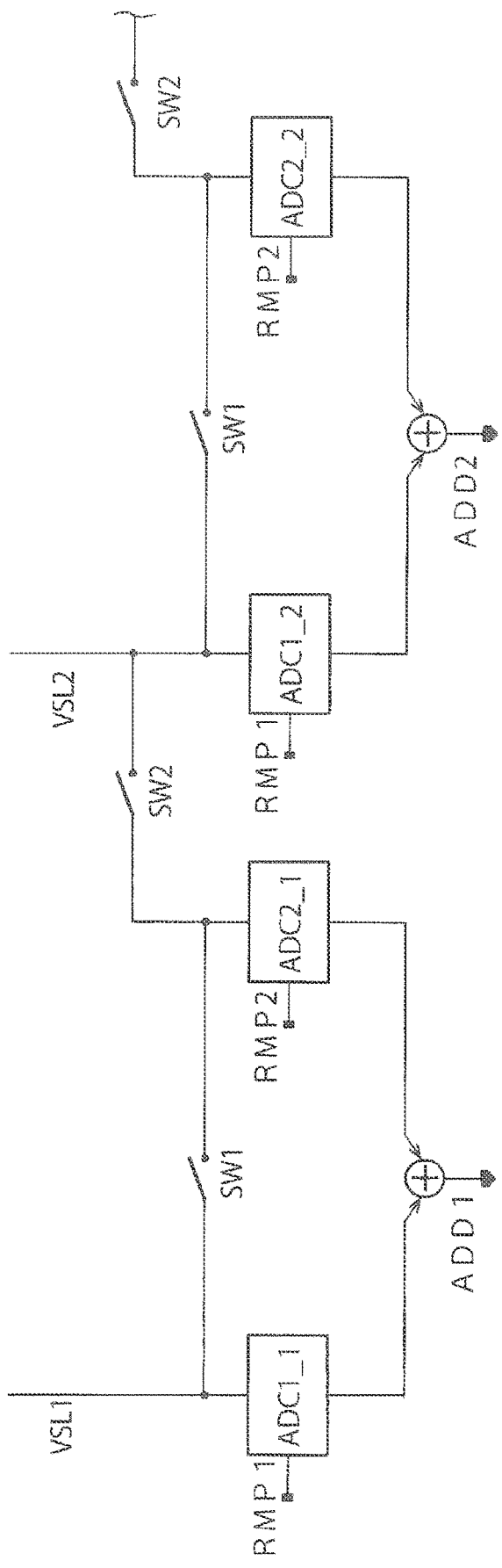

SOLID-STATE IMAGING ELEMENT

TECHNICAL FIELD

The present technology relates to a solid-state imaging element.

BACKGROUND ART

A single-slope type ADC (Analog to Digital Converter) has been used for AD (Analog to Digital) conversion of a solid-state imaging element. The single-slope type ADC includes a comparator and a counter. The comparator compares a pixel signal and a reference signal, and outputs a result of the comparison to the counter. The counter measures a period from a start of the comparison between the pixel signal and the reference signal to inversion of the output from the comparator. The solid-state imaging element detects a level of the pixel signal in reference to the period measured by the counter.

CITATION LIST

Patent Literature

[PTL 1]
Japanese Patent Laid-open No. 2013-026734
[PTL 2]
Japanese Patent Laid-open No. 2017-200140

SUMMARY

Technical Problems

Reducing power consumption of the above solid-state imaging element by use of a common power source shared by the comparator and a pixel circuit is under consideration. In this case, however, the timing of inversion of the comparison result may deviate from the ideal timing at which the reference signal and the pixel signal become substantially equal to each other. This error in inversion timing causes an error or non-linearity of a digital signal generated by AD-conversion of the pixel signal, and thereby causes a problem of deterioration of image quality of image data.

Moreover, in a case of AD-conversion of the pixel signal performed by the comparator using a single gain, a dark region of the image data has a rough gradation when the number of counts decreases in association with a reduction of an operation frequency of the counter for a reduction of power consumption. In this case, image quality deteriorates. On the other hand, when the number of counts increases in association with an increase of the operation frequency of the counter, image quality of the dark region of the image data improves. However, power consumption by the counter rises, and AD-conversion requires a long time. As described above, in the case of AD-conversion of the pixel signal with use of a single gain, there arises a problem of a trade-off relation exhibited between the image quality, the power consumption, and the AD-conversion time.

The present technology has been developed in consideration of the abovementioned circumstances. It is an object of the present technology to provide a solid-state imaging element capable of reducing power consumption and an AD-conversion time while reducing deterioration of image quality.

Solution to Problems

A solid-state imaging element according to one aspect of the present disclosure includes a first comparator that includes a first input transistor that outputs, from a drain of the first input transistor, a first voltage corresponding to an input voltage received from a first pixel, in reference to a first voltage difference between the input voltage input to a source of the first input transistor and a first reference voltage input to a gate of the first input transistor and a first output transistor that outputs, from a drain of the first output transistor, a comparison result of comparison between the input voltage and the first reference voltage in reference to a second voltage difference between the input voltage input to a source of the first output transistor and the first voltage input to a gate of the first output transistor, and a second comparator that includes a second input transistor that outputs, from a drain of the second input transistor, a second voltage corresponding to the input voltage in reference to a third voltage difference between the input voltage input to a source of the second input transistor and a second reference voltage input to a gate of the second input transistor and a second output transistor that outputs, from a drain of the second output transistor, a comparison result of comparison between the input voltage and the second reference voltage in reference to a fourth voltage difference between the input voltage input to a source of the second output transistor and the second voltage input to a gate of the second output transistor.

The first comparator may further include a first current source connected to the drain of the first input transistor, a first clamp transistor provided between the source and the drain of the first input transistor, a second current source connected to the drain of the first output transistor, and a second clamp transistor provided between the source and the drain of the first output transistor. The second comparator may further include a third current source connected to the drain of the second input transistor, a third clamp transistor provided between the source and the drain of the second input transistor, a fourth current source connected to the drain of the second output transistor, and a fourth clamp transistor provided between the source and the drain of the second output transistor. The gate and the drain of each of the first to fourth clamp transistors may be short-circuited to each other.

The first comparator may further include a first switch provided between the gate and the drain of the first input transistor and a second switch provided between the gate and the drain of the first output transistor. The second comparator may further include a third switch provided between the gate and the drain of the second input transistor and a fourth switch provided between the gate and the drain of the second output transistor.

The first and second reference voltages may change over time with slopes different from each other. The solid-state imaging element may further include a first counter that receives the comparison result from the first comparator, counts a period from a slope start of the first reference voltage to inversion of the comparison result received from the first comparator, and outputs a first digital signal in reference to a count value of the period and a second counter that receives the comparison result from the second comparator, counts a period from a slope start of the second reference voltage to the comparison result received from the second comparator, and outputs a second digital signal in reference to a count value of the period. The first and second counters may operate almost simultaneously.

The slope of the second reference voltage may be steeper than the slope of the first reference voltage. The first and second counters may measure the first and second periods, respectively, by using clock signals having substantially the same frequency.

The solid-state imaging element may further include a selection unit that selects either the first digital signal or the second digital signal to synthesize an image.

The solid-state imaging element may further include a pixel signal line that connects the first pixel and the first and second comparators. A current flowing in the pixel signal line may be the sum of currents flowing in the first to fourth current sources.

The first input transistor may output the first voltage from the drain of the first input transistor when the input voltage and the first reference voltage become substantially equal to each other. The first output transistor may output, as a comparison result of comparison between the input voltage and the first reference voltage, a signal indicating whether or not a difference between the input voltage and the first voltage exceeds a threshold voltage of the first output transistor. The second input transistor may output the second voltage from the drain of the second input transistor when the input voltage and the second reference voltage become substantially equal to each other. The second output transistor may output, as a comparison result of comparison between the input voltage and the second reference voltage, a signal indicating whether or not a difference between the input voltage and the second voltage exceeds a threshold voltage of the second output transistor.

The solid-state imaging element may further include a first reference voltage supply unit that supplies the first reference voltage, a first auto-zero capacitor provided between the gate of the first input transistor and the first reference voltage supply unit, a first buffer provided between the first reference voltage supply unit and the first capacitor, a second reference voltage supply unit that supplies the second reference voltage, a second auto-zero capacitor provided between the gate of the second input transistor and the second reference voltage supply unit, and a second buffer provided between the second reference voltage supply unit and the second capacitor.

Each of the first and second input transistors and the first and second output transistors may be a P-type transistor.

Each of the first to fourth clamp transistors may be a P-type transistor that has a gate and a drain short-circuited to each other. The solid-state imaging element may further include fifth to eighth clamp transistors that are respectively connected to the first to fourth clamp transistors in parallel and are each an N-type transistor.

The first to fourth current sources may respectively include first to fourth current source transistors respectively provided between predetermined reference terminals and the respective drains of the first and second input transistors and the first and second output transistors, first to fourth capacitors respectively connected to the gates of the first to fourth current source transistors and the reference terminals and first to fourth sample hold switches respectively connected to the gates of the first to fourth current source transistors.

The solid-state imaging element may further include a first logic gate connected to the drain of the first output transistor and a second logic gate connected to the drain of the second output transistor.

The solid-state imaging element may further include a pixel signal line that connects the first pixel and the first and second comparators, and a fifth current source connected to the pixel signal line.

The solid-state imaging element may further include a fifth capacitor provided between the drain of the first input transistor and the gate of the first output transistor, a fifth switch provided between the gate and the drain of the first output transistor, a sixth capacitor provided between the drain of the second input transistor and the gate of the second output transistor, and a sixth switch provided between the gate and the drain of the second output transistor.

The solid-state imaging element may include a first buffer transistor connected to a power source and the source of the first output transistor, a gate of the first buffer transistor being connected to the source of the first input transistor, and a second buffer transistor connected to the power source and the source of the second output transistor, a gate of the second buffer transistor being connected to the source of the second input transistor.

The solid-state imaging element may further include a common reference voltage supply unit that supplies a common reference voltage, a first auto-zero capacitor provided between the gate of the first input transistor and the common reference voltage supply unit, a voltage dividing capacitor connected to the gate of the first input transistor and a predetermined reference terminal and a second auto-zero capacitor provided between the gate of the second input transistor and the common reference voltage supply unit. The first auto-zero capacitor and the voltage dividing capacitor may divide the common reference voltage and transmit the divided common reference voltage to the gate of the first input transistor, as the first reference voltage. The second auto-zero capacitor may transmit the common reference voltage to the gate of the second input transistor, as the second reference voltage.

The selection unit may include a digital comparator that compares one or both of the first and second digital signals with a threshold, a register that stores the threshold, and a multiplexer that selects either the first digital signal or the second digital signal in reference to a comparison result received from the digital comparator, and outputs the selected digital signal as a pixel signal of the first pixel together with the comparison result.

The slope of the second reference voltage may be steeper than the slope of the first reference voltage. The multiplexer may select the first digital signal in a case where one or both of the first and second digital signals are lower than the threshold. The multiplexer may select the second digital signal in a case where one or both of the first and second digital signals are higher than the threshold. The solid-state imaging element may further include a calculation unit that converts the first digital signal in reference to a ratio of the slope of the first reference voltage to the slope of the second reference voltage.

The solid-state imaging element may include a third comparator that includes a third input transistor that outputs a fifth voltage corresponding to the input voltage from a drain of the third input transistor in reference to a fifth voltage difference between the input voltage input to a source of the third input transistor and a third reference voltage input to a gate of the third input transistor.

The third comparator may include a third output transistor that outputs a comparison result of comparison between the input voltage and the third reference voltage from a drain of the third output transistor in reference to a sixth voltage difference between the input voltage input to a source of the third output transistor and the fifth voltage input to a gate of the third output transistor.

BRIEF DESCRIPTION OF DRAWINGS

FIG. 23 is a circuit diagram depicting a configuration example of an ADC and peripheral circuits according to a twelfth embodiment of the present disclosure.

FIG. 26 is a circuit diagram depicting a configuration example of an ADC and peripheral circuits according to modification 2 of the present disclosure.

DESCRIPTION OF EMBODIMENTS

Figure 1:
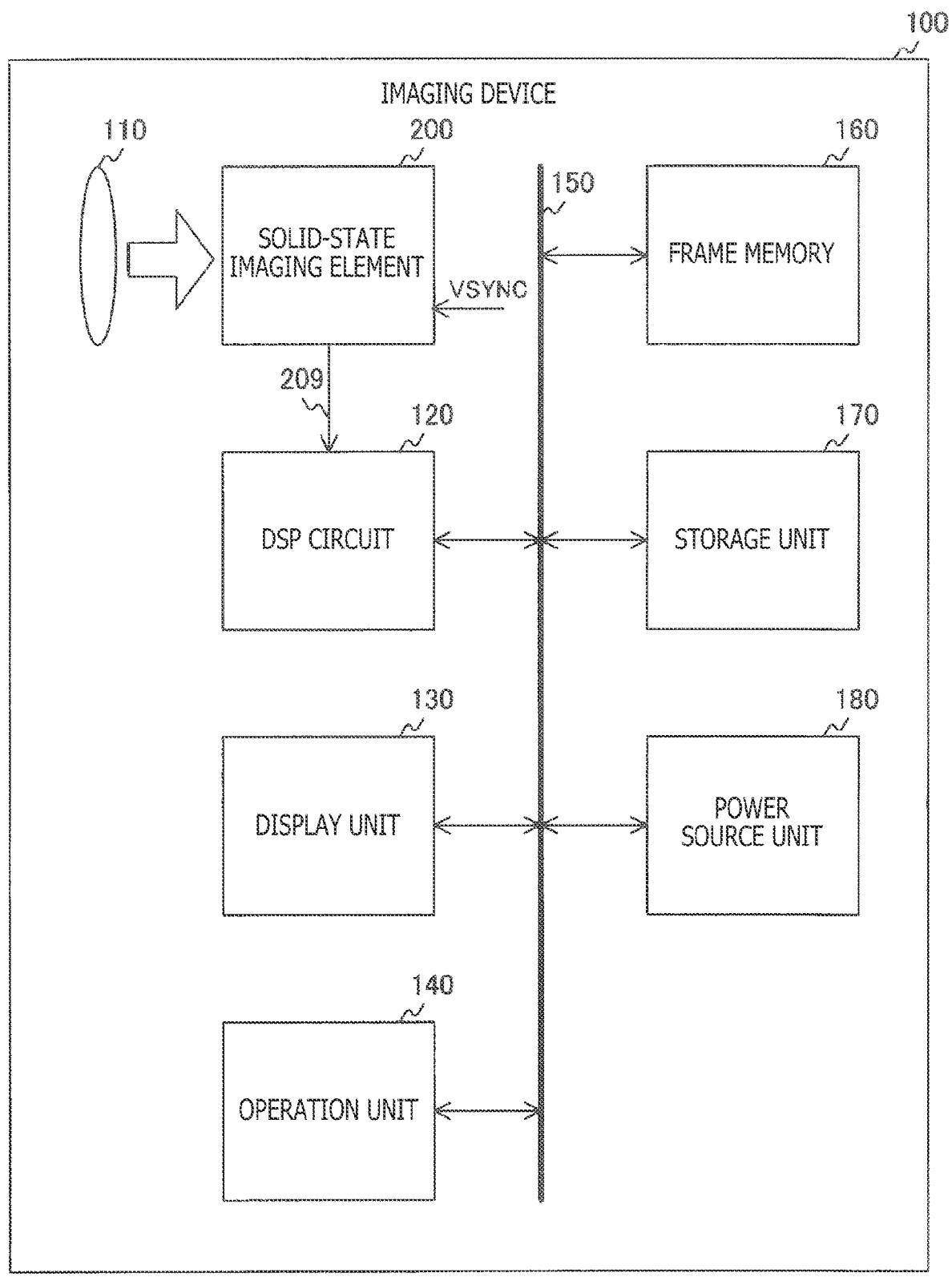
FIG. 1 is a block diagram depicting one configuration example of an imaging device according to a first embodiment of the present technology.

Specific embodiments to which the present technology is applied will hereinafter be described in detail with reference to the drawings. The drawings are only schematic or conceptual drawings. Ratios and the like of respective parts do not necessarily coincide with actual ones. In the description and the drawings, elements similar to the above-described elements depicted in the drawings previously referred to are given identical reference numbers, and detailed description of these elements is omitted where appropriate.

First Embodiment

[Configuration Example of Imaging Device]

FIG. 1 is a block diagram depicting one configuration example of an imaging device 100 according to a first embodiment of the present technology. The imaging device 100 is a device for imaging an object and generating image data of the object, and includes an optical unit 110, a solid-state imaging element 200, and a DSP (Digital Signal Processing) circuit 120. The imaging device 100 further includes a display unit 130, an operation unit 140, a bus 150, a frame memory 160, a storage unit 170, and a power source unit 180. The imaging device 100 is assumed to be a camera mounted on a smartphone, an in-vehicle camera, or the like.

The optical unit 110 collects light from the object, and guides the collected light to the solid-state imaging element 200. The solid-state imaging element 200 generates image data by photoelectric conversion. The solid-state imaging element 200 supplies the generated image data to the DSP circuit 120 via a signal line 209.

The DSP circuit 120 executes predetermined signal processing for the image data. The DSP circuit 120 outputs the processed image data to the frame memory 160 and others via the bus 150.

The display unit 130 displays image data. For example, the display unit 130 is assumed to be a liquid crystal panel or an organic EL (Electro Luminescence) panel. The operation unit 140 generates an operation signal according to an operation performed by a user.

The bus 150 is a common path provided for data exchange between the optical unit 110, the solid-state imaging element 200, the DSP circuit 120, the display unit 130, the operation unit 140, the frame memory 160, the storage unit 170, and the power source unit 180.

The frame memory 160 retains image data. The storage unit 170 stores various types of data such as image data. The power source unit 180 supplies power to the solid-state imaging element 200, the DSP circuit 120, the display unit 130, and others.

[Configuration Example of Solid-State Imaging Element]

Figure 2:
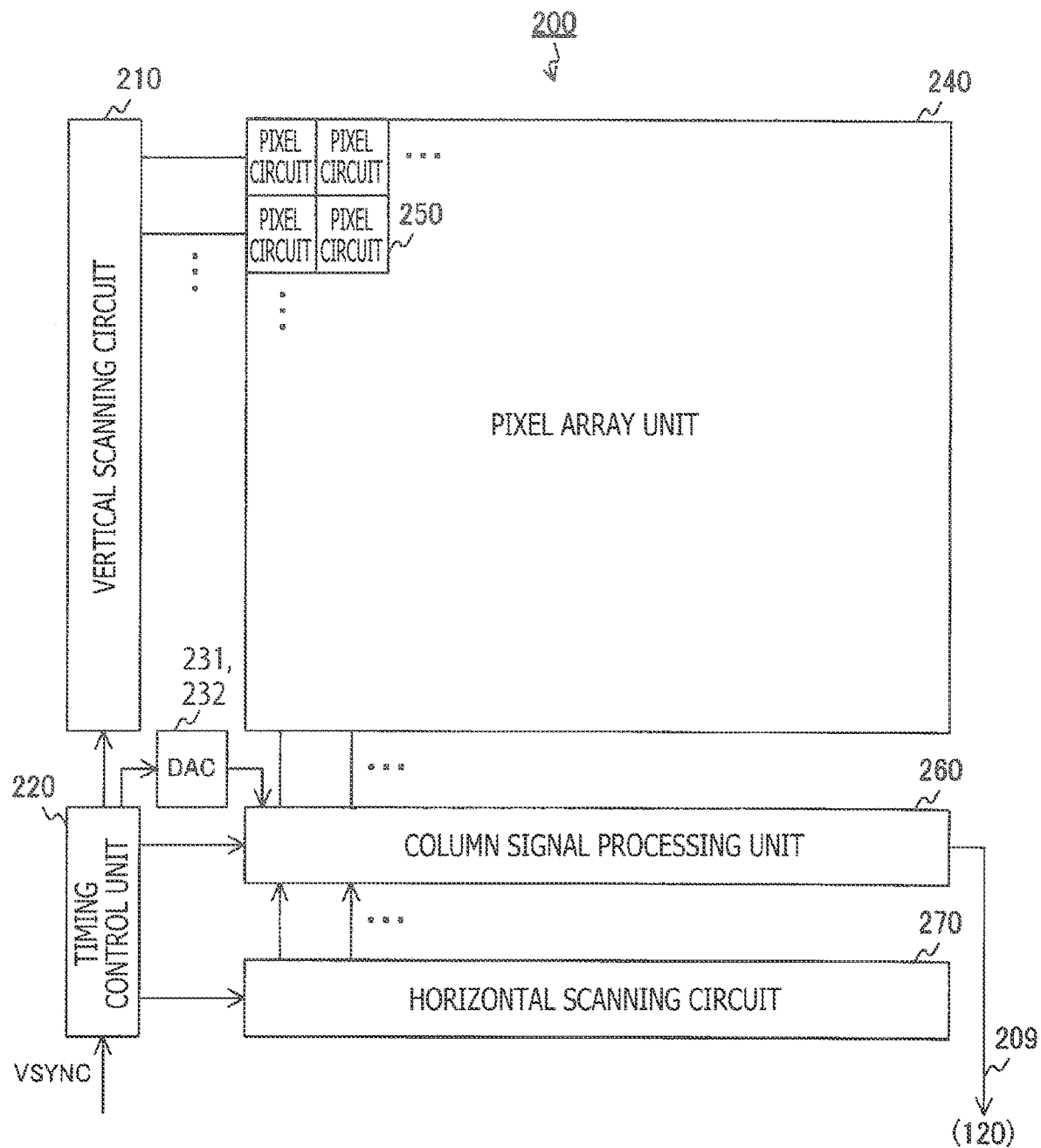
FIG. 2 is a block diagram depicting one configuration example of a solid-state imaging element according to the first embodiment of the present technology.

FIG. 2 is a block diagram depicting one configuration example of the solid-state imaging element 200 according to the first embodiment of the present technology. The solid-state imaging element 200 includes a vertical scanning circuit 210, a timing control unit 220, DACs (Digital to Analog Converters) 231 and 232, a pixel array unit 240, a column signal processing unit 260, and a horizontal scanning circuit 270.

A plurality of pixel circuits 250 are arranged in a two-dimensional grid pattern on the pixel array unit 240. In the following description, a set of the pixel circuits 250 arranged in a predetermined horizontal direction will be referred to as a "row," while a set of the pixel circuits 250 arranged in a direction perpendicular to the row will be referred to as a "column."

The vertical scanning circuit 210 sequentially drives rows to obtain output from the pixel circuits 250.

The timing control unit 220 controls operation timing of each of the vertical scanning circuit 210, the DACs 231 and 232, the column signal processing unit 260, and the horizontal scanning circuit 270 in synchronization with a vertical synchronized signal VSYNC. The vertical synchronized signal VSYNC is a cyclic signal indicating imaging timing and having a predetermined frequency (e.g., 60 Hz).

The DACs 231 and 232 respectively generate a first reference signal and a second reference signal by DA (Digital to Analog) conversion. For example, each of the first and second reference signals includes a ramp signal having a sawtooth shape. The DACs 231 and 232 respectively supply the first and second reference signals to the column signal processing unit 260. The first and second reference signals are signals having voltages changeable over time with slopes different from each other, and are used by the column signal processing unit 260 to detect pixel signals with different gains. Note that each of the DACs 231 and 232 is an example of a reference signal supply unit described in the claims.

Each of the pixel circuits 250 generates an analog pixel signal by photoelectric conversion, and supplies the analog pixel signal to the column signal processing unit 260.

The column signal processing unit 260 performs such signal processing as AD-conversion processing and CDS (Correlated Double Sampling) processing for the pixel signal for each column. The column signal processing unit 260 supplies image data including a processed digital signal to the DSP circuit 120 via the signal line 209.

The horizontal scanning circuit 270 causes the column signal processing unit 260 to sequentially output digital signals, by controlling the column signal processing unit 260.

Note that the solid-state imaging element 200 depicted in FIG. 2 may include either one semiconductor chip as a whole, or a plurality of semiconductor chips. In a case of the solid-state imaging element 200 including a plurality of semiconductor chips, semiconductor chips 511 and 512 may respectively be formed to separately provide the pixel array unit 240 and a peripheral circuit unit 15 other than the pixel array unit 240, and the semiconductor chip 511 forming the pixel array unit 240 and the semiconductor chip 512 forming the peripheral circuit unit 15 may be laminated.

Figure 3:
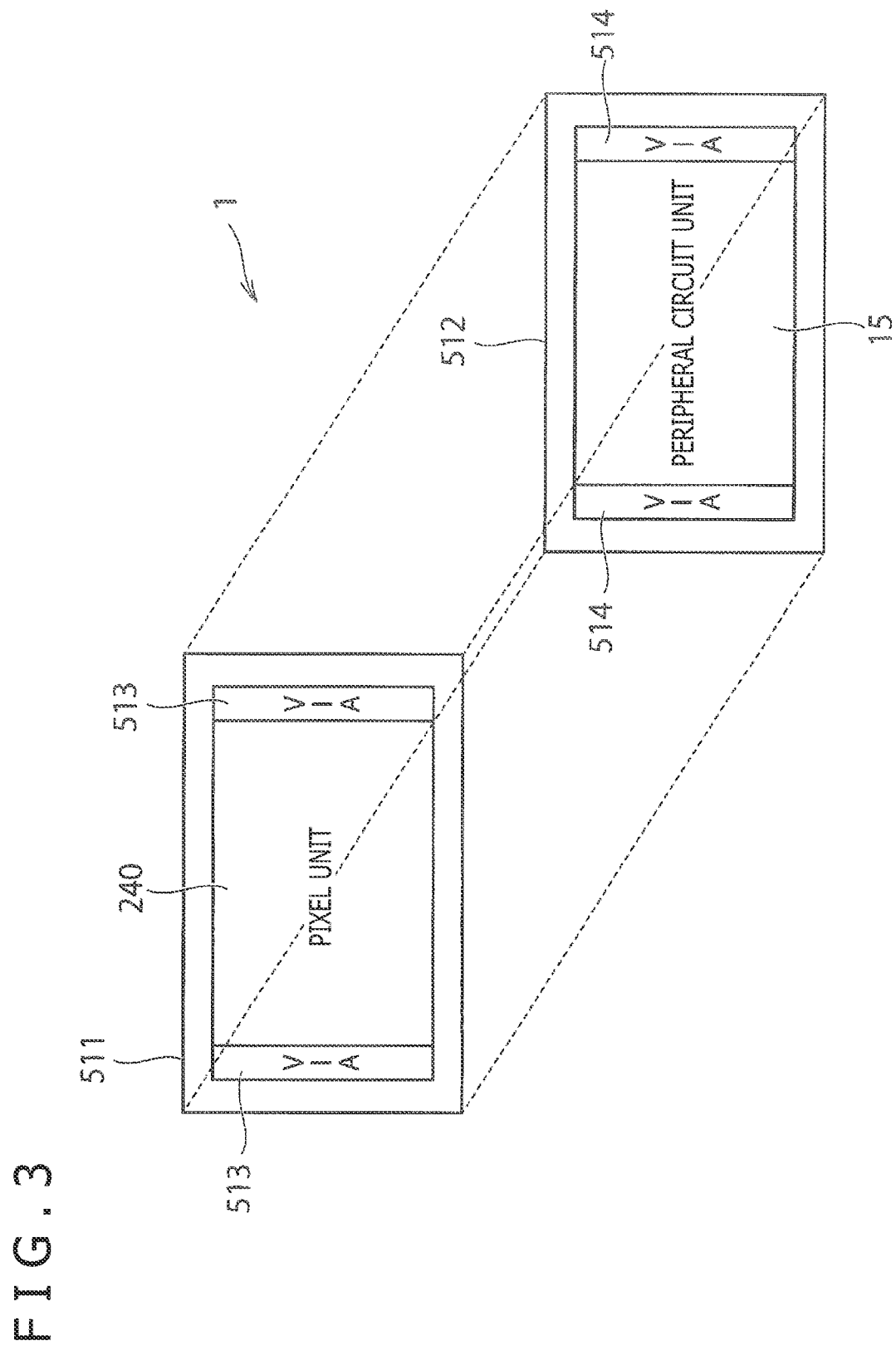
FIG. 3 is a conceptual diagram depicting an example of the solid-state imaging element formed by laminating a semiconductor chip of a pixel array unit and a semiconductor chip of a peripheral circuit unit.

For example, FIG. 3 is a conceptual diagram depicting an example of the solid-state imaging element 200 produced by laminating the semiconductor chip 511 forming the pixel array unit 240 and the semiconductor chip 512 forming the peripheral circuit unit 15. As depicted in FIG. 3, the solid-state imaging element 200 includes two semiconductor chips, i.e., the semiconductor chips 511 and 512, laminated on each other.

The number of the laminated semiconductor chips may be three or more. The semiconductor chip 511 includes the pixel array unit 240 formed on a semiconductor substrate. The semiconductor chip 512 includes the peripheral circuit unit 15 formed on another semiconductor substrate. Respective pixels of the pixel array unit 240 of the semiconductor chip 511 and elements of the peripheral circuit unit 15 of the semiconductor chip 512 may be electrically connected to each other with use of through electrodes such as TSVs (Through Silicon Vias) formed in via regions 513 and via regions 514, for example. Moreover, both of the semiconductor chips may be affixed to each other in such a manner as to make contact between wiring of the semiconductor chip 511 constituting the pixel array unit 240 and wiring of the semiconductor chip 511 constituting the peripheral circuit unit 15 (Cu—Cu junction). Furthermore, a part of the pixel array unit 240 and a part of the peripheral circuit unit 15 depicted in FIG. 2 may be constituted by one semiconductor chip, and the other parts may be constituted by another semiconductor chip.

[Configuration Example of Pixel Circuit]

Figure 4:
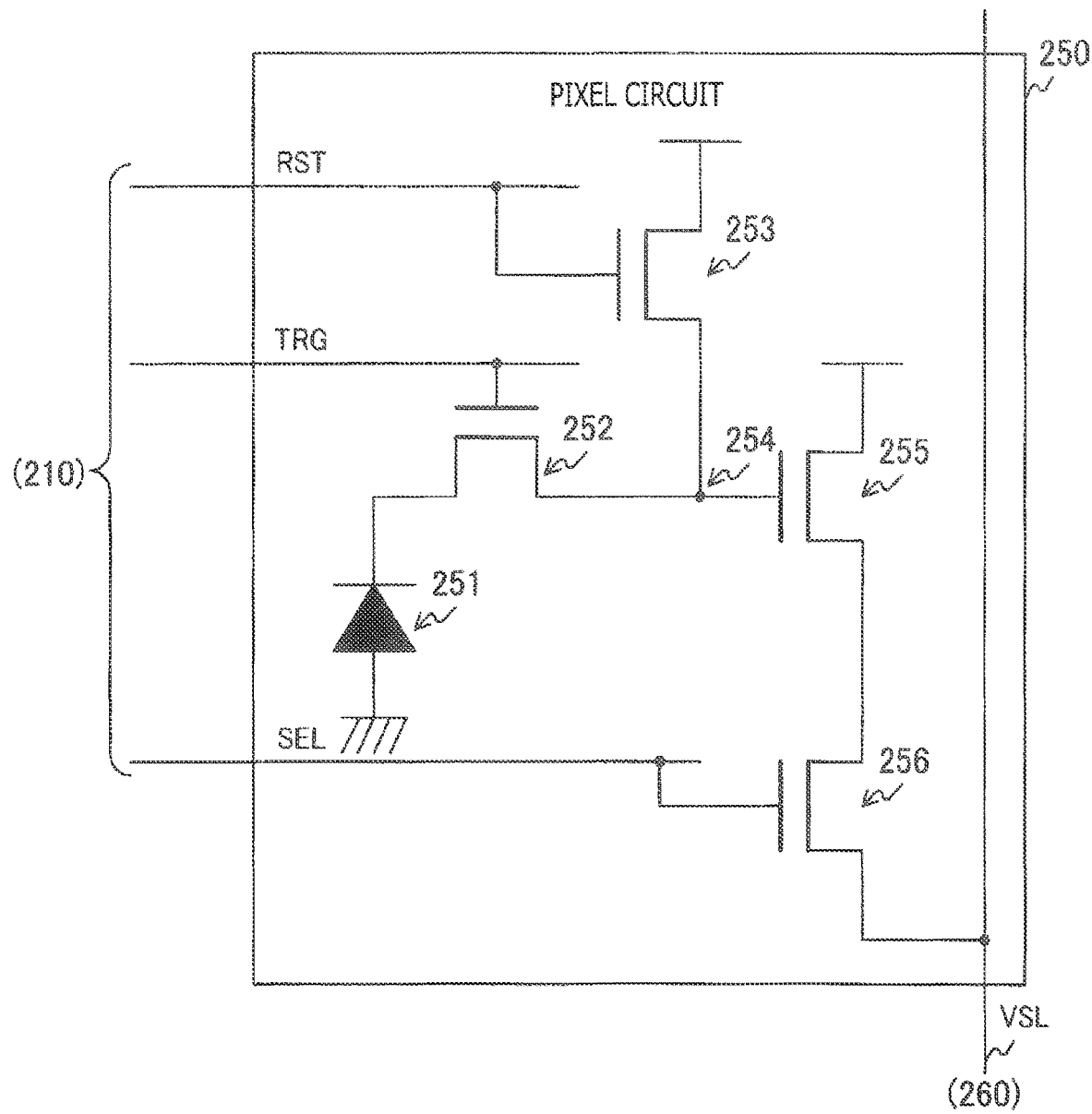
FIG. 4 is a circuit diagram depicting one configuration example of a pixel circuit according to the first embodiment of the present technology.

FIG. 4 is a circuit diagram depicting one configuration example of the pixel circuit 250 according to the first embodiment of the present technology. The pixel circuit 250 includes a photoelectric conversion element 251, a transfer transistor 252, a reset transistor 253, a floating diffusion layer 254, an amplification transistor 255, and a selection transistor 256. Moreover, a vertical signal line VSL is wired on the pixel array unit 240 for each column and extends in the vertical direction.

The photoelectric conversion element 251 photoelectrically converts incident light to generate charge. The transfer transistor 252 transfers the charge from the photoelectric conversion element 251 to the floating diffusion layer 254, according to a driving signal TRG received from the vertical scanning circuit 210.

The reset transistor 253 extracts the charge from the floating diffusion layer 254 and initializes the charge, according to a driving signal RST received from the vertical scanning circuit 210.

The floating diffusion layer 254 accumulates the charges and generates a voltage corresponding to the charge quantity. The amplification transistor 255 amplifies the voltage of the floating diffusion layer 254.

The selection transistor 256 outputs a signal of the amplified voltage as a pixel signal to the column signal processing unit 260 via the vertical signal line VSL, according to a driving signal SEL received from the vertical scanning circuit 210.

Note that the pixel circuit 250 may be a circuit different from the circuit depicted in the figure as long as the pixel circuit 250 is capable of generating a pixel signal by photoelectric conversion.

[Configuration Example of Column Signal Processing Unit]

Figure 5:
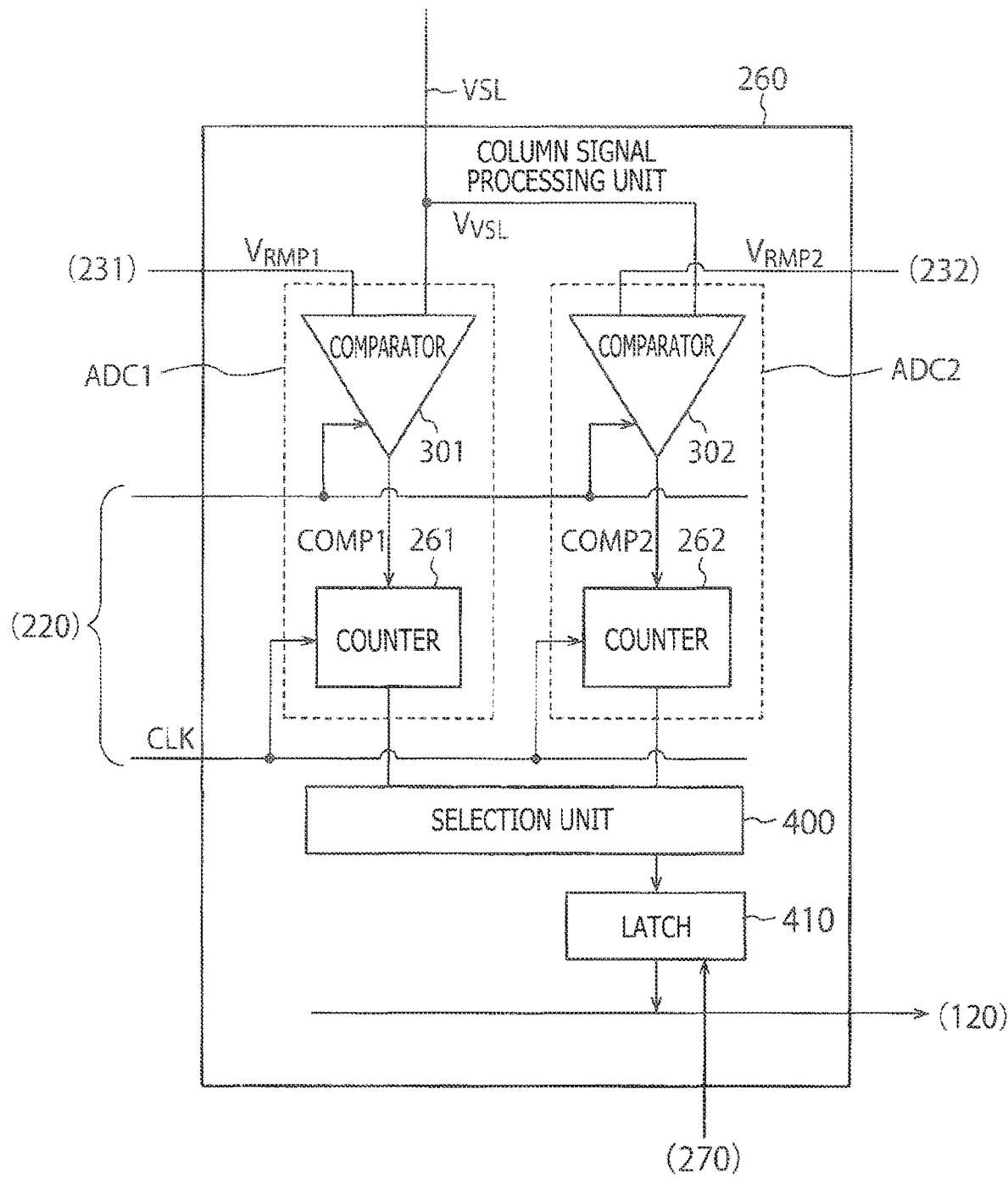
FIG. 5 is a block diagram depicting one configuration example of a column signal processing unit 260 according to the first embodiment of the present technology.

FIG. 5 is a block diagram depicting one configuration example of the column signal processing unit 260 according to the first embodiment of the present technology. The column signal processing unit 260 includes comparators 301 and 302, counters 261 and 262, a selection unit 400, and a latch 410. FIG. 5 depicts a configuration of the column signal processing unit 260 corresponding to the one vertical signal line VSL. Accordingly, the configuration of the column signal processing unit 260 depicted in FIG. 5 is provided for each column. In a case where the number of columns is N (N: integer), N comparators 301, N comparators 302, N counters 261, N counters 262, N selection units 400, and N latches 410 are disposed.

The comparators 301 and 302 compare the first reference signal and the second reference signal received from the DAC 231 and the DAC 232, respectively, with a pixel signal received from the corresponding column. It is hereinafter assumed that voltages of the first and second reference signals are first and second reference voltages $V_{RAMP1}$ and $V_{RAMP2}$, respectively, and that the voltage of the pixel signal input via the vertical signal line VSL is an input voltage $V_{VSL}$. The comparators 301 and 302 respectively supply comparison results COMP1 and COMP2, which are results of comparison between the first and second reference voltages $V_{RAMP1}$ and $V_{RAMP2}$ and the input voltage $V_{VSL}$, to the counters 261 and 262 of the corresponding column.

Moreover, the input voltage $V_{VSL}$ at the time of initialization of the pixel circuit 250 will hereinafter be referred to as a "reset level," and the input voltage $V_{VSL}$ at the time of transfer of a charge to the floating diffusion layer 254 will hereinafter be referred to as a "signal level."

The first and second counters 261 and 262 respectively continue counting of numerical values for periods until the comparison results COMP1 and COMP2 are inverted. For example, the first counter 261 down-counts values for a period from a slope start of the first reference voltage $V_{RMP1}$ to inversion of the comparison result COMP1 between the first reference voltage $V_{RMP1}$ and the reset level. Thereafter, the first counter 261 further up-counts values for a period from a slope start of the first reference voltage $V_{RMP1}$ to inversion of the comparison result COMP1 of comparison between the first reference voltage $V_{RMP1}$ and the signal level. In this manner, a count value of a difference between the up-count and the down-count is obtained. This count value of the difference corresponds to a difference between the reset level and the signal level. The first counter 261 outputs this count value as a first digital signal. In such a manner, CDS processing for obtaining the difference between the reset level and the signal level is executed using the first reference signal.

Moreover, for example, the second counter 262 down-counts values for a period from a slope start of the second reference voltage $V_{RMP2}$ to inversion of the comparison result COMP2 of comparison between the second reference voltage $V_{RMP2}$ and the reset level. Thereafter, the second counter 262 further up-counts values for a period from a slope start of the second reference voltage $V_{RMP2}$ to inversion of the comparison result COMP2 of comparison between the second reference voltage $V_{RMP2}$ and the signal level. In this manner, a difference between the up-count and the down-count is obtained. This count value of the difference corresponds to a difference between the reset level and the signal level. The second counter 262 outputs this count value as a second digital signal. In such a manner, CDS processing for obtaining the difference between the reset level and the signal level is executed using the second reference signal.

The first and second counters 261 and 262 each perform a substantially simultaneous count operation according to an identical clock signal received from the timing control unit 220.

Thereafter, the counters 261 and 262 output, to the selection unit 400, first and second digital signals respectively indicating count values obtained by CSD processing using the first and second reference signals, respectively. An AD-conversion process for converting analog pixel signals to digital signals is achieved using the comparators 301 and 302 and the counters 261 and 262. In other words, the comparators 301 and 302 and the counters 261 and 262 each function as an ADC. Hereinafter, the comparator 301 and the counter 261 will be referred to as an ADC1, and the comparator 302 and the counter 262 will be referred to as an ADC2 in some cases. The ADC using the comparator and the counter as described above is generally called a single-slope type ADC. Note that each of the first and second digital signals corresponds to a difference between the same reset level and the same signal level. In this case, as will be described later, the slope of the first reference signal and the slope of the second reference signal are different from each other, and therefore the first and second digital signals have different digital values.

According to the present disclosure, CDS processing is achieved by up-counting and down-counting. However, the configuration for achieving CDS processing is not limited to this configuration. Each of the counters 261 and 262 may be configured to perform only either up-counting or down-counting. In this case, CDS processing for obtaining the difference may be executed by a circuit disposed in the following stage.

The selection unit 400 selects either one of the first and second digital signals received from the counters 261 and 262, and performs a necessary calculation for the selected first or second digital signal to synthesize an image. For example, it is assumed that the slope of the first reference voltage $V_{RMP1}$ is relatively gentle, and that the slope of the second reference voltage $V_{RMP2}$ is steeper than the slope of the first reference voltage $V_{RMP1}$. In this case, when the first and second reference signals start sloping substantially at the same time, the second reference voltage $V_{RMP2}$ crosses the input voltage $V_{VSL}$ earlier than the first reference voltage $V_{RMP1}$. Accordingly, the ADC1 is considered to detect the input voltage $V_{VSL}$ with a higher gain (higher resolution) than the ADC2.

On the other hand, the counters 261 and 262 each operate according to a clock signal that is received from the timing control unit 220 and that has substantially the same frequency. Accordingly, the ADC1 achieves AD-conversion of the input voltage $V_{VSL}$ with use of the same gradation (the same bits) as that of the ADC2.

As described above, the first digital signal is a signal that has the same gradation as that of the second digital signal but is AD-converted with a gain higher than that of the second signal. The gain ratio of the ADC1 to the ADC2 is dependent on a slope ratio of the first reference voltage $V_{RMP1}$ to the second reference voltage $V_{RMP2}$. For example, suppose that the gain ratio of the ADC1 to the ADC2 is proportional to the slope ratio of the first reference voltage $V_{RMP1}$ to the second reference voltage $V_{RMP2}$. In this case, assuming that the slope of the first digital signal is one eighth of the slope of the second digital signal, the gain of the ADC1 is eight times higher than the gain of the ADC2. Accordingly, the ADC1 is capable of detecting image signals with a resolution eight times higher than that of the ADC2.

On the other hand, a clock signal CLK for operating the counters 261 and 262 is a common clock signal for the counters 261 and 262. In this case, the operation speed of the ADC1 is substantially equal to the operation speed of the ADC2. Accordingly, the ADC1 operates at the same operation speed as that of the ADC2, and achieves AD-conversion of the input voltage $V_{VSL}$ with a gain higher than that of the ADC2.

According to the configuration where the ADC1 and the ADC2 described above are provided on the same vertical signal line VSL as a common line as described above, the ADC1 is allowed to select the first digital signal obtained by AD-conversion of the input voltage $V_{VSL}$ with a high gain in a case where the signal level of the input voltage $V_{VSL}$ of the pixel signal is relatively low (the image is dark). In a case where the signal level of the input voltage $V_{VSL}$ is relatively high (the image is bright), the ADC2 selects the second digital signal obtained by AD-conversion of the input voltage $V_{VSL}$ with a low gain. As described above, the solid-state imaging element 200 according to the present technology is capable of selecting either the first or second digital signal according to the signal level of the input voltage $V_{VSL}$, and outputting the selected digital signal. For example, adoptable is such a use method which detects only a dark region of an image with a high gain (high resolution), and detects a bright region of the image with an ordinary gain.

The latch 410 retains the first or second digital signal received from the selection unit 400. The latch 410 outputs the retained first or second digital signal to the DSP circuit 120, under the control of the horizontal scanning circuit 270.

[Configuration Example of Comparator]

Figure 6:
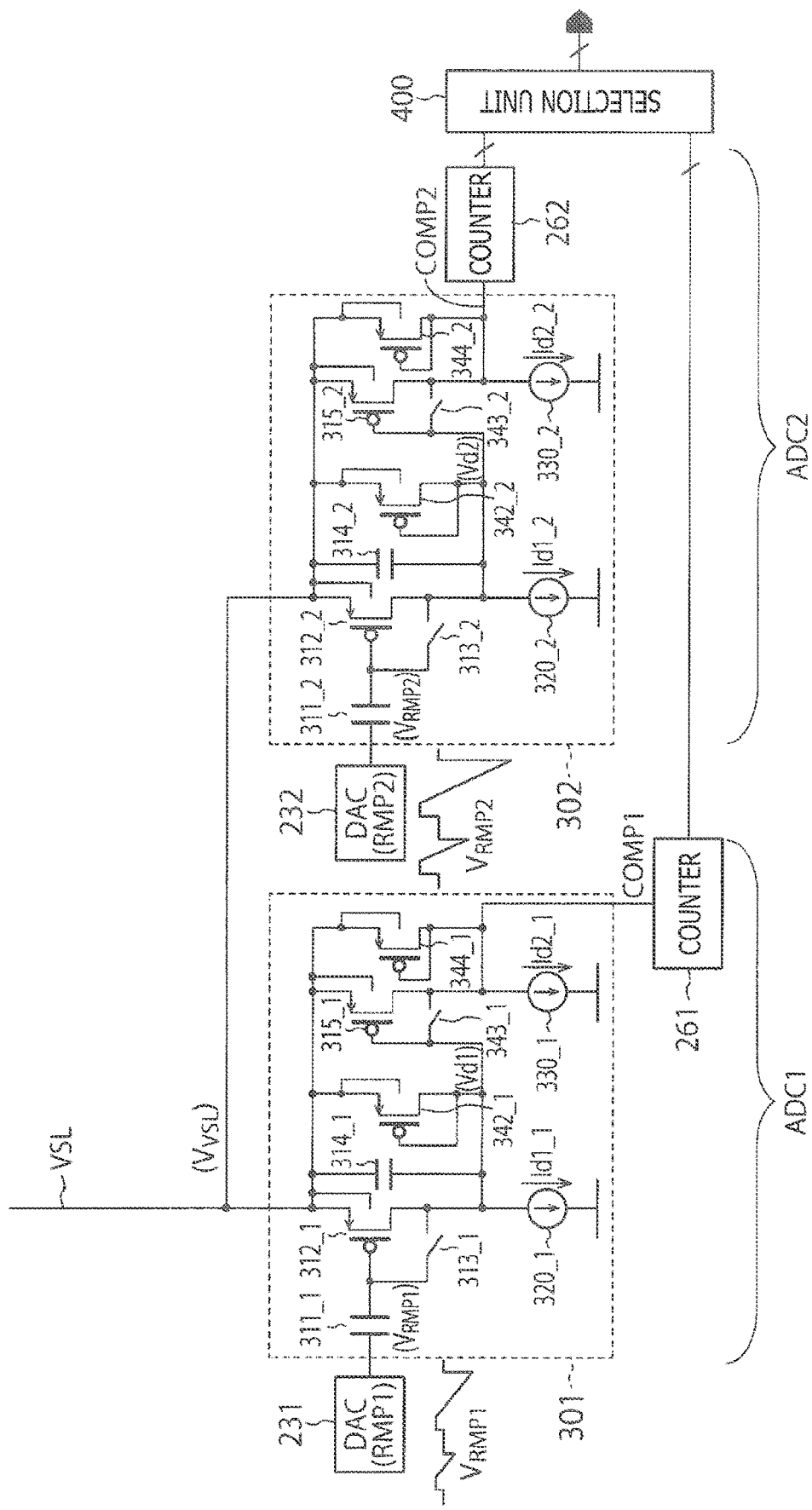
FIG. 6 is a circuit diagram depicting one configuration example of an ADC1 and an ADC2 according to the first embodiment of the present technology.

FIG. 6 is a circuit diagram depicting one configuration example of the ADC1 and the ADC2 according to the first embodiment of the present technology. The ADC1 includes the comparator 301 and the counter 261. The ADC2 includes the comparator 302 and the counter 262.

The comparator 301 includes capacitors 311_1 and 314_1, an input transistor 312_1, an auto-zero switch 313_1, an initialization switch 343_1, an output transistor 315_1, current sources 320_1 and 330_1, and clamp transistors 342_1 and 344_1.

The auto-zero capacitor 311_1 as a first auto-zero capacitor is provided between the DAC 231 and a gate of the input transistor 312_1. The DAC 231 as a first reference voltage supply unit generates and outputs a first reference signal (ramp signal) RMP1. The DAC 232 as a second reference voltage supply unit generates and outputs a second reference signal (ramp signal) RMP2. As described above, the reference signals RMP1 and RMP2 are signals having voltage slopes different from each other.

A source of the input transistor 312_1 as a first input transistor is connected to the vertical signal line VSL. The input voltage $V_{VSL}$ is input to this source. Moreover, the reference voltage $V_{RMP1}$ is input to the gate of the input transistor 312_1 via the auto-zero capacitor 311_1. The input transistor 312_1 outputs a drain voltage (first voltage) Vd1 corresponding to the input voltage $V_{VSL}$, from a drain of the input transistor 312_1 in reference to a voltage difference between the input voltage $V_{VSL}$ input to the source and the reference voltage $V_{RMP1}$ input to the gate. For example, at a time when the input voltage $V_{VSL}$ and the reference voltage $V_{RMP1}$ become substantially equal to each other, the input transistor 312_1 comes into a voltage state that is the same as a voltage state during auto-zero, and outputs a drain voltage Vd1 corresponding to the input voltage $V_{VSL}$ from the drain. The state "substantially equal to each other" here refers to a state where changes of the respective voltages from voltage values during the auto-zero period are equal to each other, or where a difference between these changes does not fall below a predetermined allowable value. For example, as the input transistor 312_1, a P-type MOSFET (Metal Oxide Semiconductor Field Effect Transistor) is used. It is preferable that a back gate and the source of the input transistor 312_1 be short-circuited to each other to reduce a back gate effect.

The auto-zero switch 313_1 as a first switch is provided between the gate and the drain of the input transistor 312_1. The auto-zero switch 313_1 achieves short-circuiting between the gate and the drain of the input transistor 312_1, according to a control signal from the timing control unit 220. The auto-zero switch 313_1 equalizes the voltages at the gate and the drain of the input transistor 312_1, before detection of a reset level.

The initialization switch 343_1 as a second switch is provided between a gate and a drain of the output transistor 315_1. The initialization switch 343_1 achieves short-circuiting between the gate and the drain of the output transistor 315_1, according to a control signal from the timing control unit 220. The initialization switch 343_1 equalizes the voltages at the gate and the drain of the output transistor 315_1 for initialization, before detection of a signal level.

The current source 320_1 as a first current source is inserted between the drain of the input transistor 312_1 and a predetermined reference terminal (e.g., ground terminal). The current source 320_1 supplies a fixed current Id1_1. The current source 320_1 is implemented by an N-type MOSFET or the like. A circuit configuration of the current source 320_1 will be described later.

The capacitor 314_1 is provided between the source and the drain of the input transistor 312_1 to remove high-frequency noise.

The source of the output transistor 315_1 as a first output transistor is connected to the vertical signal line VSL. The input voltage $V_{VSL}$ is input to this source. Moreover, the gate of the output transistor 315_1 is connected to the drain of the input transistor 312_1 to receive input of the drain voltage Vd1. For example, as the output transistor 315_1, a P-type MOSFET is used. In addition, it is preferable that a back gate and the source of the output transistor 315_1 be short-circuited to each other.

The output transistor 315_1 outputs the comparison result COMP1 of comparison between the input voltage $V_{VSL}$ and the reference voltage $V_{RMP1}$ from the drain of the output transistor 315_1 in reference to a voltage difference (second voltage difference) between the input voltage $V_{VSL}$ input to the source and the drain voltage Vd1 input to the gate. For example, the output transistor 315_1 outputs, from the drain, as the comparison result COMP1, a signal indicating whether or not the difference between the input voltage $V_{VSL}$ and the drain voltage Vd1 exceeds a threshold voltage of the output transistor 315_1. The comparison result COMP1 is supplied to the counter 261.

The current source 330_1 as a second current source is inserted between the drain of the output transistor 315_1 and a predetermined reference terminal (e.g., ground terminal) to supply a fixed current Id2_1. The current source 330_1 is implemented by an N-type MOSFET or the like. A circuit configuration of the current source 330_1 will also be described later.

The clamp transistor 342_1 as a first clamp transistor is provided between the source and the drain of the input transistor 312_1. For example, the clamp transistor 342_1 is a P-type MOSFET. A source of the clamp transistor 342_1 is connected to the vertical signal line VSL (input transistor 312_1), while a gate and a drain of the clamp transistor 342_1 are short-circuited to each other and connected to the drain of the input transistor 312_1 as a common connection destination. The clamp transistor 342_1 is provided to reduce an excessive drop of the drain voltage Vd of the input transistor 312_1 and maintain supply of the current Id1_1.

In a case where the clamp transistor 342_1 is not provided, the transistor of the current source 330_1 may come into a non-conductive state as a result of an excessive drop of the drain voltage Vd of the input transistor 312_1 at the time of supply of the fixed current Id1_1 from the current source 320_1. In this case, supply of the current Id1_1 from the drain stops.

According to the present disclosure, however, the clamp transistor 342_1 is provided. In this case, supply of the current Id1_1 can be maintained by the drain voltage Vd being limited to a voltage equal to or higher than a predetermined lower limit voltage.

The clamp transistor 344_1 as a second clamp transistor is provided between the source and the drain of the output transistor 315_1. For example, the clamp transistor 344_1 is a P-type MOSFET. A source of the clamp transistor 344_1 is connected to the vertical signal line VSL (output transistor 315_1), while a gate and a drain of the clamp transistor 344_1 are short-circuited to each other and connected to the drain of the input transistor 312_1 as a common connection destination. The clamp transistor 344_1 is provided to reduce an excessive drop of the drain voltage of the output transistor 315_1 and maintain supply of the current Id2_1.

In a case where the clamp transistor 344_1 is not provided, the transistor of the current source 330_1 may come into a non-conductive state as a result of an excessive drop of the drain voltage of the output transistor 315_1 at the time of supply of the fixed current Id2_1 from the current source 330_1. In this case, supply of the current Id2_1 from the drain stops.

According to the present disclosure, however, the clamp transistor 344_1 is provided. In this case, supply of the current Id2_1 can be maintained by the drain voltage of the output transistor 315_1 being limited to a voltage equal to or higher than a predetermined lower limit voltage.

The counter 261 obtains a first digital signal by measuring a period from a slope start of the reference signal RMP1 to inversion of the comparison result COMP1 and performing CSD processing, and outputs the first digital signal thus obtained to the selection unit 400.

The comparator 302 includes capacitors 311_2 and 314_2, an input transistor 312_2, an auto-zero switch 313_2, an initialization switch 343_2, an output transistor 315_2, current sources 320_2 and 330_2, and clamp transistors 342_2 and 344_2. Note that the configuration and the function of the comparator 302 are similar to the configuration and the function of the comparator 301, and can easily be understood from description regarding the comparator 301 by replacing a reference symbol *_1 with *_2. In this case, *** is a numeral of a reference symbol.

A source of the input transistor 312_2 as a second input transistor is connected to the vertical signal line VSL. The input voltage $V_{VSL}$ is input to this source. Moreover, the reference voltage $V_{RMP2}$ is input to a gate of the input transistor 312_2 via the auto-zero capacitor 311_2 as a second auto-zero capacitor. The auto-zero capacitor 311_2 is provided between the DAC 232 and the gate of the input transistor 312_2. The input transistor 312_2 outputs a drain voltage (second voltage) Vd2 corresponding to the input voltage $V_{VSL}$ from a drain of the input transistor 312_2 in reference to a third voltage difference between the input voltage $V_{VSL}$ input to the source and the reference voltage $V_{RMP2}$ input to the gate. For example, at a time when the input voltage $V_{VSL}$ and the reference voltage $V_{RMP2}$ become substantially equal to each other, the input transistor 312_2 comes into a voltage state that is the same as a voltage state during auto-zero, and outputs a drain voltage Vd2 corresponding to the input voltage $V_{VSL}$ from the drain. For example, as the input transistor 312_2, a P-type MOSFET is used. It is preferable that a back gate and the source of the input transistor 312_2 be short-circuited to each other to reduce a back gate effect.

The auto-zero switch 313_2 as a third switch is provided between the gate and the drain of the input transistor 312_2. The auto-zero switch 313_2 achieves short-circuiting between the gate and the drain of the input transistor 312_2, according to a control signal from the timing control unit 220. The auto-zero switch 313_2 equalizes the voltages at the gate and the drain of the input transistor 312_2, before detection of a reset level.

The initialization switch 343_2 as a fourth switch is provided between a gate and a drain of the output transistor 315_2. The initialization switch 343_2 achieves short-circuiting between the gate and the drain of the output transistor 315_2, according to a control signal from the timing control unit 220. The initialization switch 343_2 equalizes the voltages at the gate and the drain of the output transistor 315_2 for initialization, before detection of a signal level.

The current source 320_2 as a third current source is provided between the drain of the input transistor 312_2 and a predetermined reference terminal. The current source 320_2 supplies a fixed current Id1_2. The current source 320_2 is implemented by an N-type MOSFET or the like. A circuit configuration of the current source 320_2 will be described later.

The capacitor 314_2 is provided between the source and the drain of the input transistor 312_2 to remove high-frequency noise.

The source of the output transistor 315_2 as a second output transistor is connected to the vertical signal line VSL. The input voltage $V_{VSL}$ is input to this source. Moreover, the gate of the output transistor 315_2 is connected to the drain of the input transistor 312_2 to receive input of the drain voltage Vd2. For example, as the output transistor 315_2, a P-type MOSFET is used. In addition, it is preferable that a back gate and the source of the output transistor 315_2 be short-circuited to each other.

The output transistor 315_2 outputs the comparison result COMP2 of comparison between the input voltage $V_{VSL}$ and the reference voltage $V_{RMP2}$ from the drain of the output transistor 315_2 in reference to a voltage difference (fourth voltage difference) between the input voltage $V_{VSL}$ input to the source and the drain voltage (second voltage) Vd2 input to the gate. For example, the output transistor 315_2 outputs, from the drain, as the comparison result COMP2, a signal indicating whether or not the difference between the input voltage $V_{VSL}$ and the drain voltage Vd2 exceeds a threshold voltage of the output transistor 315_2. The comparison result COMP2 is supplied to the counter 261.

The current source 330_2 as a fourth current source is provided between the drain of the output transistor 315_2 and a predetermined reference terminal to supply a fixed current Id2_2. The current source 330_2 is implemented by an N-type MOSFET or the like. A circuit configuration of the current source 330_2 will also be described later.

Note that the current flowing in the vertical signal line VSL is the sum of currents flowing in the first to fourth current sources 320_1, 320_2, 330_1, and 330_2. Moreover, the quantities of the currents flowing in the current sources 320_1, 320_2, 330_1, and 330_2 are almost equalized to reduce interference between the comparators 301 and 302.

The clamp transistor 342_2 as a third clamp transistor is provided between the source and the drain of the input transistor 312_2. For example, the clamp transistor 342_2 is a P-type MOSFET. A source of the clamp transistor 342_2 is connected to the vertical signal line VSL (input transistor 312_2), while a gate and a drain of the clamp transistor 342_2 are short-circuited and connected to the drain of the input transistor 312_2 as a common connection destination. The clamp transistor 342_2 is provided to reduce an excessive drop of the drain voltage Vd of the input transistor 312_2 and maintain supply of the current Id1_2.

The clamp transistor 344_2 as a fourth clamp transistor is provided between the source and the drain of the output transistor 315_2. For example, the clamp transistor 344_2 is a P-type MOSFET. A source of the clamp transistor 344_2 is connected to the vertical signal line VSL (output transistor 315_2), while a gate and a drain of the clamp transistor 342_2 are short-circuited to each other and connected to the drain of the input transistor 312_2 as a common connection destination. The clamp transistor 344_2 is provided to reduce an excessive drop of the drain voltage of the output transistor 315_2 and maintain supply of the current Id2_2.

The counter 262 obtains a second digital signal by measuring a period from a slope start of the reference signal RMP2 to inversion of the comparison result COMP2 and performing CSD processing, and outputs the second digital signal thus obtained to the selection unit 400.

[Configuration Example of Current Source]

Figure 7:
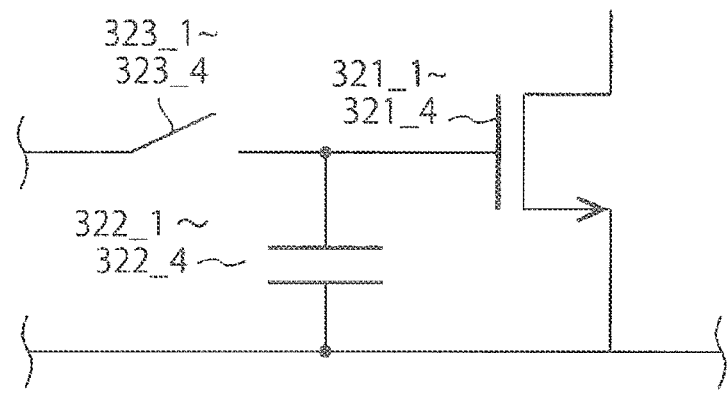
FIG. 7 is a circuit diagram depicting one example of an internal configuration of a current source of the present technology.

FIG. 7 is a circuit diagram depicting one example of an internal configuration of the current sources 320_1, 330_1, 320_2, and 330_2 of the present technology. The same configuration is adoptable for the respective current sources 320_1, 330_1, 320_2, and 330_2. Accordingly, FIG. 7 depicts only the configuration of one of the current sources for convenience.

The current sources 320_1, 330_1, 320_2, and 330_2 respectively include current source transistors 321_1 to 321_4, capacitors 322_1 to 322_4, and switches 323_1 to 323_4.

The first current source transistor 321_1 is provided between the drain of the input transistor 312_1 and a predetermined reference terminal. The second current source transistor 321_2 is provided between the drain of the output transistor 315_1 and a predetermined reference terminal. The third current source transistor 321_2 is provided between the drain of the input transistor 312_2 and a predetermined reference terminal. The fourth current source transistor 321_4 is provided between the drain of the output transistor 315_2 and a predetermined reference terminal. For example, each of the current source transistors 321_1 to 321_4 is constituted by an N-type MOSFET.

The first to fourth capacitors 322_1 to 322_4 are connected to the respective gates of the current source transistors 321_1 to 321_4 and the reference terminals.

The first to fourth sample hold switches 323_1 to 323_4 are respectively connected to the gates of the current source transistors 321_1 to 321_4.

A predetermined bias voltage is applied to each gate of the current source transistors 321_1 to 321_4. In an initial state, these bias voltages are sampled by the capacitors 322_1 to 322_4 with the sample hold switches 323_1 to 323_4 being turned. Thereafter, the bias voltages are held by the capacitors 322_1 to 322_4 with the sample hold switches 323_1 to 323_4 being turned on. Each of the sample hold switches 323_1 to 323_4 only needs to be brought into an on-state at the same timing as that of the auto-zero switch 313_1 (see FIG. 8).

The current source transistors 321_1 to 321_4 supply fixed currents Id1_1, Id2_1, Id1_2, and Id2_2, respectively, according to the bias voltages held in the capacitors 322_1 to 322_4.

Operations of the comparators 301 and 302 will next be described.

Figure 8:
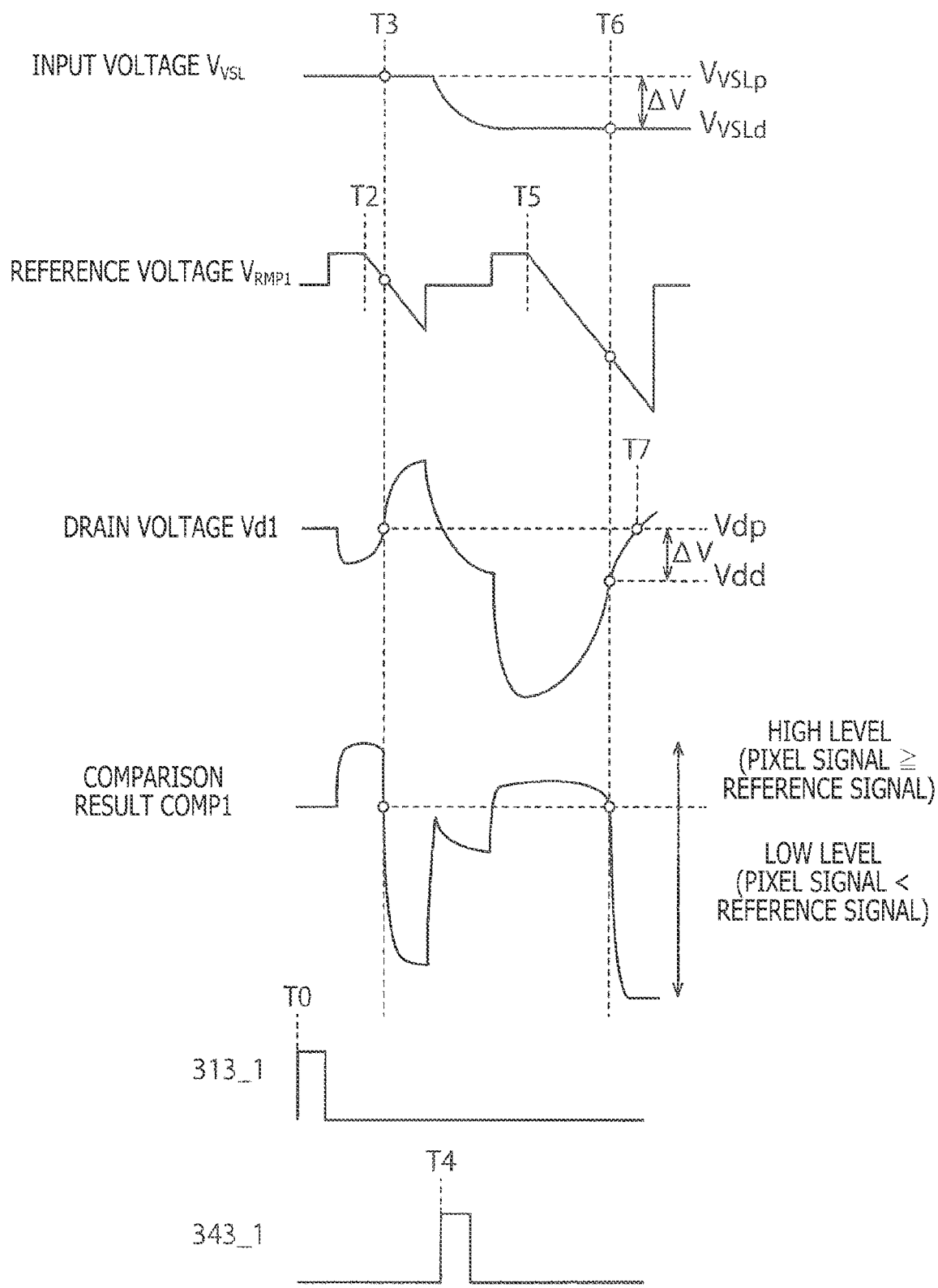
FIG. 8 is a timing chart presenting one example of an operation of a comparator according to the first embodiment of the present technology.

FIG. 8 is a timing chart presenting one example of the operation of the comparator 301 according to the first embodiment of the present technology.

The auto-zero switch 313_1 is brought into an on-state for a predetermined auto-zero period at timing T0 that is immediately before a start of AD-conversion. In this manner, the gate and the drain of the input transistor 312_1 are short-circuited to each other to initialize (achieve auto-zero of) the comparator 301.

Next, the DAC 231 starts reduction of the reference voltage $V_{RMP1}$ from timing T2, and gradually reduces the reference voltage $V_Rp$, with a predetermined slope for a fixed period of time. Meanwhile, it is assumed that a reset level (P-phase level) of the input voltage $V_{VSL}$ is $V_{VSLp}$.

Subsequently, it is assumed that the reference voltage $V_{RMP1}$ and the reset level $V_{VSLp}$ become substantially equal to each other at timing T3. It is assumed that the drain voltage Vd of the input transistor 312 at the timing T3 is Vdp. It is further assumed that a level lower than Vdp is a low level, and that a level equal to or higher than Vdp is a high level. In this case, the drain voltage Vd1 of the input transistor 312_1 is inverted from the low level to the high level at the timing T3. As a result, the gate voltage (Vd1) of the output transistor 315_1 is changed from the low level to the high level, and the comparison result COMP1 is inverted.

Then, the DAC 230 initializes the reference voltage $V_{RMP1}$, and the initialization switch 343_1 is brought into an on-state for a predetermined period of time at timing T4 that is before AD-conversion of the signal level. In this manner, the gate and the drain of the output transistor 315_1 are short-circuited to each other to initialize the output transistor 315_1.

Next, the DAC 231 starts reduction of the reference voltage $V_{RMP1}$ from timing T5, and gradually reduces the reference voltage $V_{RMP1}$ with a predetermined slope for a fixed period of time. Meanwhile, charge is transferred to the floating diffusion layer 254 in FIG. 4. As a result, the input voltage $V_{VSL}$ turns into a signal level (D-phase level) $V_{VSLd}$. It is assumed that the signal level $V_{VSLd}$ is lower than the reset level $V_{VSLp}$ by ΔV.

Subsequently, it is assumed that the reference voltage $V_{RMP1}$ and the signal level $V_{VSLd}$ become substantially equal to each other at timing T6. Assuming that the drain voltage Vd1 of the input transistor 312_1 at the timing T6 is Vdd, the drain voltage Vdd at this time has a value lower than the drain voltage Vdp by ΔV. Specifically, the drain voltage Vdd at the timing T6 is dependent on the input voltage at that time (signal level $V_{VSLd}$), and has a lower value as the signal level $V_{VSLd}$ decreases. The drain voltage Vdd of the input transistor 312_1 is a voltage lower than the drain voltage Vdp at the time of reset level conversion by ΔV.

Accordingly, if the drain voltage Vd1 is used as the comparison result COMP1, inversion of the drain voltage Vd1 starts at timing T7 that is after the timing T6. The timing T7 deviates from the timing T6 that is ideal in that the reference voltage $V_{RMP1}$ and the signal level $V_{VSLd}$ become substantially equal to each other. In this case, the ADC1 may cause a linearity error or an offset. This error may deteriorate image quality. In other words, if the comparison result COMP1 is output from the drain of the input transistor 312_1 in a configuration in which the output transistor 315_1 is not provided, image quality may deteriorate.

On the other hand, according to the present disclosure, the output transistor 315_1 is provided in a stage after the input transistor 312_1, and the source and the drain of the input transistor 312_1 are connected to the source and the gate of the output transistor 315_1. By this connection, the voltage between the drain and the source of the input transistor 312_1 is input as the voltage between the gate and the source of the output transistor 315_1.

At the timing T3 and the timing T6 at which the reference voltage $V_{RMP1}$ and the input voltage $V_{VSL}$ become substantially equal to each other, a voltage drop amount ΔV of the input voltage $V_{VSL}$ is equal to a voltage drop amount of the drain voltage Vd1. Accordingly, the voltage between the drain and the source of the input transistor 312_1 at the timing T3 has the same value as that voltage at the timing T6. Specifically, each voltage between the drain and the source of the input transistor 312_1 at the timing T3 and the timing T6 is equalized with the voltage during auto-zero. The voltage between the drain and the source of the input transistor 312_1 is equal to the voltage between the gate and the source of the output transistor 315_1. Accordingly, the drain voltage of the output transistor 315_1 is inverted at the timing T3 and the timing T6.

As described above, the comparator 301 according to the present disclosure has a double-stage configuration including the input transistor 312_1 and the output transistor 315_1. In this case, inversion of the comparison result COMP1 starts at the timing T3 and the timing T6 that are ideal in that the reference voltage $V_{RMP1}$ and the signal level $V_{VSLd}$ become substantially equal to each other. Accordingly, an inversion timing error decreases. In this manner, the solid-state imaging element 200 according to the present disclosure is capable of reducing a linearity error and an offset and thus achieving image quality improvement in comparison with a case where the drain voltage Vd1 is used as the comparison result COMP1.

Figure 9:
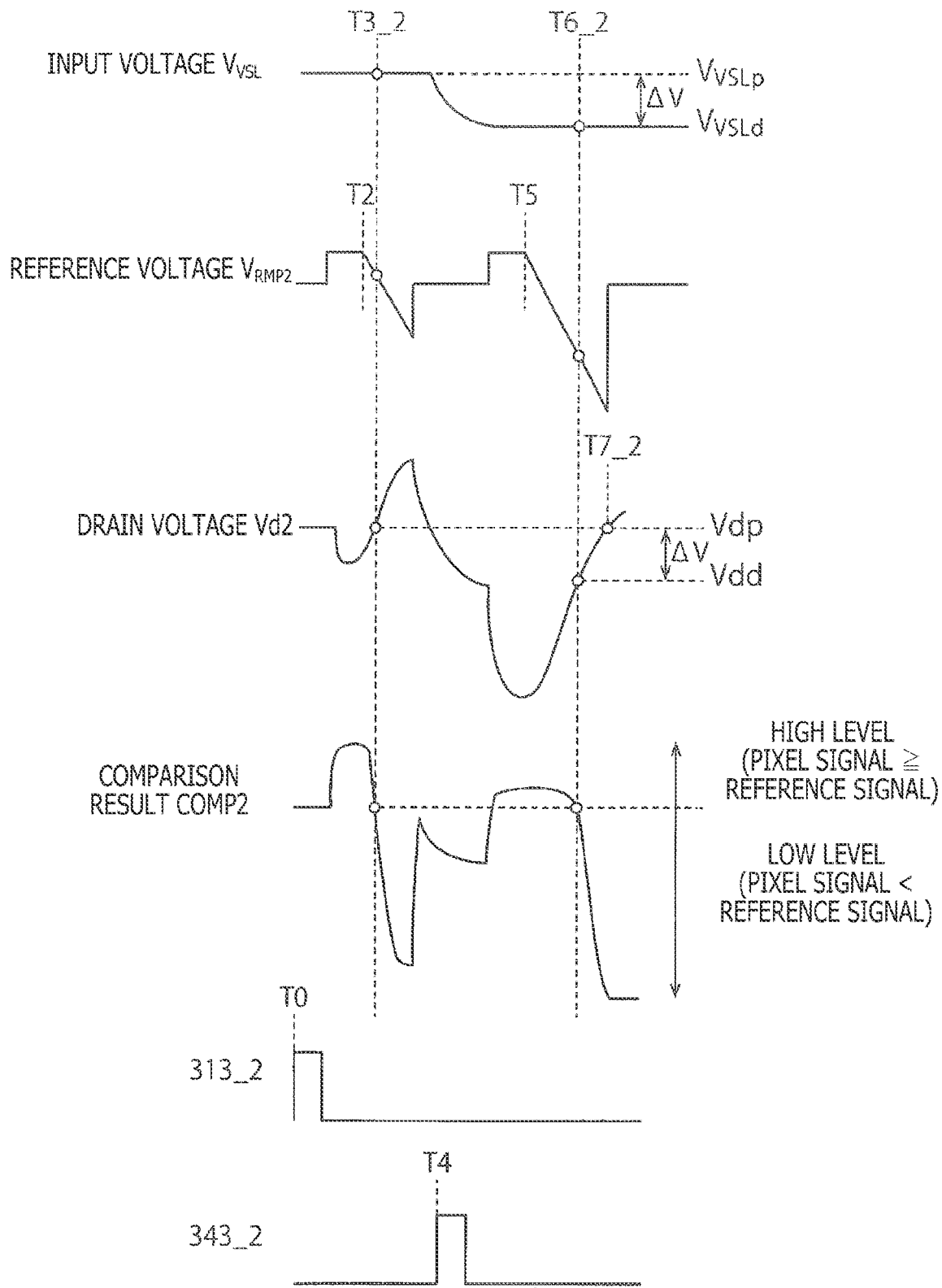
FIG. 9 is a timing chart presenting one example of an operation of a comparator according to the first embodiment of the present technology.

FIG. 9 is a timing chart presenting one example of the operation of the comparator 302 according to the first embodiment of the present technology. Note that the operation of the comparator 302 is basically the same as the operation of the comparator 301 except for the reference signals RMP1 and RMP2 having voltage slopes different from those of the comparator 301. Moreover, the comparator 302 operates simultaneously with the comparator 301.

The auto-zero switch 313_2 is brought into an on-state for a predetermined auto-zero period at timing T0. In this manner, the gate and the drain of the input transistor 312_2 are short-circuited to each other to initialize (achieve auto-zero of) the comparator 302.

Next, the DAC 232 starts reduction of the reference voltage $V_{RMP2}$ from timing T2, and gradually reduces the reference voltage $V_{RMP2}$ with a predetermined slope for a fixed period of time. The voltage slope of the reference voltage $V_{RMP2}$ is steeper than that of the reference voltage $V_{RMP1}$ in FIG. 8.

Subsequently, it is assumed that the reference voltage $V_{RMP2}$ and the reset level $V_{VSLp}$ become substantially equal to each other at timing T3_2. The timing T3_2 is earlier than T3. In this case, the drain voltage Vd2 of the input transistor 312_2 is inverted from the low level to the high level at the timing T3_2, and the gate voltage of the output transistor 315_2 (comparison result COMP2) is inverted.

Then, the DAC 230 initializes the reference voltage $V_{RMP2}$, and the initialization switch 343_2 is brought into an on-state for a predetermined period of time at timing T4. In this manner, the gate and the drain of the output transistor 315_2 are short-circuited to each other to initialize the output transistor 315_2.

Next, the DAC 232 starts reduction of the reference voltage $V_{RMP2}$ from timing T5, and gradually reduces the reference voltage $V_{RMP2}$ with a predetermined slope for a fixed period of time. Meanwhile, charge is transferred to the floating diffusion layer 254 in FIG. 4. As a result, the input voltage $V_{VSL}$ turns into a signal level (D-phase level) $V_{VSLd}$.

Subsequently, it is assumed that the reference voltage $V_{RMP2}$ and the signal level $V_{VSLd}$ become substantially equal to each other at timing T6_2. The timing T6_2 is earlier than T6. Assuming that the drain voltage Vd2 of the input transistor 312_2 at the timing T6_2 is Vdd, the drain voltage Vdd at this time has a value lower than the drain voltage Vdp by ΔV. Specifically, the drain voltage Vdd at the timing T6_2 is dependent on the input voltage at that time (signal level $V_{VSLd}$), and has a lower value as the signal level $V_{VSLd}$ decreases. The drain voltage Vdd of the input transistor 312_2 is lower than the drain voltage Vdp at the time of reset level conversion by ΔV.

If the drain voltage Vd2 is used as the comparison result COMP2, inversion of the drain voltage Vd1 starts at timing T7_2 that is after the timing T6_2. The timing T7_2 deviates from the timing T6_2 that is ideal in that the reference voltage $V_{RMP2}$ and the signal level $V_{VSLd}$ become substantially equal to each other. In this case, the ADC1 may cause a linearity error or an offset. This error may deteriorate image quality.

On the other hand, according to the present disclosure, the output transistor 315_2 is provided in a stage after the input transistor 312_2, and the source and the drain of the input transistor 312_2 are connected to the source and the gate of the output transistor 315_2. By this connection, the voltage between the drain and the source of the input transistor 312_2 is input as the voltage between the gate and the source of the output transistor 315_2.

At the timing T3_2 and the timing T6_2 at which the reference voltage $V_{RMP2}$ and the input voltage $V_{VSL}$ become substantially equal to each other, a voltage drop amount ΔV of the input voltage $V_{VSL}$ is equal to a voltage drop amount of the drain voltage Vd2. Accordingly, the voltage between the drain and the source of the input transistor 312_2 at the timing T3_2 has the same value as that voltage at the timing T6_2. Specifically, each voltage between the drain and the source of the input transistor 312_2 at the timing T3_2 and the timing T6_2 is equalized with the voltage during auto-zero. The voltage between the drain and the source of the input transistor 312_2 is equal to the voltage between the gate and the source of the output transistor 315_2. Accordingly, the drain voltage of the output transistor 315_2 is inverted at the timing T3_2 and the timing T6_2.

As described above, the comparator 302 according to the present disclosure has a double-stage configuration including the input transistor 312_2 and the output transistor 315_2. In this case, inversion of the comparison result COMP2 starts at the timing T3_2 and the timing T6_2 that are ideal in that the reference voltage $V_{RMP2}$ and the signal level $V_{VSLd}$ become substantially equal to each other. Accordingly, an inversion timing error decreases. As a result, the solid-state imaging element 200 according to the present disclosure is capable of reducing a linearity error and an offset and thus achieving further image quality improvement in comparison with a case where the drain voltage Vd2 is used as the comparison result COMP2.

Moreover, according to the present disclosure, the ADC1 and ADC2 having different gains are provided in plural number for the one vertical signal line VSL. This configuration can generate the first and second digital signals AD-converted from one pixel signal with different gains. The selection unit 400 can select the digital signal AD-converted with an appropriate gain from the first and second digital signals.

Figure 10:
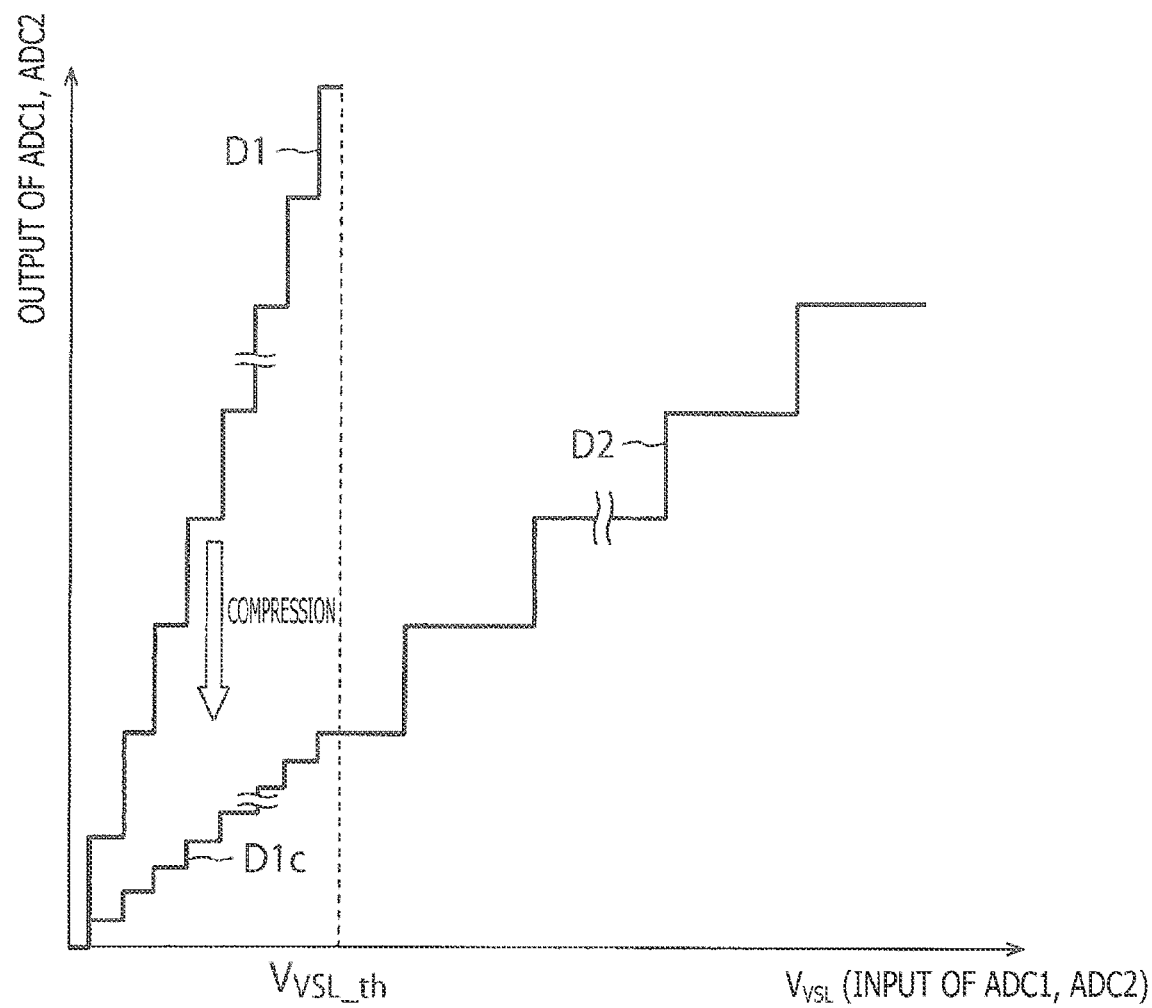
FIG. 10 is a graph representing one example of a relation between an input voltage and an output value of each of the ADC1 and the ADC2 according to the present disclosure.

FIG. 10 is a graph representing one example of a relation between the input voltage $V_{VSL}$ and the output values (first and second digital signals) of the ADC1 and the ADC2 according to the present disclosure. A horizontal axis of this graph represents the input voltage $V_{VSL}$ (analog value) input to the ADC1 and the ADC2. A vertical axis represents the first and second digital signals (digital values) output from the ADC1 and the ADC2.

Described with reference to FIG. 10 will be advantageous effects produced by providing the two comparators 301 and 302 having different gains in correspondence with the one vertical signal line VSL.

When the number of counts from a counter is reduced along with a reduction of a gain of an ADC, a length of time required for AD-conversion and power consumption generally decrease. In this case, however, resolution of an image lowers, and gradation of pixel data obtained after AD-conversion increases (becomes rough). Such roughness of the gradation of the pixel data is inconspicuous in a bright image region containing a large volume of noise, but becomes remarkable in a dark image region containing a small volume of noise. Accordingly, a brightness difference between gradations of pixel data appears on a screen in the dark image region.

On the other hand, when the number of the counts from the counter is raised along with a rise of the gain of the ADC, the resolution of the image improves. Accordingly, the gradation of the pixel data obtained after AD-conversion decreases (becomes fine). In this case, the brightness difference between gradations of the pixel data is inconspicuous even in the dark image region. As a result, pixel data less deteriorated can be obtained. However, the length of time required for AD-conversion becomes longer, and the power consumption increases. In other words, a tradeoff relation holds between image quality and the length of time required for AD-conversion or the power consumption.

On the other hand, according to the present disclosure, the ADC1 AD-converts a pixel signal with a relatively high gain to generate the first digital signal D1, and the ADC2 AD-converts a pixel signal with a relatively low gain to generate the second digital signal D2, in a state where a frequency of the clock signal CLK is increased to a certain high level.

In addition, in a case where the input voltage $V_{VSL}$ is lower than a threshold $V_{VSL}$ in a dark image, the selection unit 400 selects the first digital signal D1 AD-converted with a high gain. In a case where the input voltage $V_{VSL}$ is equal to or higher than the threshold $V_{VSL\_th}$ in a bright image, the selection unit 400 selects the second digital signal D2 AD-converted with a low gain.

The selection unit 400 outputs the selected digital signal D1 or D2 to the latch 410 to latch the selected digital signal D1 or D2 by the latch 410. Thereafter, the DSP circuit 120 performs a calculation process for the selected digital signal to generate image data.

In a case where the first digital signal D1 is selected, the DSP circuit 120 converts (compresses) data regarding the first digital signal D1 in such a manner as to match the gain of the first digital signal D1 with the gain of the second digital signal D2. For example, in a case where the gain of the ADC1 is eight times higher than the gain of the ADC2, i.e., in a case where the slope of the reference signal RMP1 is one eighth of the slope of the reference signal RMP2, the DSP circuit 120 compresses the gradation of the first digital signal D1 to one eighth. As a result, the gain of a first digital signal obtained after compression (hereinafter referred to as a compressed digital signal) D1c is equalized with the gain of the second digital signal D2. Accordingly, one image is allowed to be formed.

Here, in a case of AD-conversion of gradations of the first and second digital signals D1 and D2 by 11 bits, the compressed digital signal D1c obtained by reduction of the gradation of the first digital signal D1 to one eighth corresponds to a signal AD-converted by 14 bits. Specifically, the compressed digital signal D1c used for a dark image region is image data having a relatively small (fine) gradation, while the second digital signal D2 used for a relatively bright image region is image data having a relatively large (rough) gradation.

As described above, according to the present disclosure, the ADC1 AD-converts a pixel signal with a relatively high gain and generates the first digital signal D1 while reducing the frequency of the clock signal CLK. Thereafter, the DSP circuit 120 compresses the gradation of the first digital signal D1 to generate the compressed digital signal D1c and form an image. The gradation of the second digital signal D2 need not be converted.

In this manner, the length of time required for AD-conversion and power consumption can be reduced, and deterioration of image quality of the dark image region can also be reduced. In other words, the solid-state imaging element 200 according to the present disclosure can eliminate the tradeoff relation between image quality and the length of time required for AD-conversion or the power consumption.

Moreover, a switching point of the gain of AD-conversion can be varied by freely setting the threshold of the input voltage $V_{VSL}$ at the selection unit 400.

Note that the gradation of the second digital signal D2 or both the gradations of the first and second digital signals D1 and D2 may be converted in such a manner as to match the gains of the first and second digital signals D1 and D2.

According to the present disclosure, the reference signals RMP1 and RMP2 are signals each having a descending slope. However, the reference signals RMP1 and RMP2 may be signals each having an ascending slope. In a case where each of the reference signals RMP1 and RMP2 has an ascending slope, the reset level becomes lower than the signal level. Accordingly, in a case of a reference voltage circuit which has a current source where a reference voltage circuit supplies a current toward a GND-side resistance, a current used for generation of a reference voltage can be more reduced as the set level lowers. Accordingly, noise contained in the reference signals RMP1 and RMP2 can be reduced. The relation between the signal level and the reset level for the reference signals RMP1 and RMP2 becomes reversed. Accordingly, noise decreases at the reset level or in a dark image region. Meanwhile, in the case where the reference signals RMP1 and RMP2 each have an ascending slope, settling time increases for the high input voltage $V_{VSL}$. Accordingly, each of the reference signals RMP1 and RMP2 may be either a signal having a descending slope or a signal having an ascending slope.

Second Embodiment

Figure 11:
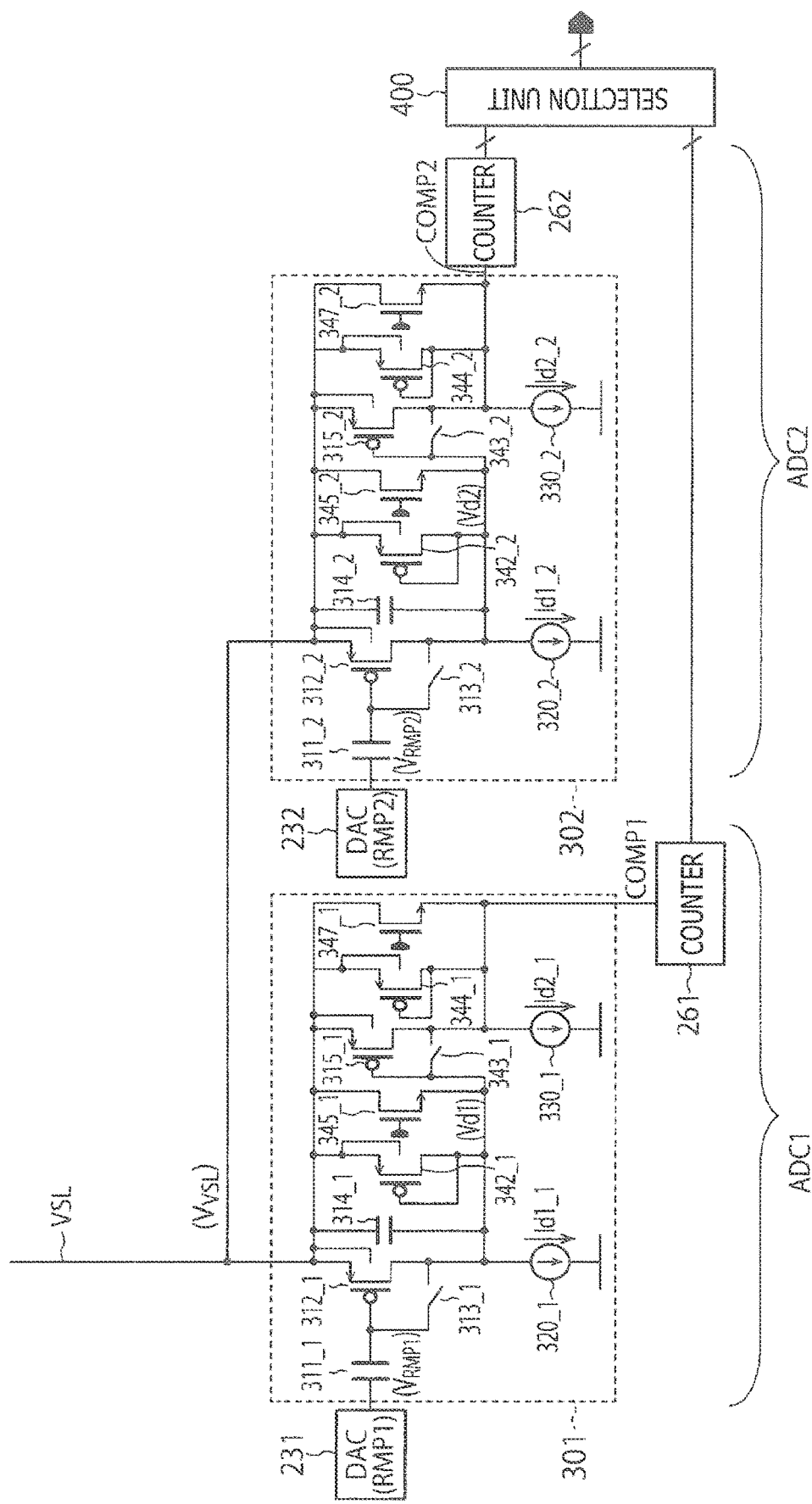
FIG. 11 is a circuit diagram depicting a configuration example of an ADC1 and an ADC2 according to a second embodiment of the present technology.

FIG. 11 is a circuit diagram depicting a configuration example of an ADC1 and an ADC2 according to a second embodiment of the present technology. According to the second embodiment, the ADC1 and the ADC2 further include clamp transistors 345_1, 347_1, 345_2, and 347_2. The clamp transistor 345_1 as a fifth clamp transistor is connected to the clamp transistor 342_1 in parallel, and a predetermined bias voltage is applied to a gate of the clamp transistor 345_1. The clamp transistor 347_1 as a sixth clamp transistor is connected to the clamp transistor 344_1 in parallel, and a predetermined bias voltage is applied to a gate of the clamp transistor 347_1. The clamp transistor 345_2 as a seventh clamp transistor is connected to the clamp transistor 342_2 in parallel, and a predetermined bias voltage is applied to a gate of the clamp transistor 345_2. The clamp transistor 347_2 as an eighth clamp transistor is connected to the clamp transistor 344_2 in parallel, and a predetermined bias voltage is applied to a gate of the clamp transistor 347_2.

Each of the clamp transistors 345_1, 347_1, 345_2, and 347_2 includes an N-type MOSFET.

A bias voltage is applied to each of the gates of the clamp transistors 345_1, 347_1, 345_2, and 347_2. Accordingly, lower limits of the drain voltages Vd1 and Vd2 are regulated regardless of the input voltage $V_{VSL}$ of the vertical signal line VSL. In this manner, a supply stop of the drain currents Id1 and Id2 can be more reliably prevented. According to the second embodiment, the lower limit of the drain voltage Vd is regulated by the bias voltage regardless of the input voltage $V_{VSL}$. Accordingly, a dynamic range decrease or a noise increase can be reduced.

Note that the gates of the clamp transistors 345_1, 347_1, 345_2, and 347_2 may be connected to corresponding drains in a case where no problem occurs concerning the dynamic range or the noise. In this case, the lower limit voltages of the drain voltages Vd1 and Vd2 are interlinked with the input voltage $V_{VSL}$. Accordingly, dependency of the maximum amplitude of the voltage between the gate and the source of each of the output transistors 315_1 and 315_2 on the signal level decreases, and a reduction of a linearity error and a gain error is thus achievable.

Other configurations of the second embodiment may be similar to the corresponding configurations of the first embodiment. Accordingly, advantageous effects similar to the advantageous effects of the first embodiment can be offered by the second embodiment.

Third Embodiment

Figure 12:
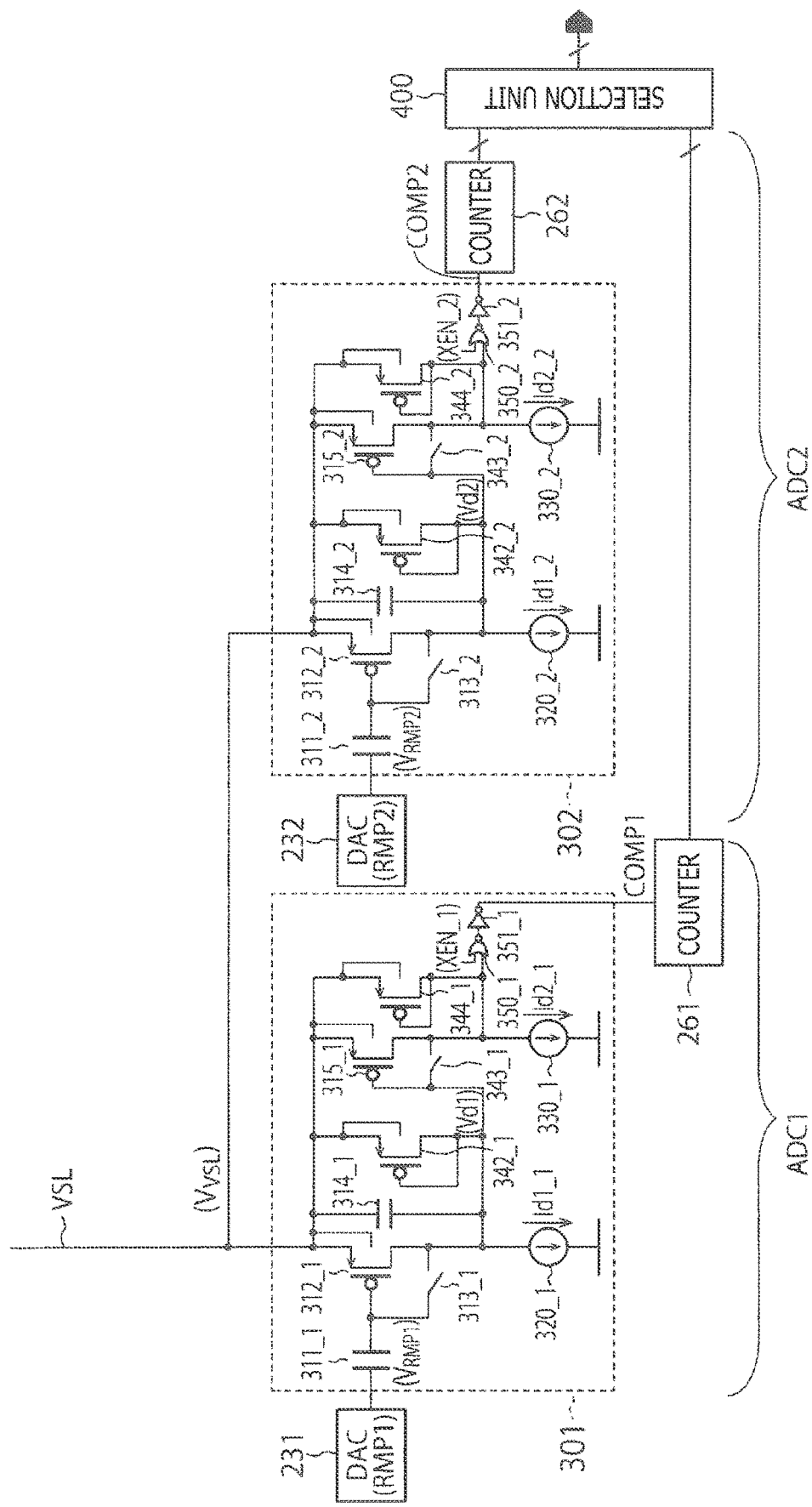
FIG. 12 is a circuit diagram depicting a configuration example of an ADC1 and an ADC2 according to a third embodiment of the present technology.

FIG. 12 is a circuit diagram depicting a configuration example of an ADC1 and an ADC2 according to a third embodiment of the present technology. The third embodiment is different from the first embodiment in that the ADC1 further includes an NOR gate 350_1 and an inverter 351_1 and that the ADC2 further includes an NOR gate 350_2 and an inverter 351_2.

The NOR gate 350_1 as a first logic gate is connected to the drain of the output transistor 315_1 to output NOR of output from the output transistor 315_1 and a control signal XEN_1 to the inverter 351_1. The inverter 351_1 inverses the output of the NOR gate 350_1, and outputs the inverted output to the counter 261, as the comparison result COMP1.

The NOR gate 350_2 as a second logic gate is connected to the drain of the output transistor 315_2 to output NOR of output from the output transistor 315_2 and a control signal XEN_2 to the inverter 351_2. The inverter 351_2 inverses the output of the NOR gate 350_2, and outputs the inverted output to the counter 262, as the comparison result COMP2.

According to the configuration described above, the voltages of the comparison results COMP1 and COMP2 can be adjusted to power source voltage levels of other logic circuits. Moreover, the logic of each output of the NOR gates 350_1 and 350_2 is fixed for the auto-zero period, the AD-conversion period of the reset level, and the AD-conversion period of the signal level. In this manner, a flow of a through-current into the third-stage NOR gate 350 can be stopped even when the drain voltage of the output transistor 315_1 is an intermediate voltage.

Advantageous effects similar to the advantageous effects of the first embodiment can be offered by the third embodiment. Moreover, the third embodiment may be combined with the second embodiment. Note that more logic gates may be connected in multiple stages in each of the ADC1 and the ADC2.

Fourth Embodiment

Figure 13:
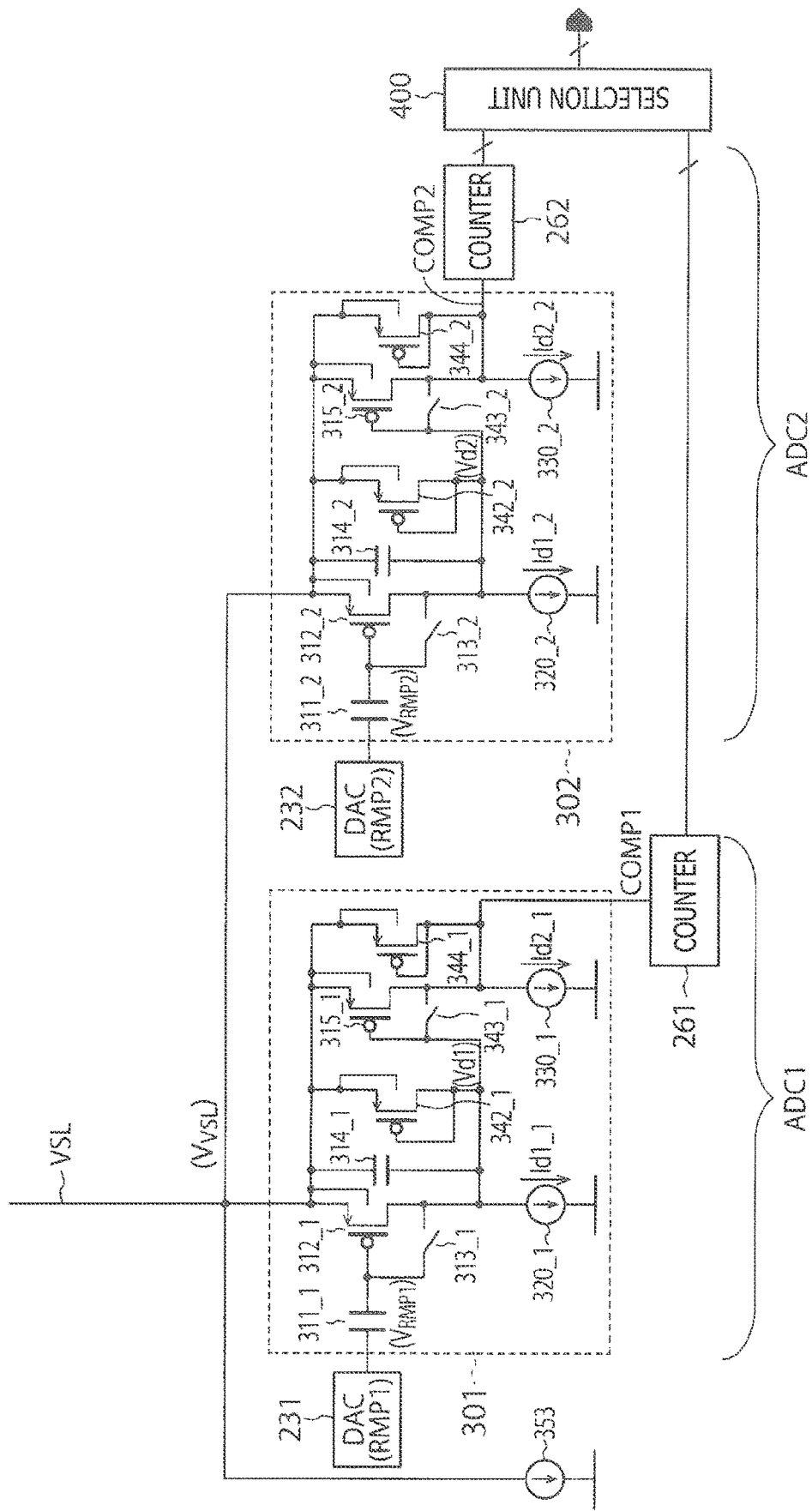
FIG. 13 is a circuit diagram depicting a configuration example of an ADC1 and an ADC2 according to a fourth embodiment of the present technology.

FIG. 13 is a circuit diagram depicting a configuration example of an ADC1 and an ADC2 according to a fourth embodiment of the present technology. The solid-state imaging element 200 according to the fourth embodiment is different from the first embodiment in that a VSL current source 353 is additionally provided.

The VSL current source 353 as a fifth current source is connected to the vertical signal line VSL and a reference terminal. Each of the current quantities of the currents Id1_1, Id2_1, Id1_2, and Id2_2 can be reduced by the quantity of the current supplied from the VSL current source 353 to the vertical signal line VSL.

Other configurations of the fourth embodiment may be similar to the corresponding configurations of the first embodiment. In this manner, advantageous effects similar to the advantageous effects of the first embodiment can be offered by the fourth embodiment. Moreover, the fourth embodiment may be combined with the second or third embodiment. In this manner, the advantageous effects of the second or third embodiment can be offered by the fourth embodiment.

Fifth Embodiment

Figure 14:
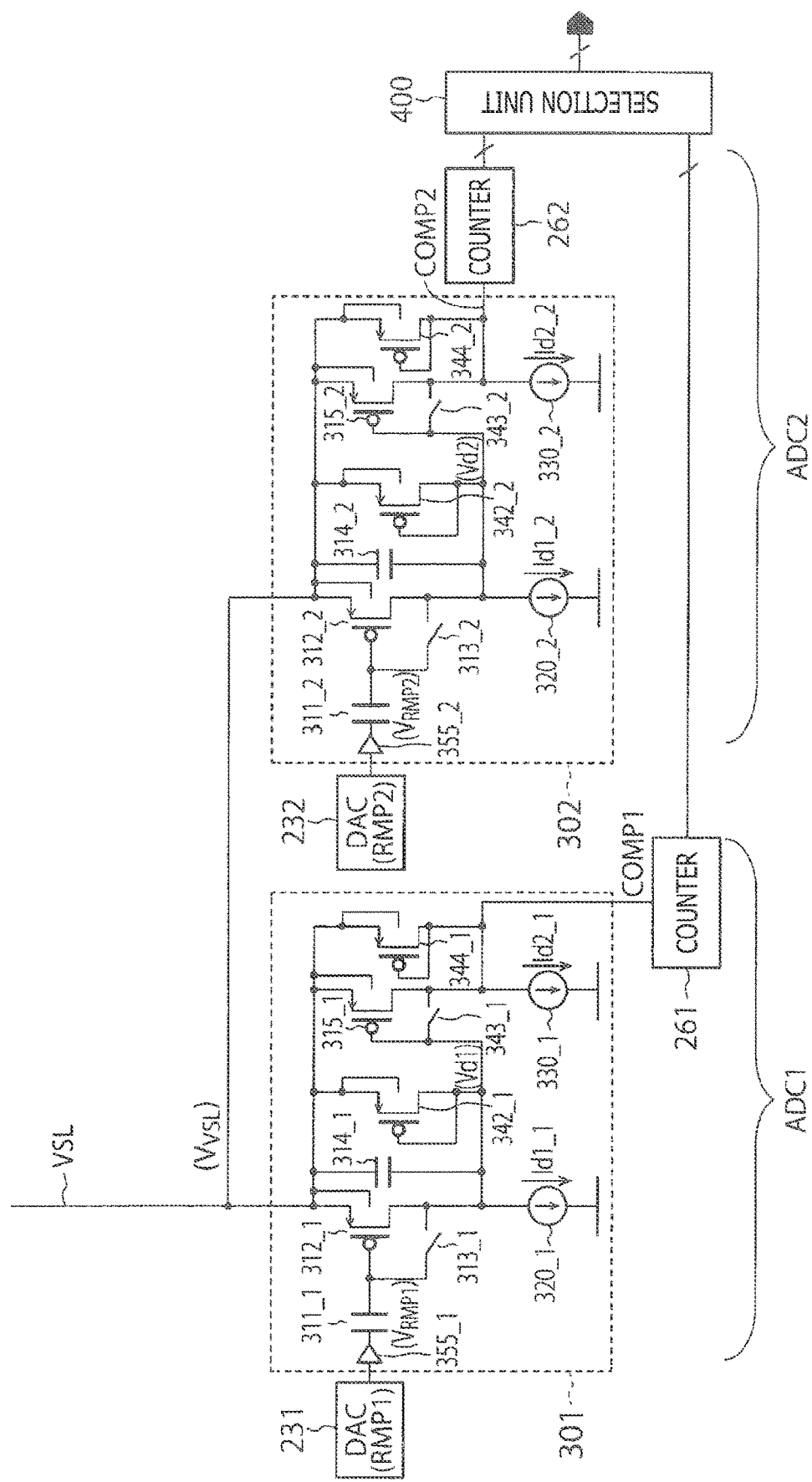
FIG. 14 is a circuit diagram depicting a configuration example of an ADC1 and an ADC2 according to a fifth embodiment of the present technology.

FIG. 14 is a circuit diagram depicting a configuration example of an ADC1 and an ADC2 according to a fifth embodiment of the present technology. The ADC1 and the ADC2 according to the fifth embodiment are different from the ADC1 and the ADC2 of the first embodiment in that buffers 355_1 and 355_2 are further provided, respectively.

The first buffer 355_1 is provided between the DAC 231 and the auto-zero capacitor 311_1. The buffer 355_1 may be disposed in correspondence with each of the vertical signal lines VSL, or may be disposed in correspondence with a plurality of the vertical signal lines VSL.

The second buffer 355_1 is provided between the DAC 232 and the auto-zero capacitor 311_2. The buffer 355_2 may be disposed in correspondence with each of the vertical signal lines VSL, or may be disposed in correspondence with a plurality of the vertical signal lines VSL.

The buffers 355_1 and 355_2 can hide loads of the ADC1 and the ADC2 from the DACs 231 and 232, respectively. Moreover, interference between a voltage kickback from each of the ADC1 and the ADC2 and the vertical signal line disposed adjacent to the ADC1 or the ADC2 with a transfer line of the reference signal interposed therebetween can be reduced.

Other configurations of the fifth embodiment may be similar to the corresponding configurations of the first embodiment. In this manner, advantageous effects similar to the advantageous effects of the first embodiment can be offered by the fifth embodiment. Moreover, the fifth embodiment may be combined with any one of the second to fourth embodiments. In this manner, advantageous effects similar to the advantageous effects of any one of the second to fourth embodiments can be offered by the fifth embodiment.

Sixth Embodiment

Figure 15:
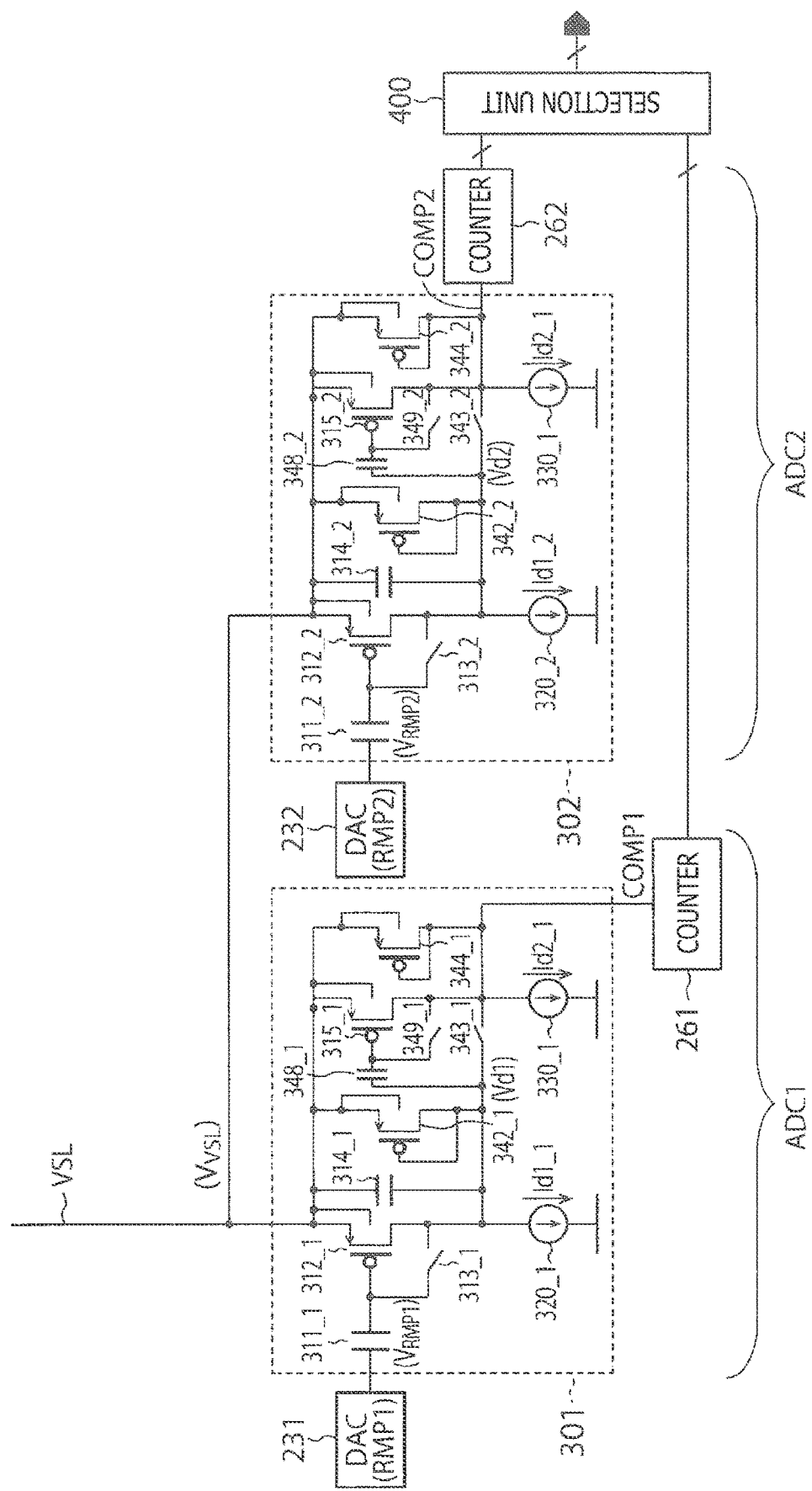
FIG. 15 is a circuit diagram depicting a configuration example of an ADC1 and an ADC2 according to a sixth embodiment of the present technology.

FIG. 15 is a circuit diagram depicting a configuration example of an ADC1 and an ADC2 according to a sixth embodiment of the present technology. The ADC1 and the ADC2 according to the sixth embodiment are different from the ADC1 and the ADC2 of the first embodiment in that capacitors 348_1 and 348_2 and auto-zero switches 349_1 and 349_2 are further provided, respectively.

The capacitor 348_1 as a fifth capacitor is provided between the drain of the input transistor 312_1 and the gate of the output transistor 315_1. The auto-zero switch 349_1 as a fifth switch is provided between the gate and the drain of the output transistor 315_1. The auto-zero switch 349_1 achieves short-circuiting between the gate and the drain of the output transistor 315_1, according to a control signal from the timing control unit 220.

Moreover, the initialization switch 343_1 opens and closes a path between the drain of the input transistor 312_1 and the drain of the output transistor 315_1, according to another control signal from the timing control unit 220.

The capacitor 348_2 as a sixth capacitor is provided between the drain of the input transistor 312_2 and the gate of the output transistor 315_2. The auto-zero switch 349_2 as a sixth switch is provided between the gate and the drain of the output transistor 315_2. The auto-zero switch 349_2 achieves short-circuiting between the gate and the drain of the output transistor 315_2, according to a control signal from the timing control unit 220.

Moreover, the initialization switch 343_2 opens and closes a path between the drain of the input transistor 312_2 and the drain of the output transistor 315_2, according to another control signal from the timing control unit 220.

According to the sixth embodiment, the auto-zero switches 349_1 and 349_2 are added to the output transistors 315_1 and 315_2, respectively. Accordingly, even in a case where the current sources 320_1, 330_1, 320_2, and 330_2 individually generate the currents Id1_1, Id2_1, Id1_2, and Id2_2, respectively, variations of these current values can be reduced.

Other configurations of the sixth embodiment may be similar to the corresponding configurations of the first embodiment. In this manner, advantageous effects similar to the advantageous effects of the first embodiment can be offered by the sixth embodiment. Moreover, the sixth embodiment may be combined with any one of the second to fifth embodiments. In this manner, advantageous effects similar to the advantageous effects of any one of the second to fifth embodiments can be offered by the sixth embodiment.

Seventh Embodiment

Figure 16:
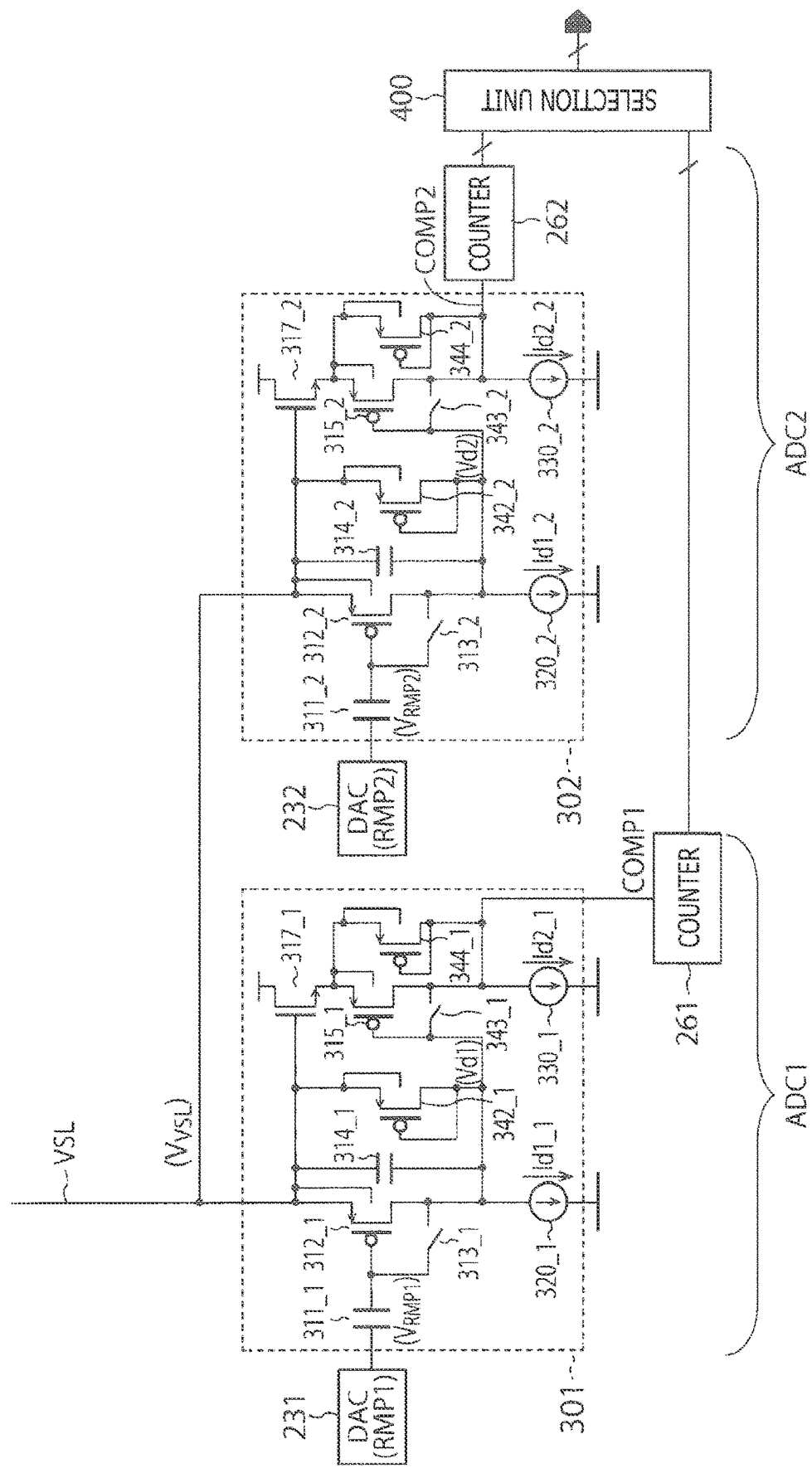
FIG. 16 is a circuit diagram depicting a configuration example of an ADC1 and an ADC2 according to a seventh embodiment of the present technology.

FIG. 16 is a circuit diagram depicting a configuration example of an ADC1 and an ADC2 according to a seventh embodiment of the present technology. The ADC1 and the ADC2 according to the seventh embodiment are different from the ADC1 and the ADC2 of the first embodiment in that buffer transistors 317_1 and 317_2 are further provided, respectively.

The buffer transistor 317_1 as a first buffer transistor is connected to the power source and the source of the output transistor 315_1. A gate of the buffer transistor 317_1 is connected to the source of the input transistor 312_1.

The buffer transistor 317_2 as a second buffer transistor is connected to the power source and the source of the output transistor 315_2. A gate of the buffer transistor 317_2 is connected to the source of the input transistor 312_2. The buffer transistors 317_1 and 317_2 can reduce propagation of a voltage kickback to the vertical signal line VSL during inversion of the drains of the output transistors 315_1 and 315_2 (COMP1 and COMP2).

Other configurations of the seventh embodiment may be similar to the corresponding configurations of the first embodiment. In this manner, advantageous effects similar to the advantageous effects of the first embodiment can be offered by the seventh embodiment. Moreover, the seventh embodiment may be combined with any one of the second to sixth embodiments. In this manner, advantageous effects similar to the advantageous effects of any one of the second to sixth embodiments can be offered by the seventh embodiment.

Eighth Embodiment

Figure 17:
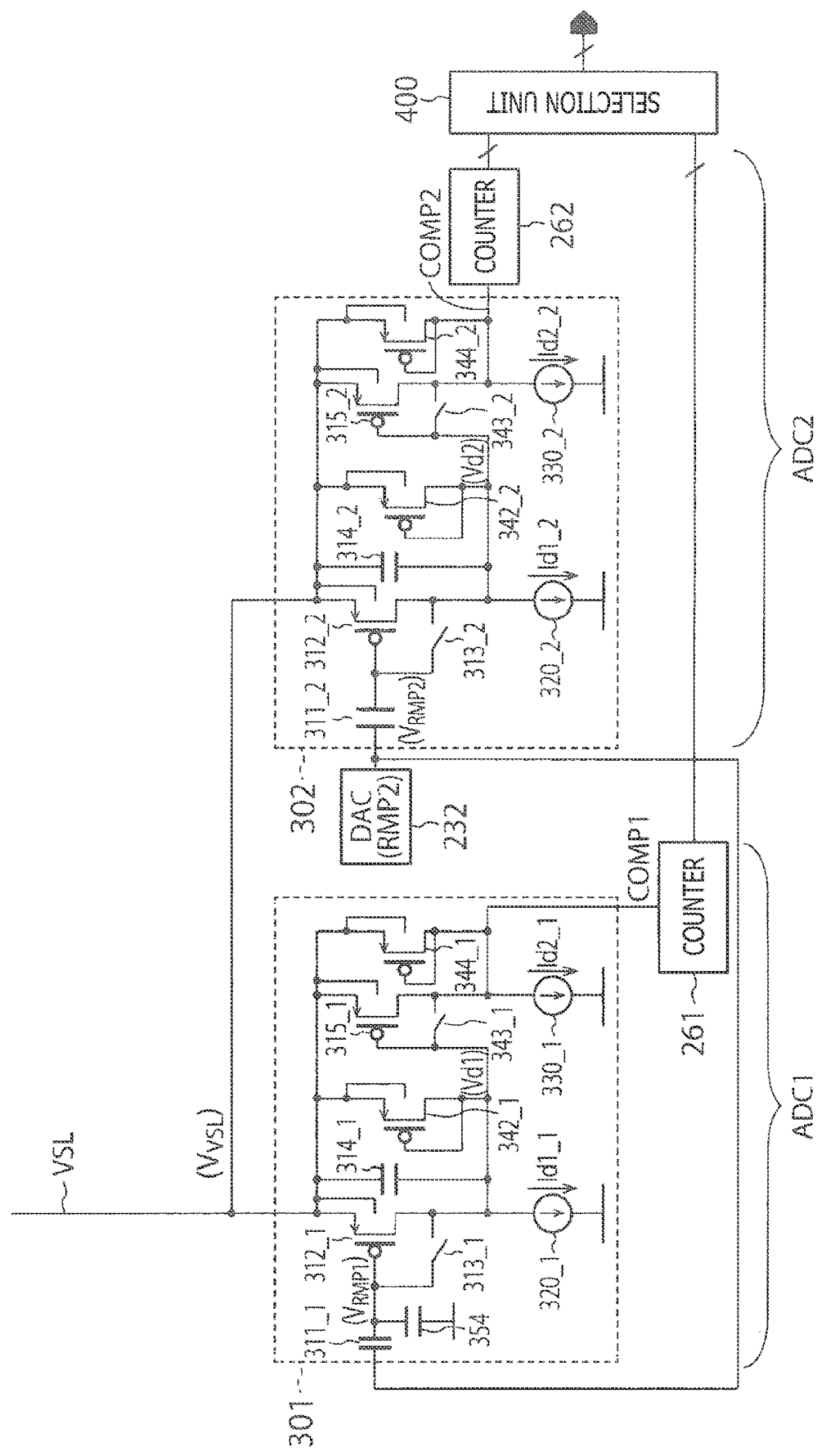
FIG. 17 is a circuit diagram depicting a configuration example of an ADC1 and an ADC2 according to an eighth embodiment of the present technology.

FIG. 17 is a circuit diagram depicting a configuration example of an ADC1 and an ADC2 according to an eighth embodiment of the present technology. The ADC1 and the ADC2 according to the eighth embodiment shares a DAC 232 as a common reference voltage supply unit. The DAC 1 is eliminated. The ADC1 receives input of the reference signal RMP1 generated by dividing the voltage of the reference signal RMP2. The ADC1 further includes the auto-zero capacitor 311_1 and a voltage dividing capacitor 354 to generate the reference signal RMP1 from the reference signal RMP2.

The auto-zero capacitor 311_1 is provided between the output of the DAC 232 and the gate of the input transistor 312_1. The voltage dividing capacitor 354 is connected to the gate of the input transistor 312_1 and a reference terminal.

The auto-zero capacitor 311_1 and the voltage dividing capacitor 354 divide the voltage of the common reference signal RMP2 to generate the reference signal RMP1, and inputs the reference signal RMP1 to the gate of the input transistor 312_1. The division ratio at this time is determined according to a capacitance ratio of the auto-zero capacitor 311_1 to the voltage dividing capacitor 354. For example, assuming that the ratio of a capacitance C311 of the auto-zero capacitor 311_1 to a capacitance C354 of the voltage dividing capacitor 354 (C311/C354) is ⅐, the slope of the reference voltage $V_{RMP1}$ becomes one eighth of the slope of the reference voltage $V_{RMP2}$. In other words, the ratio of a gain G1 of the ADC1 to a gain G2 of the ADC2 (G1/G2) becomes 8.

According to the eighth embodiment, the DAC 231 is allowed to be eliminated. Accordingly, the circuit scale of the ADC1 can be reduced, and the power consumption can be decreased.

Other configurations of the eighth embodiment may be similar to the corresponding configurations of the first embodiment. In this manner, advantageous effects similar to the advantageous effects of the first embodiment can be offered by the eighth embodiment. Moreover, the eighth embodiment may be combined with any one of the second to seventh embodiments. In this manner, advantageous effects similar to the advantageous effects of any one of the second to seventh embodiments can be offered by the eighth embodiment.

Ninth Embodiment

Figure 18:
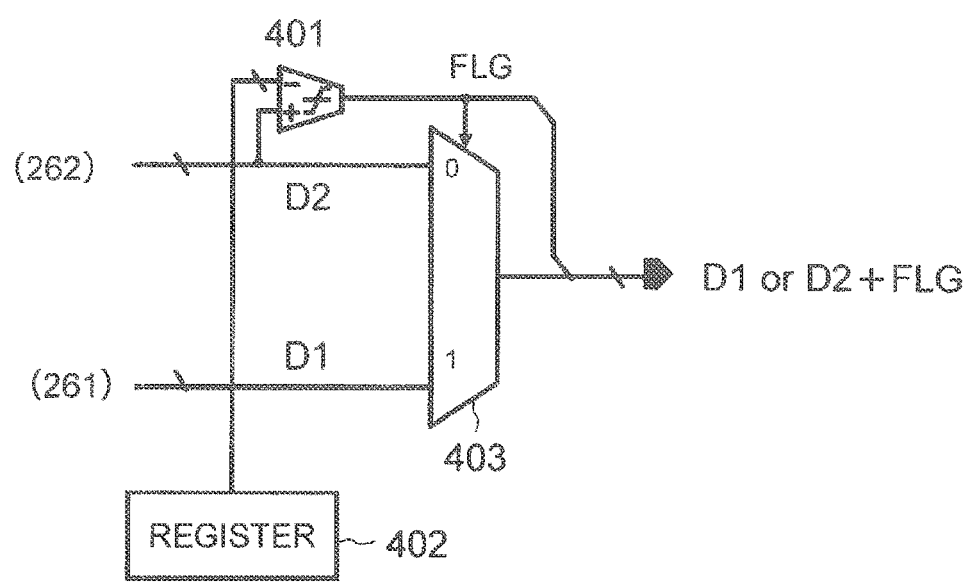
FIG. 18 is a circuit diagram depicting a configuration example of a selection unit according to a ninth embodiment of the present technology.

FIG. 18 is a circuit diagram depicting a configuration example of a selection unit 400 according to a ninth embodiment of the present technology. The selection unit 400 includes a digital comparator 401, a register 402, and a multiplexer 403.

The digital comparator 401 compares either one or both of the first and second digital signals D1 and D2 with a threshold to determine the magnitude of the input voltage $V_{VSL}$. The magnitude of the input voltage $V_{VSL}$ indicates brightness of an image. Accordingly, in a case where the first or second digital signal D1 or D2 is lower than the threshold, the image can be determined to be darker than predetermined brightness. In a case where the first or second digital signal D1 or D2 is equal to or higher than the threshold, the image can be determined to be brighter than the predetermined brightness.

A determination result is output to the multiplexer 403 as a flag FLG. For example, the flag FLG may be one-bit data. For example, in a case where the first or second digital signal D1 or D2 is lower than the threshold, the digital comparator 401 only needs to set the flag FLG to "1 (high level)." In a case where the first or second digital signal D1 or D2 is equal to or higher than the threshold, the digital comparator 401 only needs to set the flag FLG to "0 (low level)." In this manner, the multiplexer 403 can select either the first or second digital signal D1 or D2, according to the brightness of the image.

In FIG. 18, one input of the digital comparator 401 is connected to output of the counter 262 to receive input of the second digital signal D2. However, the digital comparator 401 may receive input of the first digital signal D1, and compare the first digital signal D1 with another threshold to determine the brightness of the image. The other input of the digital comparator 401 is connected to the register 402 to receive input of a predetermined threshold.

The register 402 stores the threshold of the first or second digital signal. The register 402 gives a threshold to the other input of the digital comparator 401.

The multiplexer 403 is configured to receive the first and second digital signals D1 and D2 from the counters 261 and 262, and select one of the first and second digital signals D1 and D2 according to the flag FLG. For example, in a case where the flag FLG is "1," the multiplexer 403 selects and outputs the first digital signal D1. In a case where the flag FLG is "0," the multiplexer 403 selects and outputs the second digital signal D2. The multiplexer 403 also outputs the flag FLG together with the digital signal D1 or D2. In this manner, the DSP circuit 120 disposed subsequently to the multiplexer 403 is allowed to recognize a gain during AD-conversion of the selected digital signal (D1 or D2). In a case where the first digital signal D1 is selected, the DSP circuit 120 only needs to convert the first digital signal D1 in reference to the slope ratio of the reference voltage $V_{RMP1}$ to the reference voltage $V_{RMP2}$ (the gain ratio of the ADC1 to the ADC2) to synthesize image data.

As described above, the selection unit 400 is capable of selectively outputting one digital signal from a plurality of digital signals AD-converted with different gains in reference to brightness of an image. Moreover, the selection unit 400 is capable of changing the gain of AD-conversion to any gain by setting a threshold. Other configurations of the ninth embodiment may be similar to the corresponding configurations of the first embodiment. In this manner, advantageous effects similar to the advantageous effects of the first embodiment can be offered by the ninth embodiment. Moreover, the ninth embodiment may be combined with any one of the second to eighth embodiments. In this manner, advantageous effects similar to the advantageous effects of any one of the second to eighth embodiments can be offered by the ninth embodiment.

Tenth Embodiment

Figure 19:
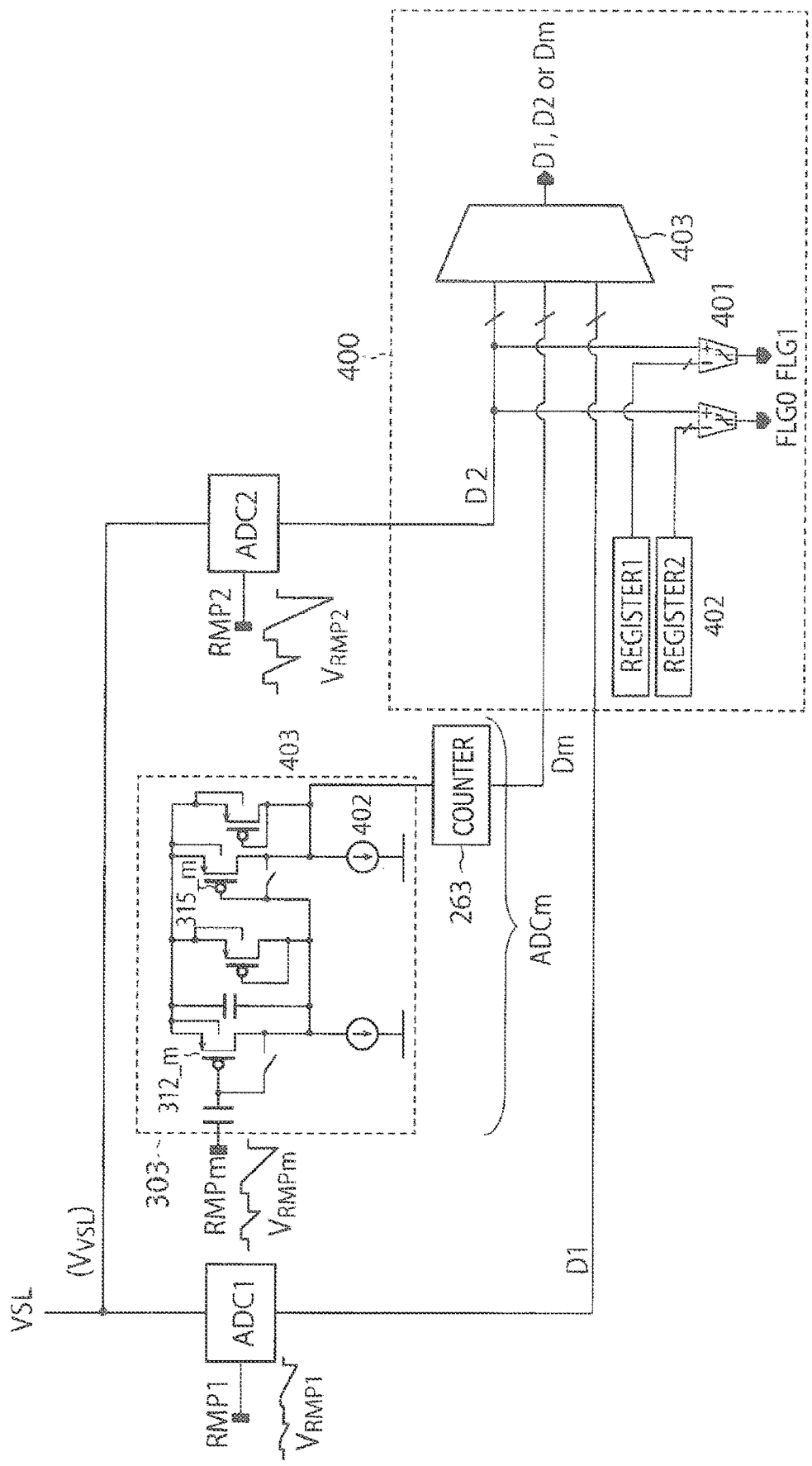
FIG. 19 is a circuit diagram depicting a configuration example of a solid-state imaging element according to a tenth embodiment of the present technology.

FIG. 19 is a circuit diagram depicting a configuration example of a solid-state imaging element according to a tenth embodiment of the present technology. The solid-state imaging element 200 according to the tenth embodiment includes ADCm as an AD converter in addition to the ADC1 and the ADC2. The ADCm has the same configuration as the configurations of the ADC1 and the ADC2. However, a slope of a reference voltage $V_{RMPm}$ of a reference signal RMPm to be received is different from the slopes of the reference voltages $V_{RMP1}$ and $V_{RMP2}$. The slope of the reference voltage $V_{RMPm}$ is steeper than that of the reference voltage $V_{RMP1}$ but gentler than that of the reference voltage $V_{RMP2}$. In other words, the gain of the ADCm is lower than the gain of the ADC1 but higher than the gain of the ADC2.

A comparator 303 of the ADCm includes an input transistor 312_m as a third input transistor and an output transistor 315_m as a third output transistor. The input transistor 312_m outputs a drain voltage corresponding to an input voltage, in reference to a voltage difference between the input voltage $V_{VSL}$ input to a source and the reference voltage $V_{RMPm}$ input to a gate.

The output transistor 315_m outputs the comparison result COMPm of comparison between the input voltage $V_{VSL}$ and the reference voltage $V_{RMPm}$ from a drain of the output transistor 315_m in reference to a voltage difference between the input voltage $V_{VSL}$ input to a source and a drain voltage of the input transistor 312_m input to a gate.

The counter 263 counts a period from a slope start of the reference voltage $V_{RMPm}$ to inversion of the comparison result COMPm, and outputs an intermediate digital signal Dm. In such a manner, the ADCm is capable of outputting the intermediate digital signal Dm AD-converted with an intermediate gain between the gains of the ADC1 and ADC2.

In a case where AD-conversion is achieved using only the ADC1 having a high gain and the ADC2 having a low gain, distortion (hereinafter also referred to as artifact) may be produced at a boundary of image regions corresponding to the first and second digital signals if the gain ratio of the ADC1 to the ADC2 (G1/G2) is excessively large.

For dealing with such a problem, the ADCm having an intermediate gain between the gains of the ADC1 and the ADC2 is further provided in the tenth embodiment. Artifact produced at a joint between image regions can be reduced by use of the three comparators ADC1, ADCm, and ADC2 having different gains.

The selection unit 400 in the tenth embodiment selects one digital signal from the three digital signals D1, D2, and Dm. For example, the register 402 stores a plurality of thresholds different from each other. The digital comparator 401 compares at least one of the digital signals D1, D2, and Dm with a plurality of thresholds, and outputs flags FLG1 and FLG2 (two-bit data) as a comparison result. For example, in a case where the digital signal is lower than all of the plurality of thresholds, the digital comparator 401 sets the FLG1 to "0" and the FLG2 to "0." In a case where the digital signal is equal to or higher than the plurality of thresholds, the digital comparator 401 sets the FLG1 to "1" and the FLG2 to "1," for example. In a case where the digital signal lies at an intermediate value between the plurality of thresholds, the digital comparator 401 sets the FLG1 to "0" and the FLG2 to "1," for example.

The multiplexer 403 is configured to receive the digital signals D1, D2, and Dm from the ADC1, ADC2, and ADCm, and select one of the digital signals D1, D2, and Dm according to the flags FLG1 and FLG2. For example, in a case where both the flags FLG1 and FLG2 are "0," the multiplexer 403 selects and outputs the digital signal D1 converted with a high gain. In a case where both the flags FLG1 and FLG2 are "1," the multiplexer 403 selects and outputs the digital signal D2 converted with a low gain. In a case where the flag FLG1 and the flag FLG2 are "0" and "1," respectively, the multiplexer 403 selects and outputs the digital signal Dm converted with an intermediate gain. The multiplexer 403 also outputs 2-bit data regarding the flags FLG1 and FLG2 together with the digital signals D1, D2, and Dm. In this manner, the DSP circuit 120 is allowed to recognize the gain during AD-conversion of the selected digital signal (D1, D2, or Dm). The DSP circuit 120 converts the selected digital signal in reference to the slope ratio of the reference voltage $V_{RMP1}$, $V_{RMP2}$, and $V_{RMPm}$ (the gain ratio of the ADC1, the ADC2, and the ADCm) to synthesize image data.

Figure 20:
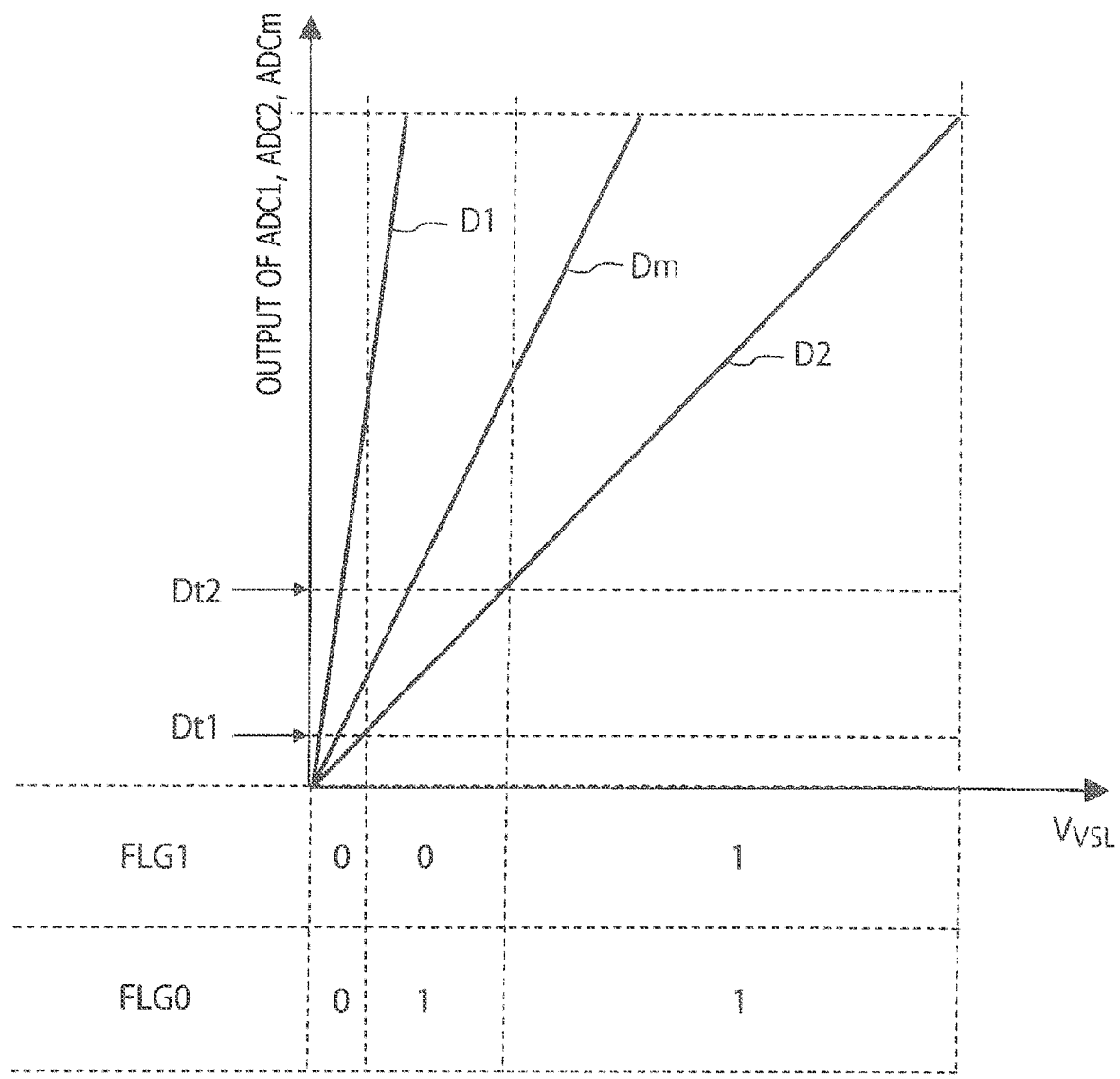
FIG. 20 is a graph representing one example of a relation between an input voltage and an output value of each of the ADC1, the ADC2, and an ADCm according to the tenth embodiment.

FIG. 20 is a graph representing one example of a relation between the input voltage $V_{VSL}$ of the ADC1, the ADC2, and the ADCm and the output values (digital signals D1, D2, and Dm) according to the tenth embodiment. A horizontal axis of this graph represents the input voltage $V_{VSL}$. A vertical axis represents the digital signals D1, D2, and Dm.

According to the tenth embodiment, the digital comparator 401 compares the digital signal D2 with first and second thresholds Dt1 and Dt2 to determine the flags FLG1 and FLG2. However, the digital comparator 401 may determine the flags FLG1 and FLG2 by using any one of the digital signals D1, D2, and Dm. The digital comparator 401 may determine the flags FLG1 and FLG2 by using any two or all of the digital signals D1, D2, and Dm.

In a case where the digital signal D2 is lower than the first threshold Dt1 in a dark image, the digital comparator 401 outputs "0" and "0" as the flag FLG1 and the flag FLG2, respectively. In this case, the multiplexer 403 selects the digital signal D1 converted with a high gain. The DSP circuit 120 converts (compresses) data regarding the digital signal D1 in reference to the gain ratio of the ADC1 to the ADC2 to match the gain of the digital signal D1 with the gain of the digital signal D2. This conversion process has already been described with reference to FIG. 10.

In a case where the digital signal D2 lies between the first threshold Dt1 and the second threshold Dt2 in an image having intermediate brightness, the digital comparator 401 outputs "0" and "1" as the flag FLG1 and the flag FLG2, respectively. In this case, the multiplexer 403 selects the digital signal Dm converted with an intermediate gain. The DSP circuit 120 converts (compresses) data regarding the digital signal Dm in reference to the gain ratio of the ADCm to the ADC2 to match the gain of the digital signal Dm with the gain of the digital signal D2. This conversion process has also already been described with reference to FIG. 10.

In a case where the digital signal D2 is equal to or higher than the second threshold Dt2 in a bright image, the digital comparator 401 outputs "1" and "1" as the flag FLG1 and the flag FLG2, respectively. In this case, the multiplexer 403 selects the digital signal D2 converted with a low gain. The DSP circuit 120 need not compress the digital signal D2.

In such a manner, the gains of the digital signals D1, D2, and Dm are matched with each other. Accordingly, the DSP 120 is allowed to form one image.

Note that the DSP circuit 120 performs gain ratio-based conversion on the digital signals D1 and Dm with reference to the digital signal D2. However, the DSP circuit 120 may convert the other two digital signals with reference to the digital signal D1 or Dm. Moreover, a correspondence between the flags FLG1 and FLG2 and the selected digital signal is not limited to the correspondence described in the embodiment, and may be changed to a different setting as necessary.

As described above, the ADCm having an intermediate gain between the gains of the ADC1 and the ADC2 is further provided in the tenth embodiment. Accordingly, artifact at the joint of the image regions can be reduced. Other configurations of the tenth embodiment may be similar to the corresponding configurations of the first embodiment. Accordingly, advantageous effects similar to the advantageous effects of the first embodiment can be offered by the tenth embodiment. Moreover, the tenth embodiment may be combined with any one of the second to eighth embodiments. In this manner, advantageous effects similar to the advantageous effects of any one of the second to eighth embodiments can be offered by the tenth embodiment.

Eleventh Embodiment

Figure 21:
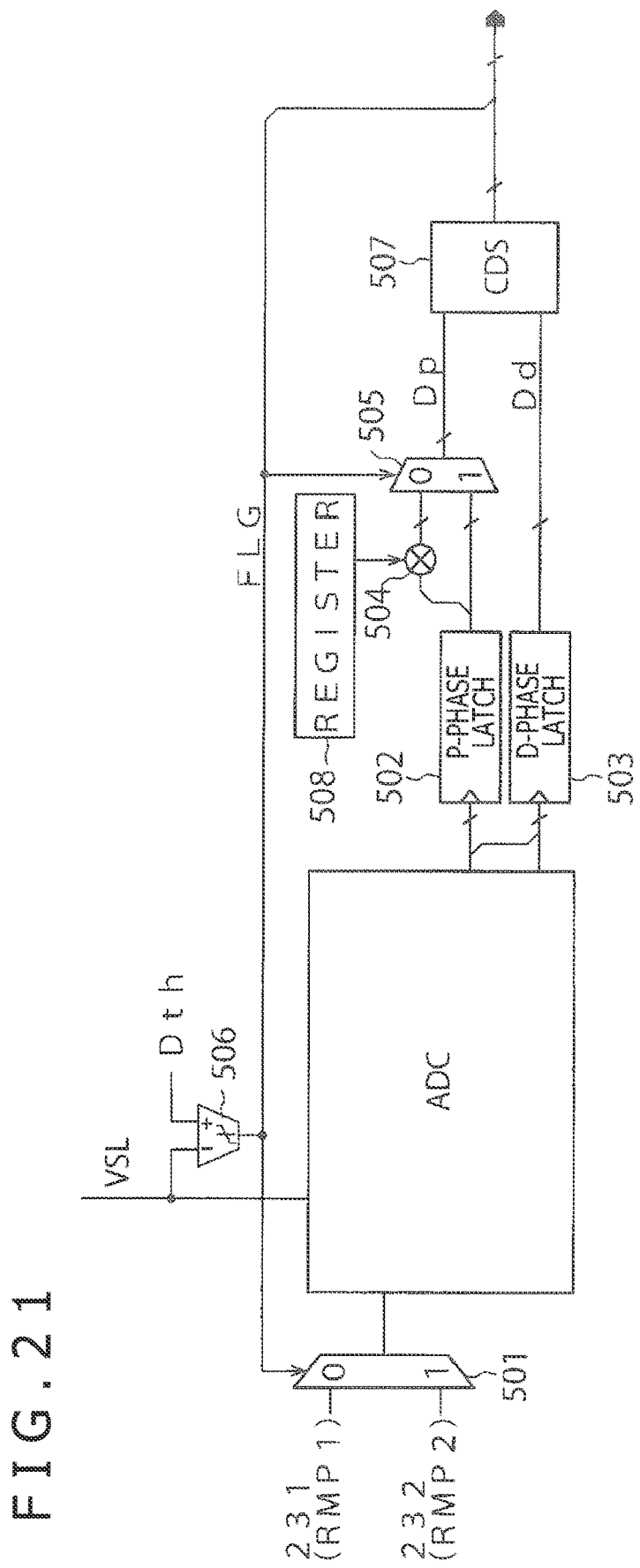
FIG. 21 is a circuit diagram depicting a configuration example of an ADC and peripheral circuits according to an eleventh embodiment of the present disclosure.

FIG. 21 is a circuit diagram depicting a configuration example of the ADC and peripheral circuits according to an eleventh embodiment of the present disclosure. According to the eleventh embodiment, the multiplexer 501 selectively supplies either the reference signal RMP1 or the reference signal RMP2 to an ADC, according to the flag FLG received from a comparator 506. The comparator 506 determines the flag FLG beforehand in reference to the voltage level of the input voltage $V_{VSL}$(analog value). Accordingly, the comparator 506 is capable of determining a reference signal (gain of ADC) immediately before the ADC AD-converts the D-phase of a pixel signal. Accordingly, only one ADC is required to be equipped in the eleventh embodiment.

However, at the time of AD-conversion of a P-phase of the pixel signal, the P-phase is AD-converted with use of the reference signal RMP1 having a high gain because the level of the D-phase is unknown. Note that the P-phase is a pixel signal indicating a reset level and that the P-phase digital signal is a digital signal obtained by AD-conversion of the P-phase. The D-phase is a pixel signal indicating a signal level, while the D-phase digital signal is a digital signal obtained by AD-conversion of the D-phase.

The solid-state imaging element 200 according to the eleventh embodiment includes one ADC, a multiplexer 501, a P-phase latch 502, a D-phase latch 503, a calculation unit 504, a multiplexer 505, the comparator 506, a CDS circuit 507, and a register 508.

The multiplexer 501 receives the reference signal RMP1 from the DAC 231, receives the reference signal RMP2 from the DAC 232, and supplies either the reference signal RMP1 or the reference signal RMP2 to the ADC in reference to the flag FLG.

The ADC may have the same configuration as that of the ADC 1 or the ADC2 of the first embodiment. As described above, the ADC performs AD-conversion using the reference signal RMP1 having a high gain at the time of AD-conversion of the P-phase. At the time of AD-conversion of the D-phase subsequently performed, the flag FLG has already been determined in reference to the signal level of the input voltage $V_{VSL}$. Accordingly, the ADC performs AD-conversion of the D-phase by using the reference signal RMP1 or RMP2 determined in reference to the flag FLG.

The P-phase latch 502 latches a P-phase digital signal AD-converted by the ADC. The D-phase latch 503 latches a D-phase digital signal AD-converted by the ADC.

The calculation unit 504 receives the P-phase signal from the P-phase latch, and multiplies or divides the P-phase digital signal by a predetermined value stored in the register 508. The predetermined value stored in the register 508 is a value corresponding to a gain of the ADC. For example, in a case where the gain of the ADC using the reference signal RMP1 is eight times higher than the gain of the ADC using the reference signal RMP2 as in the first embodiment, the register 508 stores 8 or one eighth as the predetermined value. In this case, the register 508 outputs 8 or one eighth to the calculation unit 504. The calculation unit 504 multiplies the P-phase digital signal by one eighth, or divides the P-phase digital signal by 8. Specifically, the calculation unit 504 converts (compresses) the P-phase digital signal according to the gain of the ADC.

The multiplexer 505 receives the converted P-phase digital signal from calculation unit 504, and receives the P-phase digital signal not converted from the P-phase latch 502. Thereafter, the multiplexer 505 selects either the converted P-phase digital signal or the not-converted P-phase digital signal in reference to the flag FLG, and outputs the selected signal to the CDS circuit 507.

The CDS 507 receives a P-phase digital signal Dp and a D-phase digital signal Dd from the multiplexer 505, and performs CDS processing for the received signals. The CDS circuit 507 outputs the CDS-processed digital signal together with the flag FLG.

Figure 22:
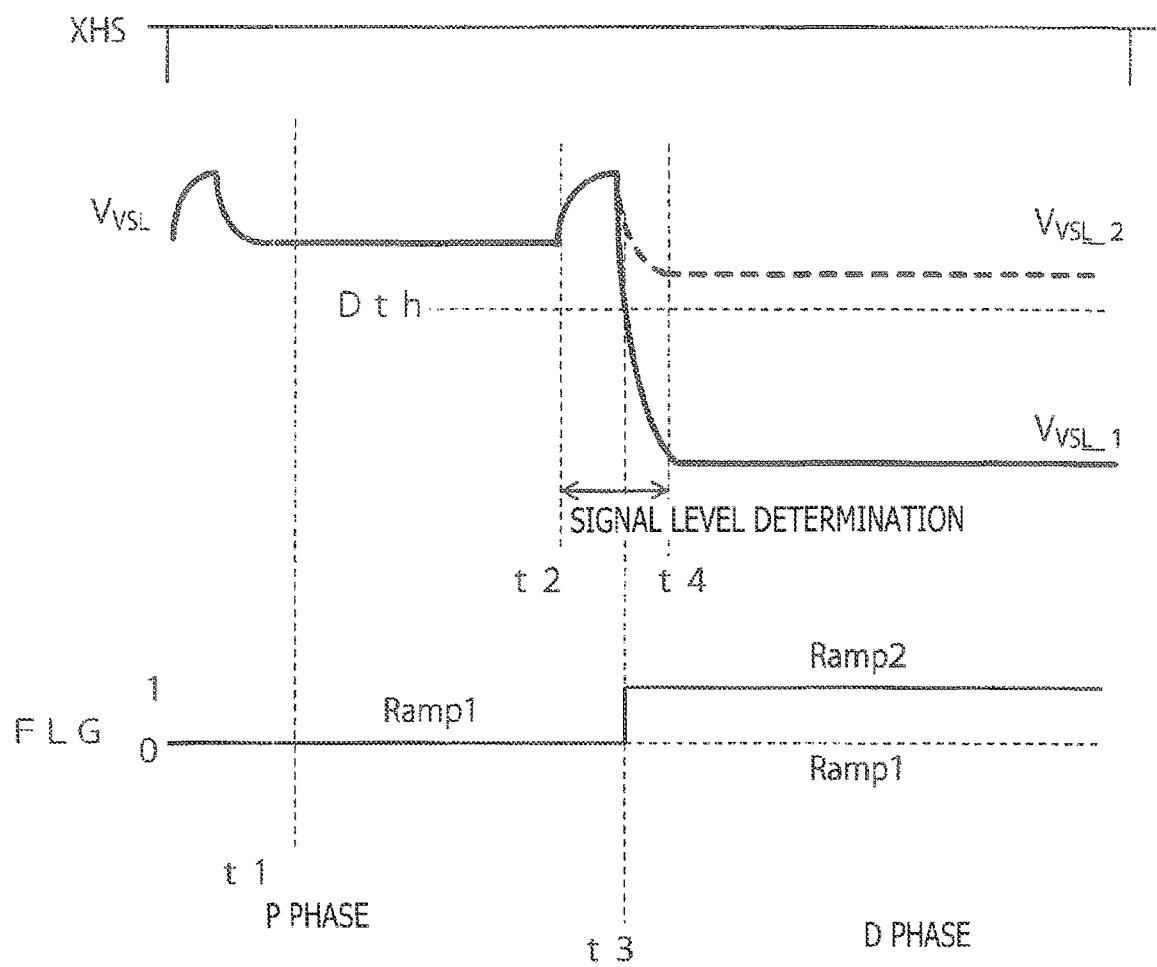
FIG. 22 is a timing chart presenting an operation example of the ADC according to the eleventh embodiment.

FIG. 22 is a timing chart presenting an operation example of an ADC according to the eleventh embodiment. FIG. 22 indicates a voltage level of the input voltage $V_{VSL}$ and the flag FLG. The flag FLG corresponds to each of the reference signals RMP1 and RMP2. Note that voltage levels of the reference signals RMP1 and RMP2 are not depicted in the figure.

For example, AD-conversion of the P-phase starts at timing t1. At this time, the signal level (level of D-phase) is unknown. Accordingly, the reference signal RMP1 having a high gain is selected. In other words, the comparator 506 sets the flag FLG to "0."

The AD-converted P-phase digital signal is latched by the P-phase latch 502. The P-phase digital signal is calculated and subjected to gain conversion by the calculation unit 504. The multiplexer 505 receives the converted P-phase digital signal from the calculation unit 504, and receives the P-phase digital signal not converted from the P-phase latch 502.

The signal level (D-phase) is transmitted to the vertical signal line VSL during a period from t2 to t4. The signal level is determined in this period. For example, in a case where the signal level is $V_{VSL\_1}$, the signal level becomes lower than a threshold Dth at timing t3. In this case, the comparator 506 compares the threshold Dth with the signal level $V_{VSL}$, and sets the flag FLG to "1." As a result, an image is determined to be bright, and the multiplexer 501 selects the reference signal RMP2 having a low gain. On the other hand, in a case where the signal level is $V_{VSL\_2}$, the signal level is higher than the threshold Dth in the period from t2 to t4. In this case, the comparator 506 compares the threshold Dth with the signal level $V_{VSL}$, and sets the flag FLG to "0." As a result, an image is determined to be dark, and the multiplexer 501 selects the reference signal RMP1 having a high gain.

At the timing t4 and after, the ADC performs AD-conversion of the D-phase by using the reference signal RMP1 or RMP2 selected by the multiplexer 501.

On the other hand, after the flag FLG is determined, the multiplexer 505 outputs either the converted P-phase digital signal or the not-converted P-phase digital signal according to the flag FLG. For example, in a case where the flag FLG is "1," the multiplexer 505 outputs the converted (compressed) P-phase digital signal to the CDS circuit 507 to match the gain of the P-phase with the gain of the D-phase (low gain). In a case where the flag FLG is "0," the multiplexer 505 outputs the not-converted P-phase digital signal to the CDS circuit 507 to match the gain of the P phase with the gain of the D-phase (high gain). In this manner, the CDS circuit 507 is capable of performing CDS processing in an appropriate manner.

The CDS-processed digital signal may be so converted as to match with a gain of other pixel data. In this manner, the digital signal can be synthesized into one image.

According to the eleventh embodiment, as described above, the flag FLG is determined beforehand in reference to the voltage level of the D-phase input voltage $V_{VSL}$ (analog value). In addition, the reference signal is determined immediately before AD-conversion of the D-phase of the pixel signal by the ADC. In this manner, the solid-state imaging element 200 is capable of generating digital signals AD-converted with different gains, by using one ADC.

Twelfth Embodiment

FIG. 23 is a circuit diagram depicting a configuration example of an ADC and peripheral circuits according to a twelfth embodiment of the present disclosure. According to the twelfth embodiment, the comparator 506 is eliminated, and a latch 509 is provided. The latch 509 is provided between the output of a comparator 304 and the outputs of the multiplexers 501 and 505 and the CDS 507. Other configurations of the twelfth embodiment may be similar to the corresponding configurations of the eleventh embodiment.

The latch 509 latches a comparison result COMP4 of the comparator 304 for a level determination period, and outputs the latched comparison result COMP4 to the multiplexers 501 and 505 and the CDS 507, as the flag FLG.

Figure 24:
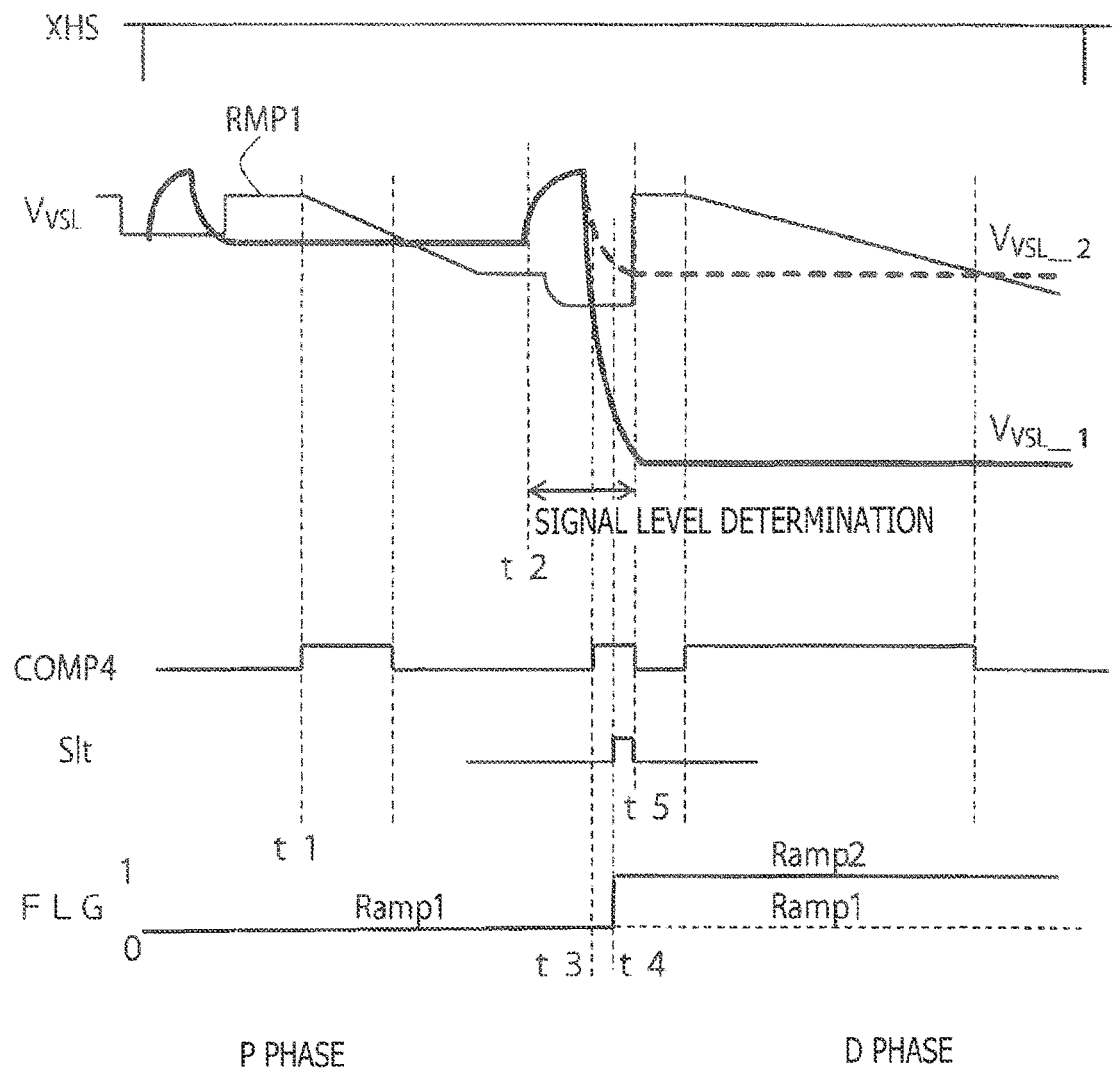
FIG. 24 is a timing chart presenting an operation example of the ADC according to the twelfth embodiment.

FIG. 24 is a timing chart presenting an operation example of the ADC according to the twelfth embodiment. FIG. 24 indicates the reference signal RMP1 overlapped on the voltage level of the input voltage $V_{VSL}$ for convenience.

Moreover, FIG. 24 additionally indicates the comparison result COMP4 and a latch timing signal S1t as well as the flag FLG.

For example, AD-conversion of the P-phase starts at timing t1. The AD-conversion process for the P-phase may be similar to the corresponding process of the eleventh embodiment.

The signal level (D-phase) is transmitted to the vertical signal line VSL during a period from t2 to t5. The signal level is determined in this period. According to the twelfth embodiment here, Dth is not set. The latch 509 sets the flag FLG by using inversion of the comparison result COMP4 obtained by the comparator 304. In other words, according to the twelfth embodiment, the signal level is determined using the reference signal RMP1 as a threshold. For example, in a case where the signal level is $V_{VSL\_1}$, the signal level $V_{VSL\_1}$, becomes lower than the reference signal RMP1 at timing t3. As a result, the comparison result COMP4 obtained by the comparator 304 is inverted and becomes "1 (high level)." At timing t4, the latch 509 latches the comparison result COMP4, and the flag FLG thus becomes "1." As a result, an image is determined to be bright, and the multiplexer 501 selects the reference signal RMP2 having a low gain.

On the other hand, in a case where the signal level is $V_{VSL\_2}$, a signal level $V_{VSL\_1}$ is higher than the reference signal RMP1 in the period from t2 to t5. As a result, the comparison result COMP4 obtained by the comparator 304 is not inverted and kept at "0 (low level)." At the timing t4, the latch 509 latches the comparison result COMP4, and the flag FLG thus becomes "0." As a result, an image is determined to be dark, and the multiplexer 501 selects the reference signal RMP1 having a high gain.

As described above, the latch 509 may be provided in place of the comparator 506 to determine the signal level by using the comparison result COMP1 obtained by the comparator 304.

Other configurations and operations of the twelfth embodiment may be similar to the corresponding configurations and operations of the eleventh embodiment. In this manner, advantageous effects similar to the advantageous effects of the eleventh embodiment can be offered by the twelfth embodiment.

(Modification 1)

Figure 25:
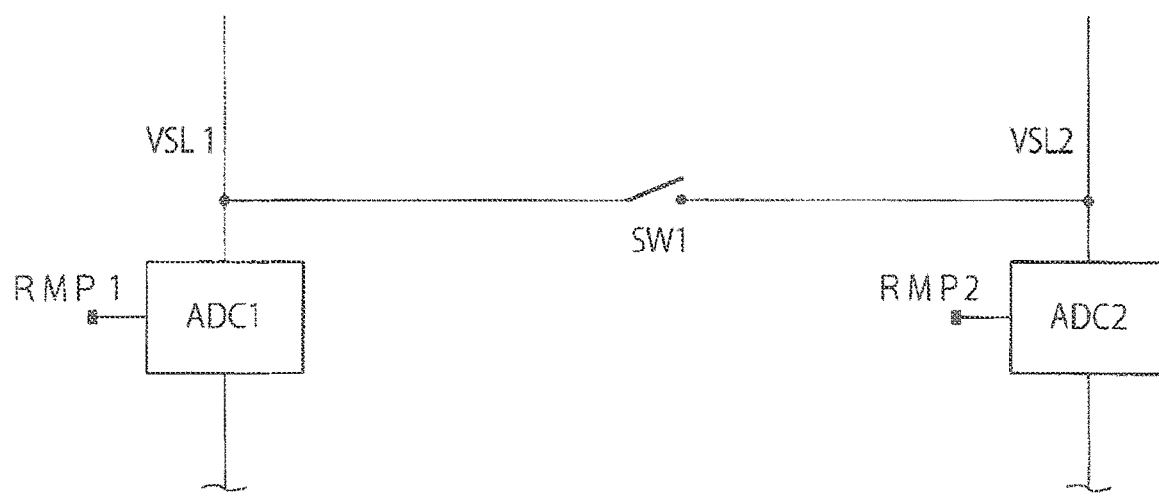
FIG. 25 is a circuit diagram depicting a configuration example of an ADC1, an ADC2, and peripheral circuits according to modification 1 of the present disclosure.

FIG. 25 is a circuit diagram depicting a configuration example of an ADC1, an ADC2, and peripheral circuits according to modification 1 of the present disclosure. In the present modification, the ADC1 and the ADC2 are provided in correspondence with vertical signal lines VSL1 and VSL2, respectively. A switch SW1 is provided between the vertical signal lines VSL1 and VSL2. The switch SW1 is switched by the timing control unit 220.

In a state where the switch SW1 is turned on, the ADC 1 and the ADC2 are allowed to perform AD-conversion of pixel signals on either the vertical signal line VSL1 or VSL2 in the manner described in the above embodiments. In this case, the advantageous effects of the above embodiments can be produced.

On the other hand, in a state where the switch SW1 is turned off, the ADC 1 and the ADC2 perform AD-conversion of pixel signals on the vertical signal lines VSL1 and VSL2, respectively. In this case, each of the ADC1 and the ADC2 performs AD-conversion using one gain. Accordingly, image quality lowers in a dark image region, but simultaneous AD-conversion of two pixels is achievable.

(Modification 2)

FIG. 26 is a circuit diagram depicting a configuration example of ADCs and peripheral circuits according to modification 2 of the present disclosure. In the present modification, an ADC1_1 and an ADC2_-1 are provided in correspondence with the one vertical signal line VSL1. Similarly, an ADC1_2 and an ADC2_2 are provided in correspondence with the one vertical signal line VSL2. The switch SW1 is provided between inputs of the ADC1_1 and the ADC2_1. The switch SW1 is also provided between inputs of the ADC1_2 and the ADC2_2. Moreover, a switch SW2 is provided between the input of the ADC2_1 and the adjoining vertical signal line VSL2. The switches SW1 and SW2 are switched by the timing control unit 220.

According to the present modification, an adder circuit ADD1 is provided between outputs of the ADC1_1 and the ADC2_1. The adder circuit ADD1 can add digital signals received from the ADC1_1 and ADC2_1 with predetermined weights. An adder circuit ADD2 is provided between outputs of the ADC1_2 and the ADC2_2. The adder circuit ADD2 can add digital signals received from the ADC1_2 and ADC2_2 with predetermined weights.

In a state where the switch SW1 and the switch SW2 are turned on and off, respectively, the ADC1_1 and the ADC2_1 are allowed to perform AD-conversion of a pixel signal on the vertical signal line VSL1 in the manner described in the above embodiments. The ADC1_2 and the ADC2_2 are allowed to perform AD-conversion of a pixel signal on the vertical signal line VSL2 in the manner described in the above embodiments. In this case, the advantageous effects of the above embodiments can be produced.

On the other hand, in a state where the switch SW1 and the switch SW2 are turned off and on, respectively, the ADC1_1 and the ADC2_1 are allowed to perform AD-conversion of two pixel signals received from the vertical signal lines VSL1 and VSL2, and achieve weighting addition. Weighting can be set using the slopes of the reference signals RMP1 and RMP2 (gains of ADC1 and ADC2). Any weighting can be set for each of the first and second digital signals by changing the gains of the ADC1 and the ADC2.

In addition, when the ADC1_1 and the ADC2_1 perform AD-conversion of pixel signals of two pixels received from the vertical signal lines VSL1 and VSL2, respectively, and achieve weighting addition, the ADC1_2 and the ADC2_2 adjacent to the ADC1_1 and the ADC2_1 are turned off.

(Layout Arrangement)

Figure 27A:
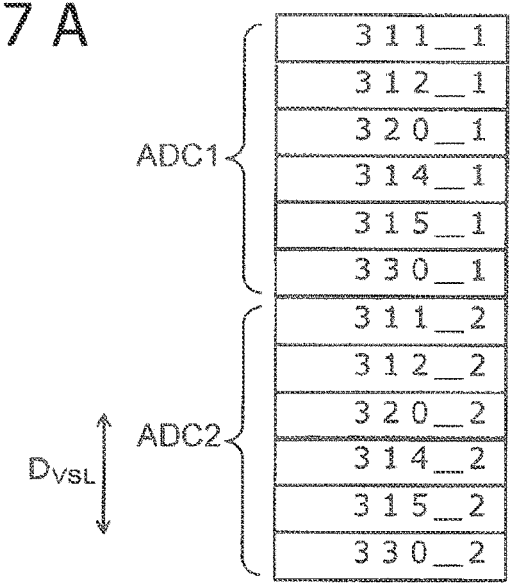
FIG. 27A is a schematic diagram depicting a layout arrangement of the ADC1 and the ADC2 of the present disclosure.
Figure 27B:
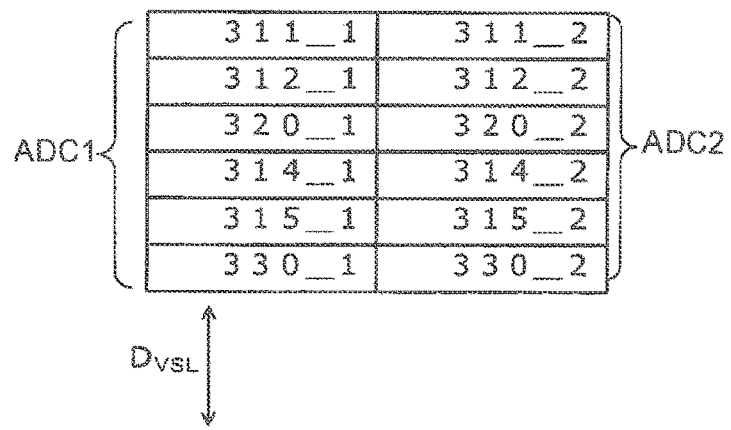
FIG. 27B is a schematic diagram depicting a layout arrangement of the ADC1 and the ADC2 of the present disclosure.
Figure 27C:
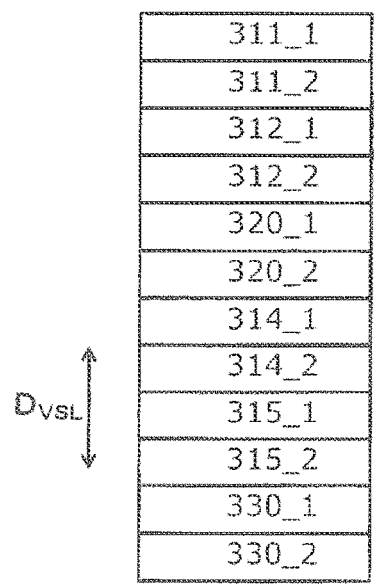
FIG. 27C is a schematic diagram depicting a layout arrangement of the ADC1 and the ADC2 of the present disclosure.

Each of FIGS. 27A to 27C is a schematic diagram depicting a layout arrangement of the ADC1 and the ADC2 of the present disclosure. The respective constituent elements of the ADC1 and the ADC2 in FIGS. 27A to 27C may be switched to each other.

The ADC1 and the ADC2 in FIG. 27A are arranged such that the respective constituent elements are gathered for each gain. The ADC1 and the ADC2 are arranged in the longitudinal direction along an extension direction $D_{VSL}$ of the vertical signal line VSL. In this manner, the layout arrangement of the ADC1 and the ADC2 can easily be defined. Moreover, the ADC1 and the ADC2 are disposed in the extension direction $D_{VSL}$. Accordingly, an interval (pitch) between adjoining pixel rows can be reduced.

The ADC1 and the ADC2 in FIG. 27B are arranged in a manner similar to the manner of the arrangement in FIG. 27A in the point that the respective constituent elements are gathered for each gain. However, the ADC1 and the ADC2 in FIG. 27B are arranged in the lateral direction substantially perpendicular to the extension direction DVS, of the vertical signal line VSL. In this manner, the layout arrangement of the ADC1 and the ADC2 can easily be defined. The layout depicted in FIG. 27B may be adopted in a case where a sufficient interval between the adjoining pixel columns is given.

The ADC1 and the ADC2 in FIG. 27C are arranged in a manner similar to the manner of the arrangement in FIG. 27A in the point that the respective constituent elements are arranged in the longitudinal direction along the extension direction $D_{VSL}$ of the vertical signal line VSL. However, the ADC1 and the ADC2 in FIG. 27C are arranged such that the same types of the constituent elements of the ADC1 and the ADC2 are alternately disposed. For example, the input transistor 312_1 of the ADC1 and the input transistor 312_2 of the ADC2 are arranged adjacent to each other. The output transistor 315_1 of the ADC1 and the output transistor 315_2 of the ADC2 are arranged adjacent to each other. Other constituent elements are similarly arranged such that the constituent elements of the same type are disposed adjacent to each other. By arranging the constituent elements of the same type adjacent to each other as described above, matching of characteristics between the constituent elements (semiconductor elements) improves, and mask designing, processing, and the like are facilitated.

Figure 28A:
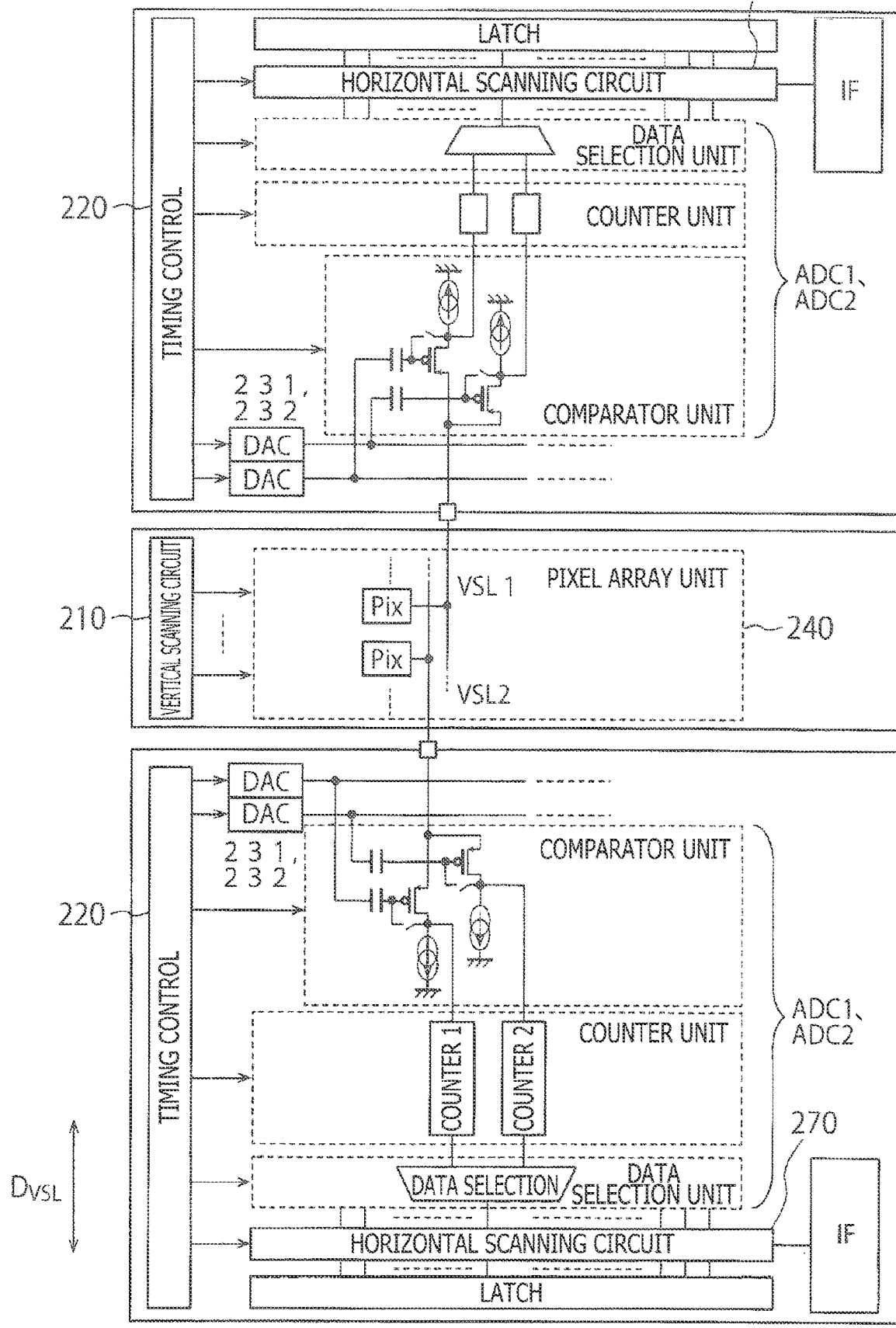
FIG. 28A is a schematic diagram depicting a layout arrangement of the solid-state imaging element of the present disclosure.
Figure 28B:
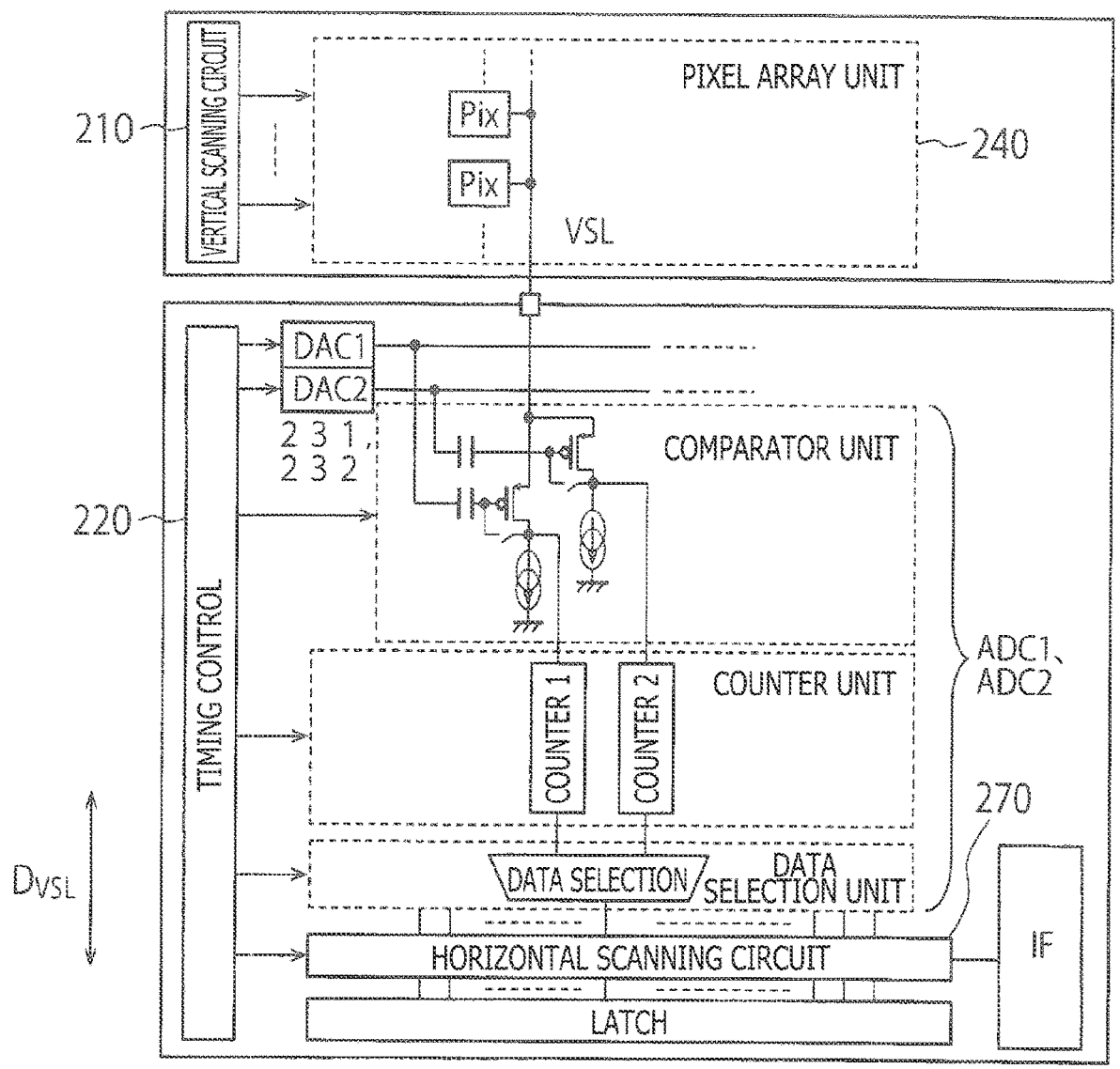
FIG. 28B is a schematic diagram depicting a layout arrangement of the solid-state imaging element of the present disclosure.

Each of FIGS. 28A and 28B is a schematic diagram depicting a layout arrangement of the solid-state imaging element 200 of the present disclosure. A peripheral circuit including the ADC1 and the ADC 2 in FIG. 28A is disposed on both sides of the pixel array unit 240 in the extension direction $D_{VSL}$ of the vertical signal line VSL. In this case, a plurality of the vertical signal lines VSL1 and VSL2 are provided for one pixel column. Pixels on this pixel column are connected to one of the plurality of vertical signal lines VSL1 and VSL2. The vertical signal line VSL1 is connected to the ADC1 and the ADC2 disposed on one side, while the vertical signal line VSL2 is connected to the ADC1 and the ADC2 disposed on the other side. In such an arrangement, two pixel signals on the pixel column can simultaneously be AD-converted.

A peripheral circuit including the ADC1 and the ADC 2 in FIG. 28B is disposed on one side of the pixel array unit 240 in the extension direction $D_{VSL}$ of the vertical signal line VSL. In this case, the one vertical signal line VSL is provided for one pixel column. According to this arrangement, pixel signals on this pixel column are AD-converted for each pixel signal. However, the layout area of the peripheral circuit decreases.

The layout arrangements described above are presented only by way of example. The arrangement of the solid-state imaging element 200 of the present disclosure is not limited to these examples.

<14. Examples of Application to Mobile Body>

The technology according to the present disclosure (present technology) is applicable to various types of products. For example, the technology according to the present disclosure may be implemented as a device mounted on any type of mobile body, such as a car, an electric car, a hybrid electric car, a motorcycle, a bicycle, a personal mobility, an airplane, a drone, a vessel, and a robot.

Figure 29:
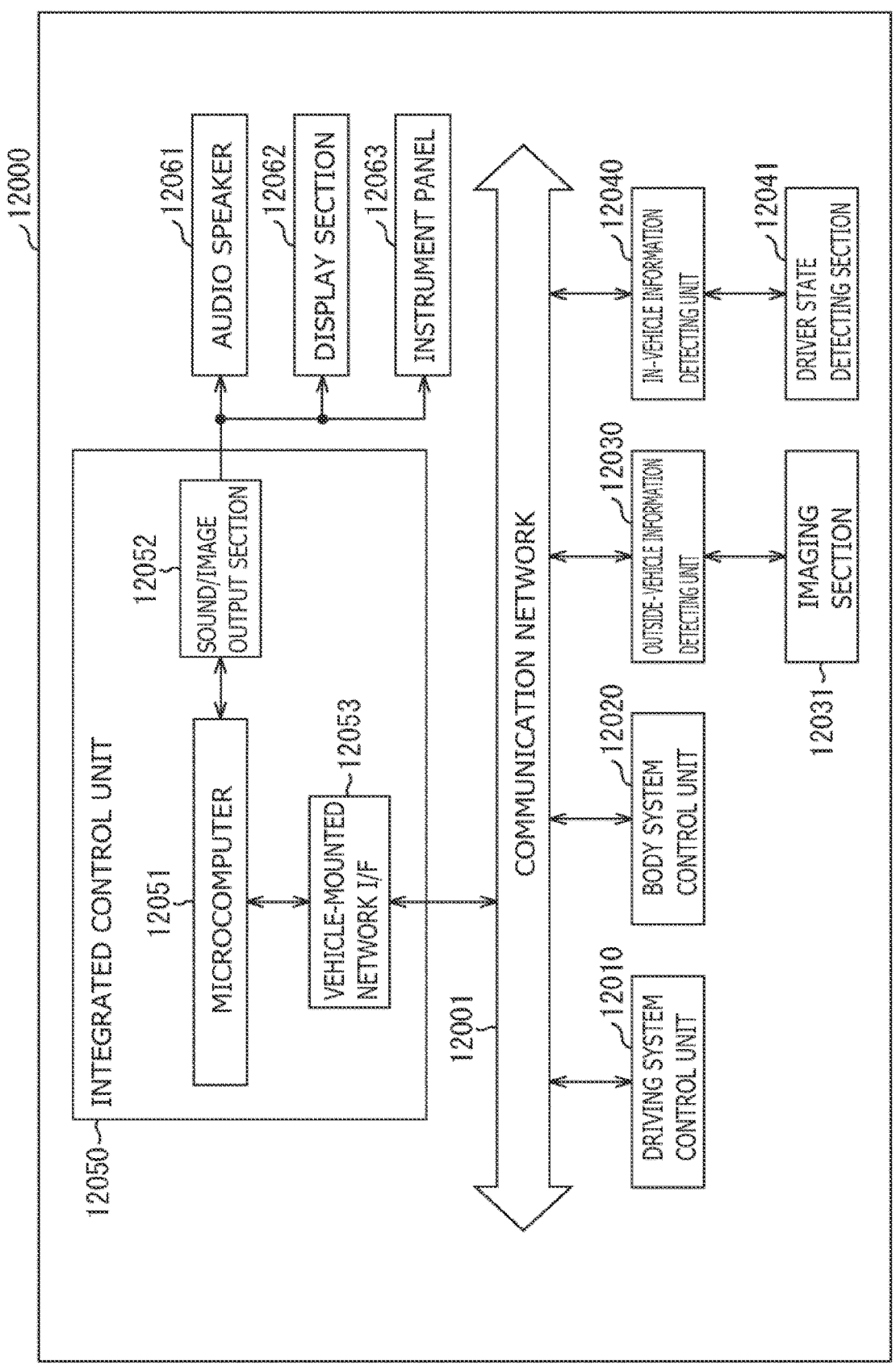
FIG. 29 is a block diagram depicting an example of schematic configuration of a vehicle control system.

FIG. 29 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 29, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 29, an audio speaker 12061, a display section 12062, and an instrument panel 12063 are illustrated as the output device. The display section 12062 may, for example, include at least one of an on-board display and a head-up display.

Figure 30:
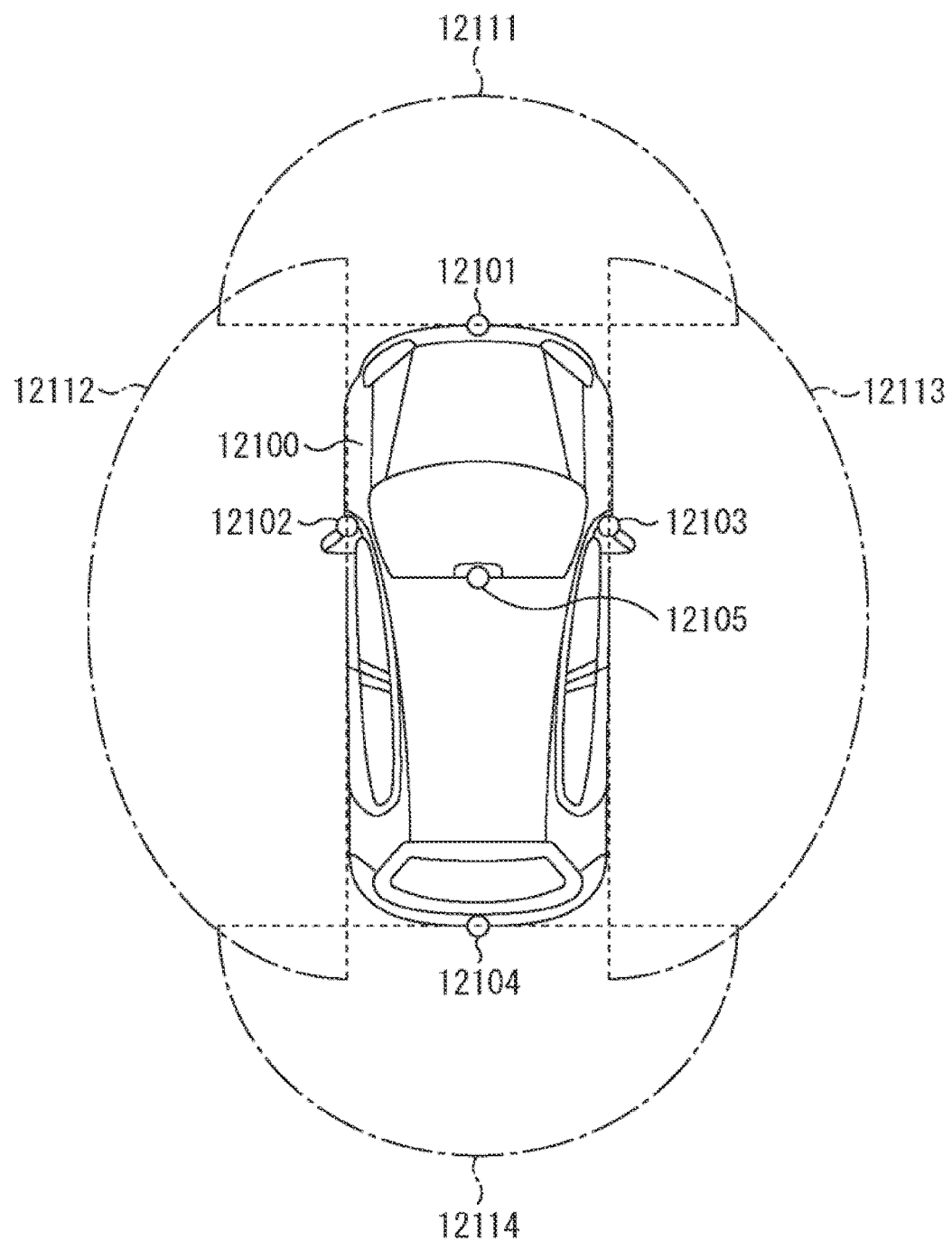
FIG. 30 is a diagram of assistance in explaining an example of installation positions of an outside-vehicle information detecting section and an imaging section.

FIG. 30 is a diagram depicting an example of the installation position of the imaging section 12031.

In FIG. 30, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 30 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 in the configuration described above. Specifically, the imaging device 100 in FIG. 1 is applicable to the imaging section 12031. A more easily viewable captured image can be obtained by applying the technology of the present disclosure to the imaging section 12031. Accordingly, fatigue of the driver can be reduced.

Note that the present disclosure is not limited to the embodiments described above, and may be modified in various manners without departing from the scope of the subject matters of the present disclosure. Moreover, advantageous effects to be produced are not limited to the advantageous effects described in the present description only by way of example. Other advantageous effects may be offered.

The present technology may also have following configurations.

(1)

A solid-state imaging element including:
a first comparator that includes
a first input transistor that outputs, from a drain of the first input transistor, a first voltage corresponding to an input voltage received from a first pixel, in reference to a first voltage difference between the input voltage input to a source of the first input transistor and a first reference voltage input to a gate of the first input transistor, and
a first output transistor that outputs, from a drain of the first output transistor, a comparison result of comparison between the input voltage and the first reference voltage in reference to a second voltage difference between the input voltage input to a source of the first output transistor and the first voltage input to a gate of the first output transistor; and
a second comparator that includes
a second input transistor that outputs, from a drain of the second input transistor, a second voltage corresponding to the input voltage in reference to a third voltage difference between the input voltage input to a source of the second input transistor and a second reference voltage input to a gate of the second input transistor, and
a second output transistor that outputs, from a drain of the second output transistor, a comparison result of comparison between the input voltage and the second reference voltage in reference to a fourth voltage difference between the input voltage input to a source of the second output transistor and the second voltage input to a gate of the second output transistor.

(2)

The solid-state imaging element according to (1), in which
the first comparator further includes
a first current source connected to the drain of the first input transistor,
a first clamp transistor provided between the source and the drain of the first input transistor,
a second current source connected to the drain of the first output transistor, and
a second clamp transistor provided between the source and the drain of the first output transistor,
the second comparator further includes a third current source connected to the drain of the second input transistor,
a third clamp transistor provided between the source and the drain of the second input transistor,
a fourth current source connected to the drain of the second output transistor, and
a fourth clamp transistor provided between the source and the drain of the second output transistor, and
the gate and the drain of each of the first to fourth clamp transistors are short-circuited to each other.

(3)

The solid-state imaging element according to (1) or (2), in which
the first comparator further includes
a first switch provided between the gate and the drain of the first input transistor, and
a second switch provided between the gate and the drain of the first output transistor, and
the second comparator further includes
a third switch provided between the gate and the drain of the second input transistor, and
a fourth switch provided between the gate and the drain of the second output transistor.

(4)

The solid-state imaging element according to any one of (1) to (3), in which
the first and second reference voltages change over time with slopes different from each other,
the solid-state imaging element further includes
a first counter that receives the comparison result from the first comparator, counts a period from a slope start of the first reference voltage to inversion of the comparison result received from the first comparator, and outputs a first digital signal in reference to a count value of the period, and
a second counter that receives the comparison result from the second comparator, counts a period from a slope start of the second reference voltage to the comparison result received from the second comparator, and outputs a second digital signal in reference to a count value of the period, and
the first and second counters operate almost simultaneously.

(5)

The solid-state imaging element according to (4), in which
the slope of the second reference voltage is steeper than the slope of the first reference voltage, and
the first and second counters measure the first and second periods, respectively, by using clock signals having substantially the same frequency.

(6)

The solid-state imaging element according to (4) or (5), further including:
a selection unit that selects either the first digital signal or the second digital signal to synthesize an image.

(7)

The solid-state imaging element according to (2), further including:
a pixel signal line that connects the first pixel and the first and second comparators, in which a current flowing in the pixel signal line is a sum of currents flowing in the first to fourth current sources.

(8)

The solid-state imaging element according to any one of (1) to (7), in which the first input transistor outputs the first voltage from the drain of the first input transistor when the input voltage and the first reference voltage become substantially equal to each other, the first output transistor outputs, as a comparison result of comparison between the input voltage and the first reference voltage, a signal indicating whether or not a difference between the input voltage and the first voltage exceeds a threshold voltage of the first output transistor, the second input transistor outputs the second voltage from the drain of the second input transistor when the input voltage and the second reference voltage become substantially equal to each other, and the second output transistor outputs, as a comparison result of comparison between the input voltage and the second reference voltage, a signal indicating whether or not a difference between the input voltage and the second voltage exceeds a threshold voltage of the second output transistor.

(9)

The solid-state imaging element according to any one of (1) to (8), further including:
- a first reference voltage supply unit that supplies the first reference voltage;
- a first auto-zero capacitor provided between the gate of the first input transistor and the first reference voltage supply unit;
- a first buffer provided between the first reference voltage supply unit and the first capacitor;
- a second reference voltage supply unit that supplies the second reference voltage;
- a second auto-zero capacitor provided between the gate of the second input transistor and the second reference voltage supply unit; and
- a second buffer provided between the second reference voltage supply unit and the second capacitor.

(10)

The solid-state imaging element according to any one of (1) to (9), in which each of the first and second input transistors and the first and second output transistors is a P-type transistor.

(11)

The solid-state imaging element according to (2), in which
- each of the first to fourth clamp transistors is a P-type transistor that has a gate and a drain short-circuited to each other, and
- the solid-state imaging element further includes fifth to eighth clamp transistors that are respectively connected to the first to fourth clamp transistors in parallel and that include an N-type transistor.

(12)

The solid-state imaging element according to (2), in which the first to fourth current sources each include
- first to fourth current source transistors respectively provided between predetermined reference terminals and the respective drains of the first and second input transistors and the first and second output transistors,
- first to fourth capacitors respectively connected to the gates of the first to fourth current source transistors and the reference terminals, and
- first to fourth sample hold switches respectively connected to the gates of the first to fourth current source transistors.

(13)

The solid-state imaging element according to any one of (1) to (12), further including:
- a first logic gate connected to the drain of the first output transistor; and
- a second logic gate connected to the drain of the second output transistor.

(14)

The solid-state imaging element according to any one of (1) to (13), further including:
- a pixel signal line that connects the first pixel and the first and second comparators; and
- a fifth current source connected to the pixel signal line.

(15)

The solid-state imaging element according to any one of (1) to (14), further including:
- a fifth capacitor provided between the drain of the first input transistor and the gate of the first output transistor;
- a fifth switch provided between the gate and the drain of the first output transistor;
- a sixth capacitor provided between the drain of the second input transistor and the gate of the second output transistor; and
- a sixth switch provided between the gate and the drain of the second output transistor.

(16)

The solid-state imaging element according to any one of (1) to (15), further including:
- a first buffer transistor connected to a power source and the source of the first output transistor, a gate of the first buffer transistor being connected to the source of the first input transistor; and
- a second buffer transistor connected to the power source and the source of the second output transistor, a gate of the second buffer transistor being connected to the source of the second input transistor.

(17)

The solid-state imaging element according to any one of (1) to (16), further including:
- a common reference voltage supply unit that supplies a common reference voltage;
- a first auto-zero capacitor provided between the gate of the first input transistor and the common reference voltage supply unit;
- a voltage dividing capacitor connected to the gate of the first input transistor and a predetermined reference terminal; and
- a second auto-zero capacitor provided between the gate of the second input transistor and the common reference voltage supply unit, in which
- the first auto-zero capacitor and the voltage dividing capacitor divide the common reference voltage and transmit the divided common reference voltage to the gate of the first input transistor, as the first reference voltage, and
- the second auto-zero capacitor transmits the common reference voltage to the gate of the second input transistor, as the second reference voltage.

(18)

The solid-state imaging element according to (6), in which the selection unit includes
- a digital comparator that compares one or both of the first and second digital signals with a threshold, a register that stores the threshold, and
a multiplexer that selects either the first digital signal or the second digital signal in reference to a comparison result received from the digital comparator, and outputs the selected digital signal as a pixel signal of the first pixel together with the comparison result.

(19)
The solid-state imaging element according to (18), in which
the slope of the second reference voltage is steeper than the slope of the first reference voltage,
the multiplexer selects the first digital signal in a case where one or both of the first and second digital signals are lower than the threshold,
the multiplexer selects the second digital signal in a case where one or both of the first and second digital signals are higher than the threshold, and
the solid-state imaging element further includes a calculation unit that converts the first digital signal in reference to a ratio of the slope of the first reference voltage to the slope of the second reference voltage.

(20)
The solid-state imaging element according to any one of (1) to (19), further including:
a third comparator that includes
a third input transistor that outputs, from a drain of the third input transistor, a fifth voltage corresponding to the input voltage in reference to a fifth voltage difference between the input voltage input to a source of the third input transistor and a third reference voltage input to a gate of the third input transistor, and
a third output transistor that outputs, from a drain of the third output transistor, a comparison result of comparison between the input voltage and the third reference voltage in reference to a sixth voltage difference between the input voltage input to a source of the third output transistor and the fifth voltage input to a gate of the third output transistor.

The invention claimed is:

1. A solid-state imaging element comprising:
a first comparator that includes
a first input transistor that outputs, from a drain of the first input transistor, a first voltage corresponding to an input voltage received from a first pixel, in reference to a first voltage difference between the input voltage input to a source of the first input transistor and a first reference voltage input to a gate of the first input transistor, and
a first output transistor that outputs, from a drain of the first output transistor, a comparison result of comparison between the input voltage and the first reference voltage in reference to a second voltage difference between the input voltage input to a source of the first output transistor and the first voltage input to a gate of the first output transistor; and
a second comparator that includes
a second input transistor that outputs, from a drain of the second input transistor, a second voltage corresponding to the input voltage in reference to a third voltage difference between the input voltage input to a source of the second input transistor and a second reference voltage input to a gate of the second input transistor, and
a second output transistor that outputs, from a drain of the second output transistor, a comparison result of comparison between the input voltage and the second reference voltage in reference to a fourth voltage difference between the input voltage input to a source of the second output transistor and the second voltage input to a gate of the second output transistor.

2. The solid-state imaging element according to claim 1, wherein
the first comparator further includes
a first current source connected to the drain of the first input transistor,
a first clamp transistor provided between the source and the drain of the first input transistor,
a second current source connected to the drain of the first output transistor, and
a second clamp transistor provided between the source and the drain of the first output transistor,
the second comparator further includes
a third current source connected to the drain of the second input transistor,
a third clamp transistor provided between the source and the drain of the second input transistor,
a fourth current source connected to the drain of the second output transistor, and
a fourth clamp transistor provided between the source and the drain of the second output transistor, and
the gate and the drain of each of the first to fourth clamp transistors are short-circuited to each other.

3. The solid-state imaging element according to claim 2, further comprising:
a pixel signal line that connects the first pixel and the first and second comparators, wherein
a current flowing in the pixel signal line is a sum of currents flowing in the first to fourth current sources.

4. The solid-state imaging element according to claim 2, wherein
each of the first to fourth clamp transistors is a P-type transistor that has a gate and a drain short-circuited to each other, and
the solid-state imaging element further includes fifth to eighth clamp transistors that are respectively connected to the first to fourth clamp transistors in parallel and that include an N-type transistor.

5. The solid-state imaging element according to claim 2, wherein the first to fourth current sources include
first to fourth current source transistors respectively provided between predetermined reference terminals and the respective drains of the first and second input transistors and the first and second output transistors,
first to fourth capacitors respectively connected to the gates of the first to fourth current source transistors and the reference terminals, and
first to fourth sample hold switches respectively connected to the gates of the first to fourth current source transistors.

6. The solid-state imaging element according to claim 1, wherein
the first comparator further includes
a first switch provided between the gate and the drain of the first input transistor, and
a second switch provided between the gate and the drain of the first output transistor, and
the second comparator further includes
a third switch provided between the gate and the drain of the second input transistor, and
a fourth switch provided between the gate and the drain of the second output transistor.

7. The solid-state imaging element according to claim 1, wherein
the first and second reference voltages change over time with slopes different from each other,
the solid-state imaging element further includes
a first counter that receives the comparison result from the first comparator, counts a first period from a slope start of the first reference voltage to inversion of the comparison result received from the first comparator, and outputs a first digital signal in reference to a count value of the first period, and
a second counter that receives the comparison result from the second comparator, counts a second period from a slope start of the second reference voltage to the comparison result received from the second comparator, and outputs a second digital signal in reference to a count value of the second period, and
the first and second counters operate almost simultaneously.

8. The solid-state imaging element according to claim 7, wherein
the slope of the second reference voltage is steeper than the slope of the first reference voltage, and
the first and second counters measure the first and second periods, respectively, by using clock signals having substantially a same frequency.

9. The solid-state imaging element according to claim 7, further comprising:
a selection unit that selects either the first digital signal or the second digital signal to synthesize an image.

10. The solid-state imaging element according to claim 9, wherein the selection unit includes
a digital comparator that compares one or both of the first and second digital signals with a threshold,
a register that stores the threshold, and
a multiplexer that selects either the first digital signal or the second digital signal in reference to a comparison result received from the digital comparator, and outputs the selected digital signal as a pixel signal of the first pixel together with the comparison result.

11. The solid-state imaging element according to claim 10, wherein
the slope of the second reference voltage is steeper than the slope of the first reference voltage,
the multiplexer selects the first digital signal in a case where one or both of the first and second digital signals are lower than the threshold,
the multiplexer selects the second digital signal in a case where one or both of the first and second digital signals are higher than the threshold, and
the solid-state imaging element further includes a calculation unit that converts the first digital signal in reference to a ratio of the slope of the first reference voltage to the slope of the second reference voltage.

12. The solid-state imaging element according to claim 1, wherein
the first input transistor outputs the first voltage from the drain of the first input transistor when the input voltage and the first reference voltage become substantially equal to each other,
the first output transistor outputs, as a comparison result of comparison between the input voltage and the first reference voltage, a signal indicating whether or not a difference between the input voltage and the first voltage exceeds a threshold voltage of the first output transistor,
the second input transistor outputs the second voltage from the drain of the second input transistor when the input voltage and the second reference voltage become substantially equal to each other, and
the second output transistor outputs, as a comparison result of comparison between the input voltage and the second reference voltage, a signal indicating whether or not the input voltage and the second voltage exceed a threshold voltage of the second output transistor.

13. The solid-state imaging element according to claim 1, further comprising:
a first reference voltage supply unit that supplies the first reference voltage;
a first auto-zero capacitor provided between the gate of the first input transistor and the first reference voltage supply unit;
a first buffer provided between the first reference voltage supply unit and the first auto-zero capacitor;
a second reference voltage supply unit that supplies the second reference voltage;
a second auto-zero capacitor provided between the gate of the second input transistor and the second reference voltage supply unit; and
a second buffer provided between the second reference voltage supply unit and the second auto-zero capacitor.

14. The solid-state imaging element according to claim 1, wherein each of the first and second input transistors and the first and second output transistors is a P-type transistor.

15. The solid-state imaging element according to claim 1, further comprising:
a first logic gate connected to the drain of the first output transistor; and
a second logic gate connected to the drain of the second output transistor.

16. The solid-state imaging element according to claim 1, further comprising:
a pixel signal line that connects the first pixel and the first and second comparators; and
a fifth current source connected to the pixel signal line.

17. The solid-state imaging element according to claim 1, further comprising:
a fifth capacitor provided between the drain of the first input transistor and the gate of the first output transistor;
a fifth switch provided between the gate and the drain of the first output transistor;
a sixth capacitor provided between the drain of the second input transistor and the gate of the second output transistor; and
a sixth switch provided between the gate and the drain of the second output transistor.

18. The solid-state imaging element according to claim 1, further comprising:
a first buffer transistor connected to a power source and the source of the first output transistor, a gate of the first buffer transistor being connected to the source of the first input transistor; and
a second buffer transistor connected to the power source and the source of the second output transistor, a gate of the second buffer transistor being connected to the source of the second input transistor.

19. The solid-state imaging element according to claim 1, further comprising:
- a common reference voltage supply unit that supplies a common reference voltage;
- a first auto-zero capacitor provided between the gate of the first input transistor and the common reference voltage supply unit;
- a voltage dividing capacitor connected to the gate of the first input transistor and a predetermined reference terminal; and
- a second auto-zero capacitor provided between the gate of the second input transistor and the common reference voltage supply unit, wherein
- the first auto-zero capacitor and the voltage dividing capacitor divide the common reference voltage and transmit the divided common reference voltage to the gate of the first input transistor, as the first reference voltage, and
- the second auto-zero capacitor transmits the common reference voltage to the gate of the second input transistor, as the second reference voltage.

20. The solid-state imaging element according to claim 1, further comprising:
- a third comparator that includes
  - a third input transistor that outputs, from a drain of the third input transistor, a fifth voltage corresponding to the input voltage in reference to a fifth voltage difference between the input voltage input to a source of the third input transistor and a third reference voltage input to a gate of the third input transistor, and
  - a third output transistor that outputs, from a drain of the third output transistor, a comparison result of comparison between the input voltage and the third reference voltage in reference to a sixth voltage difference between the input voltage input to a source of the third output transistor and the fifth voltage input to a gate of the third output transistor.

* * * * *